US011134212B2

(12) United States Patent
Kobayashi et al.

(10) Patent No.: US 11,134,212 B2
(45) Date of Patent: Sep. 28, 2021

(54) PHOTOELECTRIC CONVERSION DEVICE, IMAGING SYSTEM, AND MOVING UNIT

(71) Applicant: CANON KABUSHIKI KAISHA, Tokyo (JP)

(72) Inventors: Hideo Kobayashi, Tokyo (JP); Shinya Nakano, Tokyo (JP); Hirofumi Totsuka, Fujisawa (JP); Daisuke Yoshida, Ebina (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/267,232

(22) Filed: Feb. 4, 2019

(65) Prior Publication Data
US 2019/0253659 A1    Aug. 15, 2019

(30) Foreign Application Priority Data

Feb. 9, 2018   (JP) .............................. JP2018-022400

(51) Int. Cl.
| | | |
|---|---|---|
| *H04N 5/378* | (2011.01) | |
| *H04N 5/3745* | (2011.01) | |
| *H04N 5/369* | (2011.01) | |
| *H01L 27/146* | (2006.01) | |

(52) U.S. Cl.
CPC ......... *H04N 5/378* (2013.01); *H01L 27/1461* (2013.01); *H01L 27/14612* (2013.01); *H01L 27/14614* (2013.01); *H04N 5/379* (2018.08); *H04N 5/37455* (2013.01); *H01L 27/14641* (2013.01)

(58) Field of Classification Search
CPC .... H04N 5/37455; H04N 5/378; H04N 5/379; H01L 27/1461; H01L 27/14612; H01L 27/14614; H01L 27/14641
See application file for complete search history.

(56) References Cited

U.S. PATENT DOCUMENTS

| | | | |
|---|---|---|---|
| 8,948,957 B2* | 2/2015 | Leinfelder | ........... G05D 1/0231 701/28 |
| 2005/0151175 A1 | 7/2005 | Ohkawa | |
| 2012/0293698 A1* | 11/2012 | Sukegawa | ........... H01L 27/1469 348/294 |

(Continued)

FOREIGN PATENT DOCUMENTS

| | | |
|---|---|---|
| JP | 2009-170448 A | 7/2009 |
| WO | 2004/010506 A1 | 1/2004 |
| WO | 2016/009832 A1 | 1/2016 |

*Primary Examiner* — Lin Ye
*Assistant Examiner* — Chriss S Yoder, III
(74) *Attorney, Agent, or Firm* — Canon U.S.A., Inc. IP Division

(57) ABSTRACT

A photoelectric conversion device includes a plurality of pixels and a readout circuit. Each of the plurality of pixels includes a pixel circuit including a photoelectric conversion unit. The readout circuit is configured for reading out a signal from the plurality of pixels. The pixel circuit of each of the plurality of pixels includes at least a first transistor that receives a signal based on signal charges generated by the photoelectric conversion unit and is a part of a differential pair. The pixel circuit or the readout circuit has a second transistor. The size of the first transistor and the size of the second transistor are different from each other.

21 Claims, 23 Drawing Sheets

(56) References Cited

U.S. PATENT DOCUMENTS

2014/0240565 A1* 8/2014 Murakami ........ H01L 27/14634
                                                                  348/302
2017/0263669 A1* 9/2017 Tamaki ............. H01L 27/14627
2017/0272678 A1* 9/2017 Sakakibara ......... H01L 27/1464

* cited by examiner

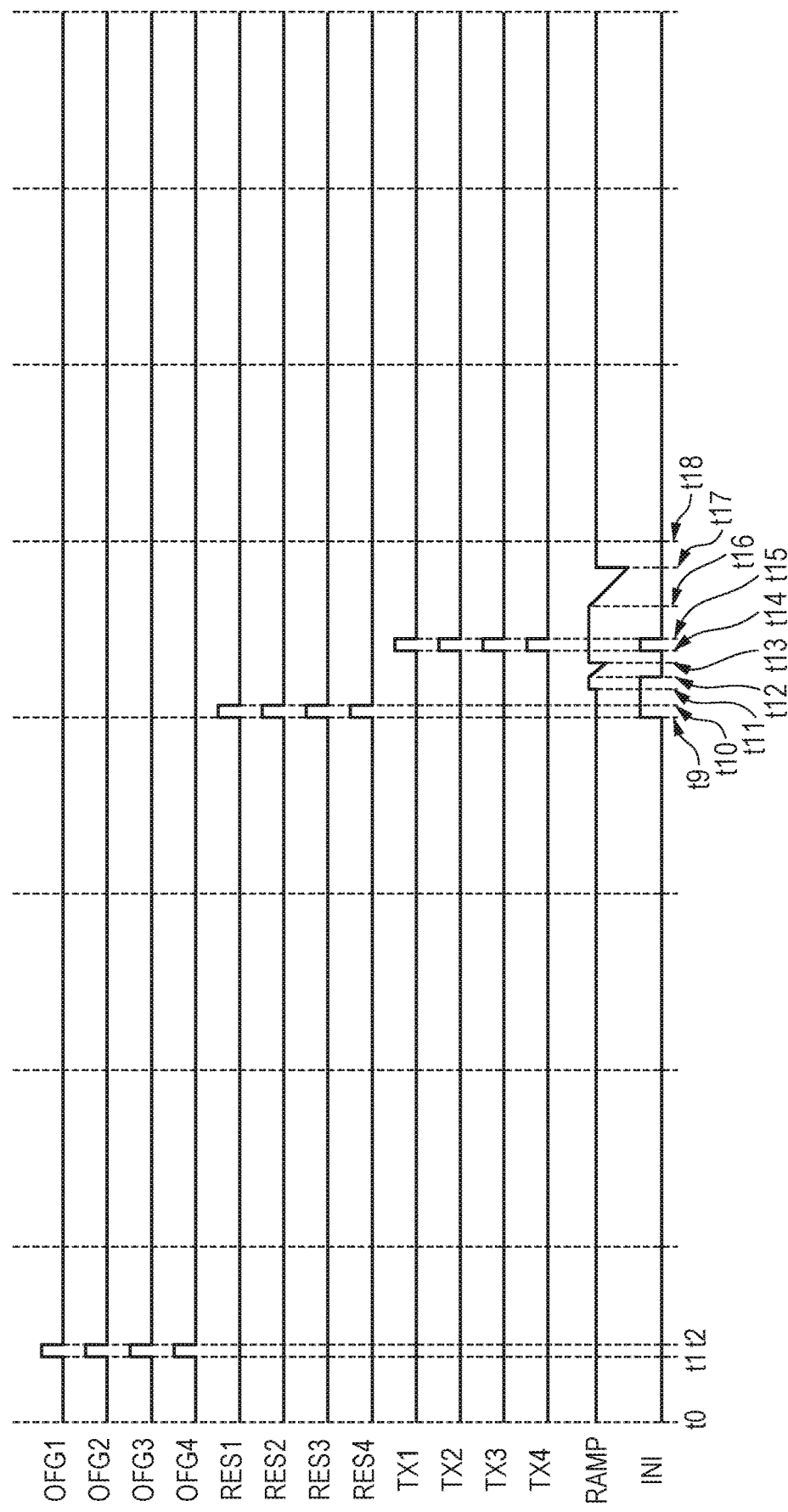

FIG. 20A

| Tr. | A | B |
|---|---|---|
| L | LARGE | SMALL |
| W | | |
| tox | | |

FIG. 20B

| Tr. | A | B |
|---|---|---|
| L | | |
| W | LARGE | SMALL |
| tox | | |

FIG. 20C

| Tr. | A | B |
|---|---|---|
| L | | |
| W | | |
| tox | LARGE | SMALL |

FIG. 20D

| Tr. | A | B |
|---|---|---|
| L | LARGE | SMALL |
| W | LARGE | SMALL |
| tox | LARGE | SMALL |

FIG. 20E

| Tr. | A | B |
|---|---|---|
| L | SMALL | LARGE |
| W | LARGE | SMALL |
| tox | LARGE | SMALL |

FIG. 20F

| Tr. | A | B |
|---|---|---|
| L | LARGE | SMALL |
| W | SMALL | LARGE |
| tox | LARGE | SMALL |

FIG. 20G

| Tr. | A | B |
|---|---|---|
| L | LARGE | SMALL |
| W | LARGE | SMALL |
| tox | SMALL | LARGE |

FIG. 20H

| Tr. | A | B |
|---|---|---|
| L | LARGE | SMALL |
| W | LARGE | SMALL |
| tox | | |

FIG. 20I

| Tr. | A | B |
|---|---|---|
| L | SMALL | LARGE |
| W | LARGE | SMALL |
| tox | | |

FIG. 20J

| Tr. | A | B |
|---|---|---|
| L | LARGE | SMALL |
| W | | |
| tox | LARGE | SMALL |

FIG. 20K

| Tr. | A | B |
|---|---|---|
| L | SMALL | LARGE |
| W | | |
| tox | LARGE | SMALL |

FIG. 20L

| Tr. | A | B |
|---|---|---|
| L | | |
| W | LARGE | SMALL |
| tox | LARGE | SMALL |

FIG. 20M

| Tr. | A | B |
|---|---|---|
| L | | |
| W | SMALL | LARGE |
| tox | LARGE | SMALL |

PHOTOELECTRIC CONVERSION DEVICE, IMAGING SYSTEM, AND MOVING UNIT

BACKGROUND OF THE INVENTION

Field of the Invention

One disclosed aspect of the embodiments relates to a photoelectric conversion device, an imaging system, and a moving unit.

Description of the Related Art

A photoelectric conversion device, in particular, a photoelectric conversion device used for image capturing or machine vision has a plurality of pixels. International Publication No. WO2016/009832 discloses that each pixel includes a photoelectric conversion unit and a transistor that receives a signal based on charges generated by the photoelectric conversion unit and forms a differential pair. Further, as disclosed in International Publication No. WO2016/009832, a circuit included in one pixel may be divided into and arranged on a plurality of semiconductor substrates.

In the art of International Publication No. WO2016/009832, there is no consideration for the size of the transistor of the circuit. The size of a transistor refers to a channel length, a channel width, a ratio of the channel width and the channel length (W/L), a thickness of a gate insulating film, or the like. Thus, reliability may decrease due to a low withstand voltage of the transistor, or noise may increase due to reduction in electrical characteristics.

SUMMARY OF THE INVENTION

In view of the above problems, an embodiment of the disclosure is a technique to improve the performance of a photoelectric conversion device.

A photoelectric conversion device according to one embodiment includes a plurality of pixels and a readout circuit. Each of the plurality of pixels includes a pixel circuit including a photoelectric conversion unit. The readout circuit is configured for reading out a signal from the plurality of pixels. The pixel circuit of each of the plurality of pixels includes at least a first transistor that receives a signal based on signal charges generated by the photoelectric conversion unit and is a part of a differential pair. The pixel circuit or the readout circuit has a second transistor. The size of the first transistor and the size of the second transistor are different from each other.

A photoelectric conversion device according to another embodiment includes a first semiconductor substrate, a second semiconductor substrate, a plurality of pixels, and a readout circuit. Each of the plurality of pixels includes a photoelectric conversion unit and a pixel circuit. The readout circuit is configured for reading out a signal from the plurality of pixels. The pixel circuit of each of the plurality of pixels includes at least an input transistor that receives a signal based on signal charges generated by the photoelectric conversion unit and forms a differential pair. At least a first part of the photoelectric conversion unit and the pixel circuit is arranged on the first semiconductor substrate. A second part, which is different from the first part, of the pixel circuit and at least a part of the readout circuit are arranged on the second semiconductor substrate. The size of a first transistor arranged on the first semiconductor substrate and the size of a second transistor arranged on the second semiconductor substrate are different from each other.

A photoelectric conversion device according to another embodiment includes a first semiconductor substrate, a second semiconductor substrate, and a plurality of pixels. Each of the plurality of pixels includes a photoelectric conversion unit and an analog-to-digital converter circuit. The photoelectric conversion unit and a first transistor included in the analog-to-digital converter circuit are arranged on the first semiconductor substrate. A second transistor included in the analog-to-digital converter circuit is arranged on the second semiconductor substrate. A film thickness of a gate insulating film of the first transistor is larger than a film thickness of a gate insulating film of the second transistor.

Further features of the disclosure will become apparent from the following description of exemplary embodiments with reference to the attached drawings.

BRIEF DESCRIPTION OF THE DRAWINGS

FIG. 6 is a timing chart diagram illustrating an operation of the photoelectric conversion device.

FIGS. 20A, 20B, 20C, 20D, 20E, 20F, 20G, 20H, 20I, 20J, 20K, 20L and 20M are diagrams illustrating relationships of two transistors.

DESCRIPTION OF THE EMBODIMENTS

First Embodiment

General Configuration

Figure 1:
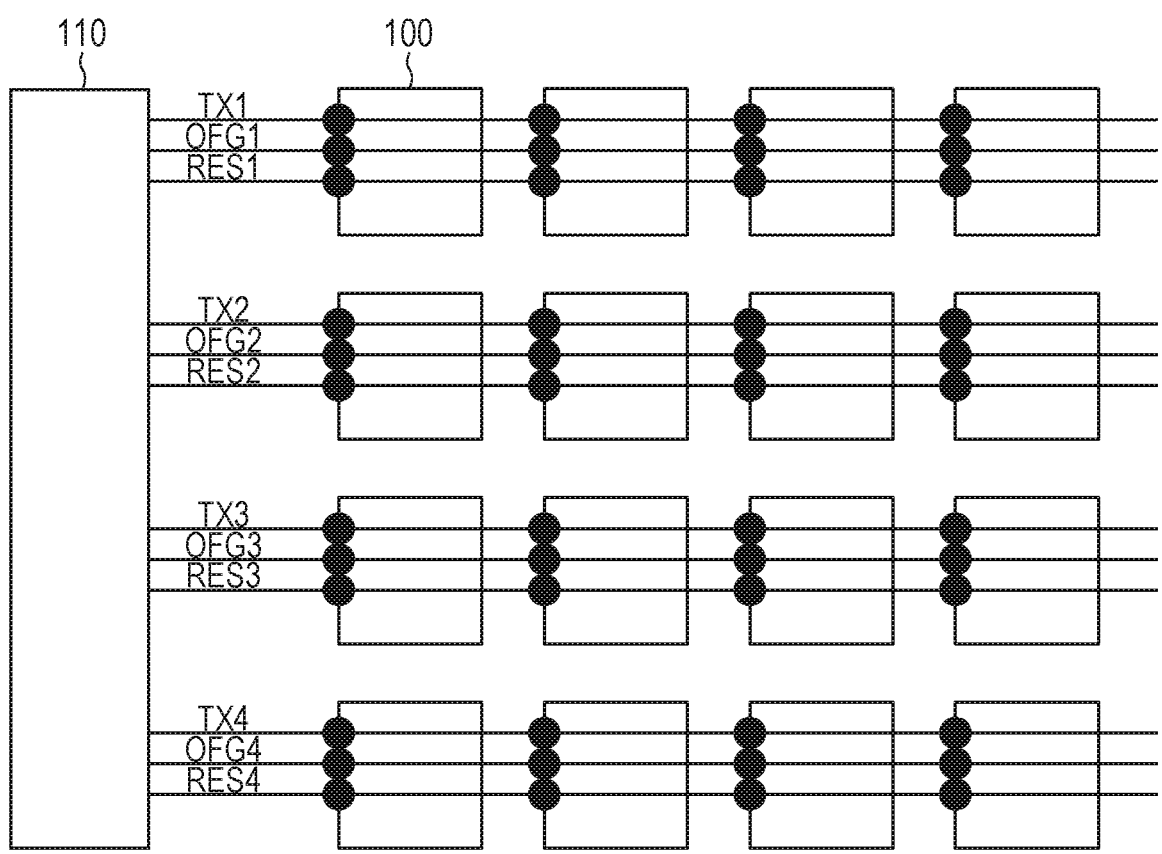
FIG. 1 is a diagram schematically illustrating a configuration of a photoelectric conversion device.

A photoelectric conversion device according to the present embodiment will be described. The photoelectric conversion device is an imaging device, for example. FIG. 1 schematically illustrates a configuration of the photoelectric conversion device. The photoelectric conversion device has a plurality of pixels 10 and a readout circuit 110 used for reading out signals from the plurality of pixels 100.

Each of the pixels 100 includes a pixel circuit including a photoelectric conversion unit. The photoelectric conversion unit converts an incident light into signal charges. A photodiode formed on a silicon substrate, an organic photoelectric conversion film layered on the semiconductor substrate, or the like is used for the photoelectric conversion unit. The pixel circuit is a circuit that outputs, from a pixel, a signal based on charges generated by the photoelectric conversion unit. The pixel circuit of the present embodiment includes an analog-to-digital converter circuit (hereinafter, referred to as an ADC circuit). Typically, the ADC circuit includes a comparator including a differential pair. That is, the pixel circuit of the present embodiment includes transistors forming a differential pair.

The readout circuit 110 is a scanning circuit that supplies control signals (TX1 to TX4, OFG1 to OFG1 to OFG4, RES1 to RES4) to the plurality of control lines connected to the pixel 100. The pixel 100 operates in response to the control signal, and a signal based on charges generated by the photoelectric conversion unit is output from the pixel 100. Note that the readout circuit 110 may be a signal processing circuit that processes a signal output from the pixel 100.

Pixel Configuration

Figure 2:
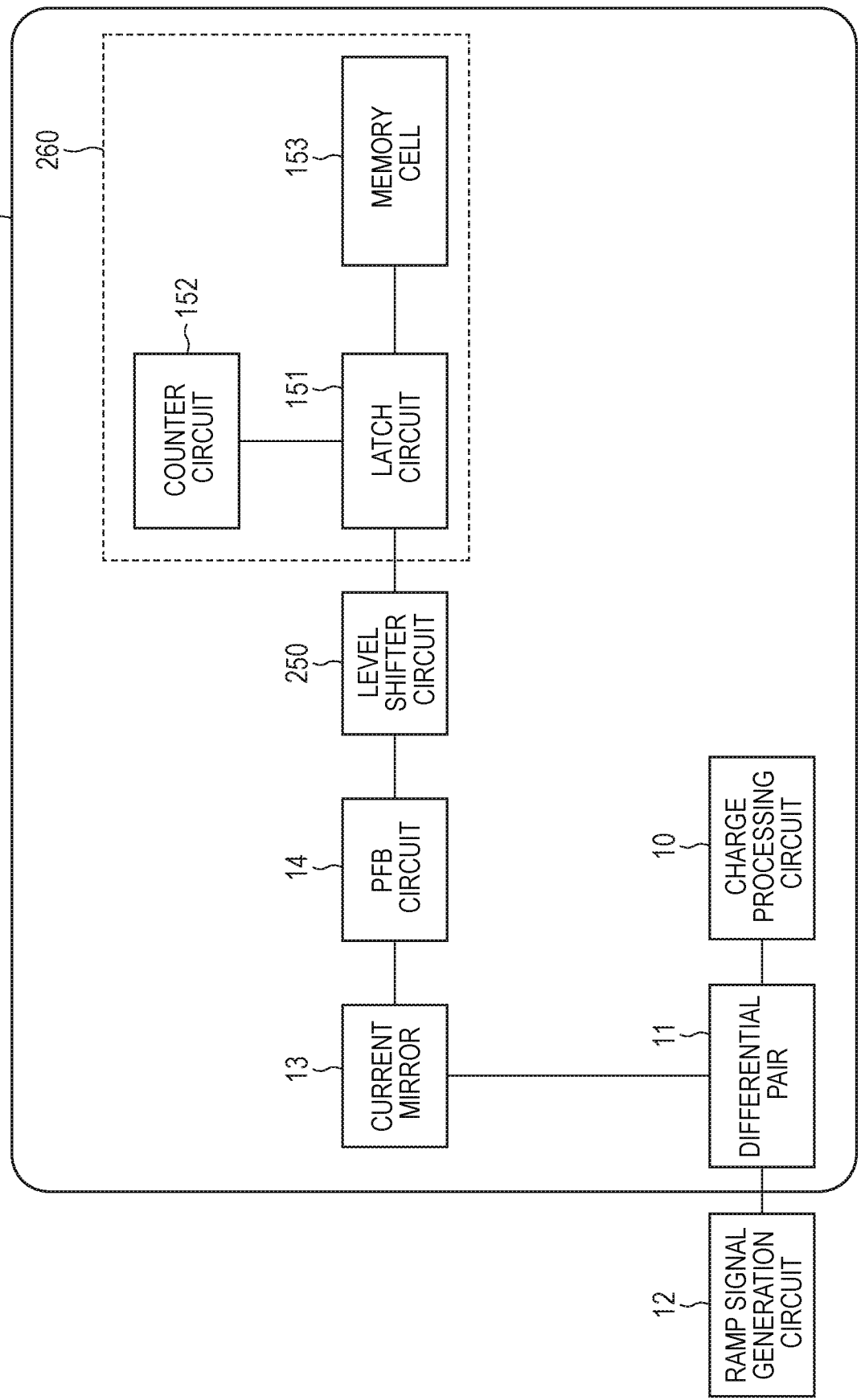
FIG. 2 is a block diagram schematically illustrating a configuration of a pixel of the photoelectric conversion device.

FIG. 2 is a block diagram schematically illustrating a configuration of the pixel 100 and the ramp signal generation circuit. The pixel circuit of the pixel 100 is formed of a plurality of circuit blocks in terms of function. A signal charge processing circuit 10 performs accumulation, transfer, and draining of signal charges generated by the photoelectric conversion unit. A differential-pair circuit 11 includes transistors forming a differential pair and a current source that supplies a current to the differential pair. A ramp signal generation circuit 12 supplies a ramp signal to the ADC circuit. A current mirror circuit 13 controls a current flowing in the differential-pair circuit 11. The differential-pair circuit 11 and the current mirror circuit 13 form a comparator of the ADC circuit. Furthermore, the pixel circuit of the pixel 100 includes a positive feedback circuit 14, a level shifter circuit 250, and a memory circuit 260. The positive feedback circuit 14 facilitates a quick inversion of the output of the comparator. In other words, the positive feedback circuit 14 generates a pulse having a sharp rising edge (or falling edge) in response to the start of inversion of the output of the comparator. The level shifter circuit 250 reduces the amplitude of a latch signal output from the comparator via the positive feedback circuit 14. The memory circuit 260 holds a digital signal based on the latch signal output from the comparator. Typically, the differential-pair circuit 11, the current mirror circuit 13, and the memory circuit 260 form the ADC circuit. Note that, in the present embodiment, the pixel circuit of the pixel 100 is formed on a single semiconductor substrate.

Pixel Circuit

Figure 3:
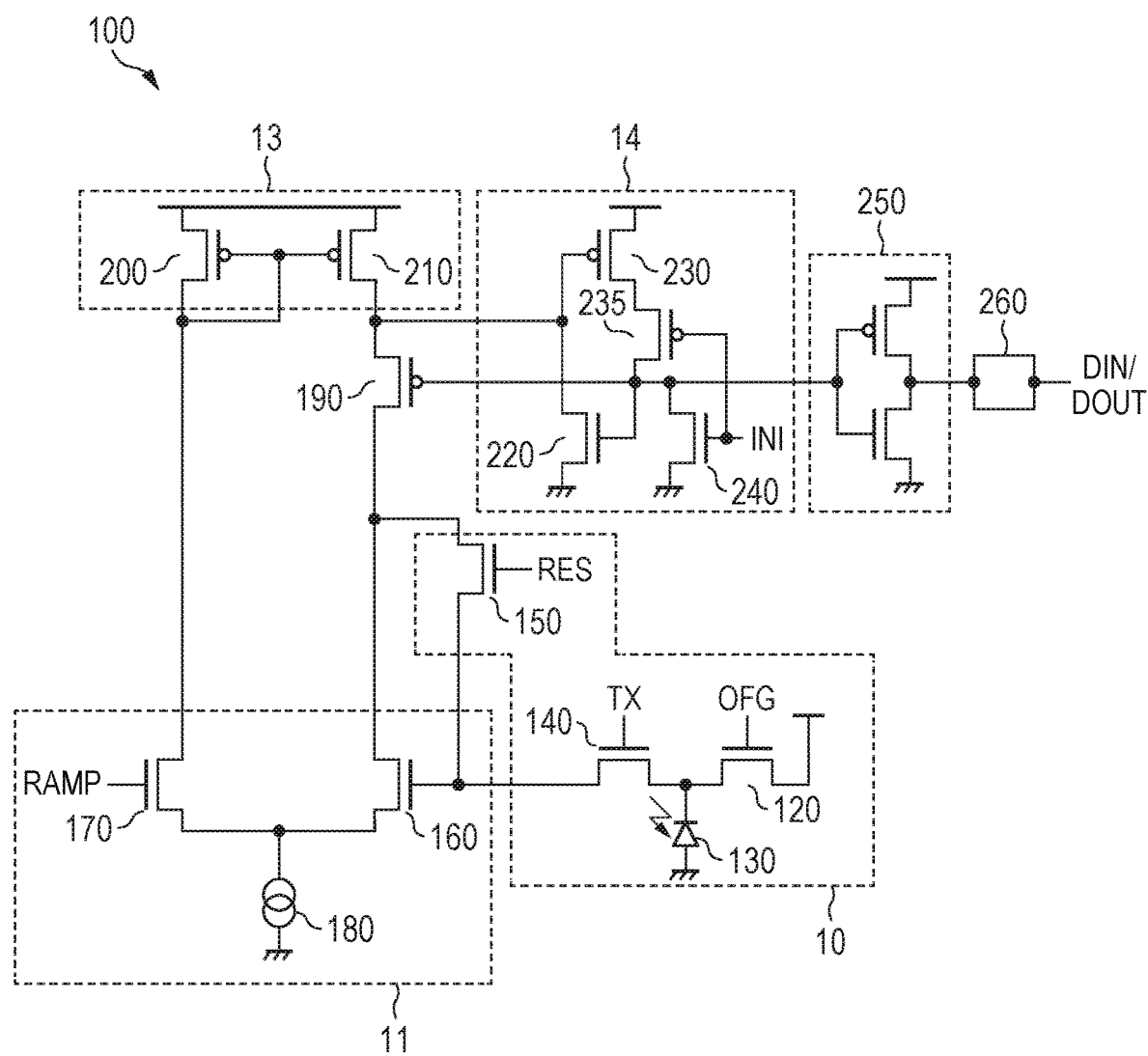
FIG. 3 is a diagram illustrating an equivalent circuit of the pixel of the photoelectric conversion device.

The configuration of each circuit block will be described in detail. FIG. 3 is a diagram illustrating an equivalent circuit of the pixel 100. Since the configuration of the memory circuit 260 will be described by using another drawing, however, the memory circuit 260 is depicted as a block. Further, a ramp signal generation circuit 12 may be provided for each pixel 100 or for each row including a plurality of pixels 100, or a common ramp signal generation circuit 12 may be provided for all the pixels 100. Thus, FIG. 3 does not illustrate the ramp signal generation circuit 12.

The signal charge processing circuit 10 includes a charge drain transistor 120, a transfer transistor 140, and a reset transistor 150. Each of the charge drain transistor 120, the transfer transistor 140, and the reset transistor 150 is an N-channel MOS transistor. In the circuit diagram, a white circle, or a bubble, is provided at the gate to indicate a P-channel MOS transistor. On the other hand, no white circle is provided at the gate to indicate an N-channel MOS transistor.

The charge drain transistor 120 is connected to a photoelectric conversion unit 130. The charge drain transistor 120 drains signal charges generated by the photoelectric conversion unit 130 in response to the control signal RES. The transfer transistor 140 is connected to the photoelectric conversion unit 130 and the input node of the differential-pair circuit 11. The transfer transistor 140 transfers signal charges generated by the photoelectric conversion unit 130 to the input node of the differential-pair circuit 11 in response to the control signal TX. The reset transistor 150 is connected to the input node of the differential-pair circuit 11. The reset transistor 150 resets the voltage of the input node of the differential-pair circuit 11 to the initial value. In the present embodiment, the drain of the reset transistor 150 is connected to the drain of an input transistor 160 of the differential-pair circuit 11. In the modified example of the present embodiment, the drain of the reset transistor 150 is connected to the node that supplies a reset power source.

The differential pair circuit 11 includes the input transistor 160 and a reference transistor 170. The input transistor 160 is a part of the differential pair. Each of the input transistor 160 and the reference transistor 170 is an N-channel MOS transistor. The source of the input transistor 160 and the source of the reference transistor 170 are connected to a current source 180 as a common node. With such connection, the input transistor 160 and the reference transistor 170 form a differential pair. The input transistor 160 receives a signal based on signal charges generated by the photoelectric conversion unit 130. That is, the gate of the input transistor 160 is the input node of the differential pair circuit 11. The ramp signal generation circuit 12 (not illustrated) supplies a ramp signal to the gate of the reference transistor 170.

The current mirror circuit 13 includes a transistor 200 and a transistor 210. Each of the transistor 200 and the transistor 210 is a P-channel MOS transistor. The gate of the transistor 200 and the gate of the transistor 210 are connected to each other. The drain of the transistor 200 is connected to the reference transistor 170, and the drain of the transistor 210 is connected to the input transistor 160. Further, the gate and the drain of the transistor 200 are connected to each other.

With the connection illustrated in FIG. 3, the differential pair circuit 11 and the current mirror circuit 13 form a comparator. When the level relationship between the potential of the gate of the input transistor 160 and the potential of the gate of the reference transistor 170 is inverted, the potential of the output node of the comparator (the drain of the transistor 210) changes. When the potential of the gate of the input transistor 160 is higher than the potential of the gate of the reference transistor 170, the potential of the output node of the comparator is at a low level. On the other hand, when the potential of the gate of the input transistor 160 is lower than the potential of the gate of the reference transistor 170, the potential of the output node of the comparator is at a high level.

The ramp signal supplied by the ramp signal generation circuit 12 changes from a high voltage to a low voltage. Thus, at certain time, the potential of the output node of the comparator changes from a high level to a low level. A period from the time when the ramp signal starts changing to the time when the potential of the output node of the comparator changes is determined in accordance with the height of the potential of the gate of the input transistor 160, that is, the level of a signal based on charges generated by the photoelectric conversion unit 130. By counting or measuring the period, it is possible to convert a signal based on charges generated by the photoelectric conversion unit 130 into a digital signal.

When the reset transistor 150 is in an on-state, the differential pair circuit 11 and the current mirror circuit 13 function as a voltage follower circuit. Thus, the potential of the gate of the input transistor 160 can be reset to any value in accordance with the potential of the ramp signal.

The positive feedback circuit 14 includes four transistors 220, 230, 235, and 240. Each of the transistor 220 and the transistor 240 is an N-channel MOS transistor. Each of the transistor 230 and the transistor 235 is a P-channel MOS transistor.

The output node of the comparator is connected to the drain of the transistor 220 and the gate of the transistor 230. The source of the transistor 220 is grounded. The source of the transistor 230 is connected to the power source node. The drain of the transistor 230 is connected to the gate of the transistor 220 via the transistor 235. The drain of the transistor 240 is connected to the gate of the transistor 220 and the transistor 235. The gate of the transistor 235 and the gate of the transistor 240 are supplied with an initialization signal INI. The node connected to the gate of the transistor 220 and the drain of the transistor 240 is the output node of the positive feedback circuit 14.

The function of the positive feedback circuit 14 will be described. Before the positive feedback circuit 14 is operated, that is, before analog-to-digital conversion (AD conversion) is started, the initialization signal INI transitions from a high level to a low level. Thus, the transistor 235 is turned on, while the transistor 240 is turned off. When the initialization signal INI is at a high level, the transistor 240 is in an on-state, and therefore the output node of the positive feedback circuit 14 is at a low potential (substantially, the ground potential).

At the time of start of AD conversion, the potential of the ramp signal is higher than the potential of the gate of the input transistor 160 (the level of a signal based on charges in the photoelectric conversion unit 130). Thus, the potential of the output node of the comparator (the drain of the transistor 210) is at a high level. Thus, the transistor 230 is in an off-state. Further, as described above, since the output node of the positive feedback circuit 14 (the gate of the transistor 220) is at substantially the ground potential, the transistor 220 is in an off-state.

When the potential of the output node of the comparator changes from a high level to a low level, the voltage between the gate and the source of the transistor 230 increases. Thereby, the transistor 230 is turned on. Since the path from the power source node to the gate of the transistor 220 is conducted, the potential of the gate of the transistor 220 increases. Since the transistor 220 is turned on and a current occurs from the output node of the comparator to the ground node via the transistor 220, the reduction in the potential of the output node of the comparator is accelerated. Since the reduction of the potential of the output node of the comparator causes a further increased voltage between the gate and the source of the transistor 230, the increase of the potential of the gate of the transistor 220 is accelerated. In such a way, a change in the potential of the output node of the comparator is positively fed back by the positive feedback circuit 14. As a result, when the level relationship between the potential of the gate of the input transistor 160 and the potential of the gate of the reference transistor 170 (ramp signal) is inverted, the potential of the output node of the positive feedback circuit 14 can be changed fast.

After the completion of the AD conversion, the initialization signal INI transitions from a low level to a high level. Thereby, the potential of the output node of the positive feedback circuit 14 is reset to the ground potential. During the initialization signal INI being at a high level, the transistor 235 is in an off-state. Thus, a through current flowing from the power source node of the positive feedback circuit 14 to the ground node can be reduced. Without the transistor 235, a through current may occur in accordance with the potential of the gate of the transistor 230. When restriction of power consumption is lenient, however, the transistor 235 may be omitted. When the transistor 235 is omitted, the drain of the transistor 230 is directly connected to the gate of the transistor 220. This enhances the effect of increasing speed due to the positive feedback circuit 14.

In the present embodiment, the transistor 210 of the current mirror circuit 13 is connected to the input transistor 160 via the current limit transistor 190. The current limit transistor 190 is a P-channel MOS transistor. The gate of the current limit transistor 190 is connected to the output of the positive feedback circuit 14.

Without the current limit transistor 190, after the output signal of the comparator is inverted, a large current will remain to flow from the transistor 210 of the current mirror circuit 13 to the transistor 220 of the positive feedback circuit 14.

With the current limit transistor 190 being inserted between the transistor 210 and the input transistor 160, the current flowing from the transistor 210 to the transistor 220 of the positive feedback circuit 14 can be limited.

Note that the positive feedback circuit 14 is provided if necessary or may be omitted. When the positive feedback circuit 14 is omitted, the output node of the comparator is connected to the level shifter circuit 250. Further, when the positive feedback circuit 14 is omitted, the current limit transistor 190 may also be omitted.

The signal at the output node of the comparator and the signal at the output node of the positive feedback circuit 14 are used as a latch signal. The memory circuit 260 holds a count value based on the latch signal. To transfer the latch signal to the memory circuit 260, the level shifter circuit 250 is used. The level shifter circuit 250 is an inverter circuit formed of an N-channel transistor and a P-channel transistor. In accordance with the power source voltage supplied to the level shifter circuit 250, the amplitude of the latch signal output by the level shifter circuit 250 changes. To cause a digital circuit on the post-stage to operate at a high speed, the level shifter circuit 250 reduces the amplitude of the latch signal in the present embodiment. That is, the power source voltage supplied to the level shifter circuit 250 is lower than the power source voltage supplied to the comparator (the differential pair circuit 11 and the current mirror circuit 13) or the positive feedback circuit 14.

Note that the level shifter circuit 250 is provided if necessary and may be omitted. When the level shifter circuit 250 is omitted, the output node of the positive feedback circuit 14 is connected to the memory circuit 260. Alternatively, the level shifter circuit 250 may be responsible for only the function of an inverter circuit for waveform shaping. In such a case, the level shifter circuit 250 does not change the amplitude of the latch signal.

Pixel Circuit (Memory Unit)

Figure 4A:
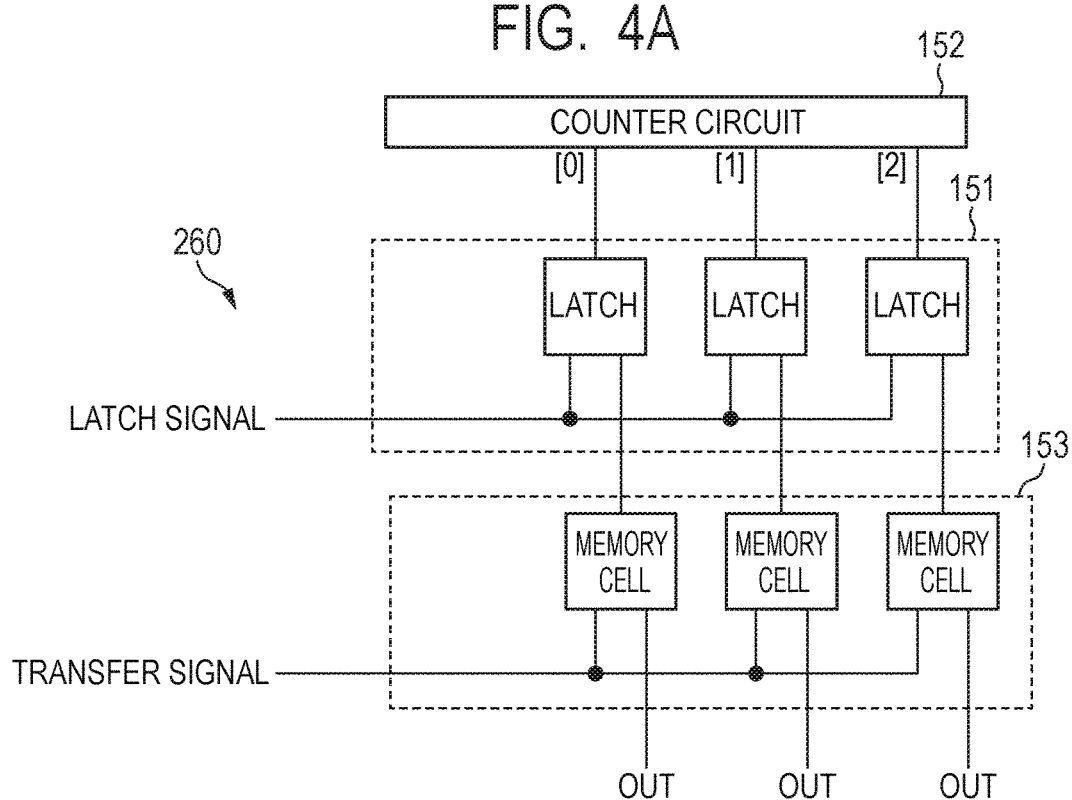
FIG. 4A is a block diagram schematically illustrating a configuration of a memory circuit.
Figure 4B:
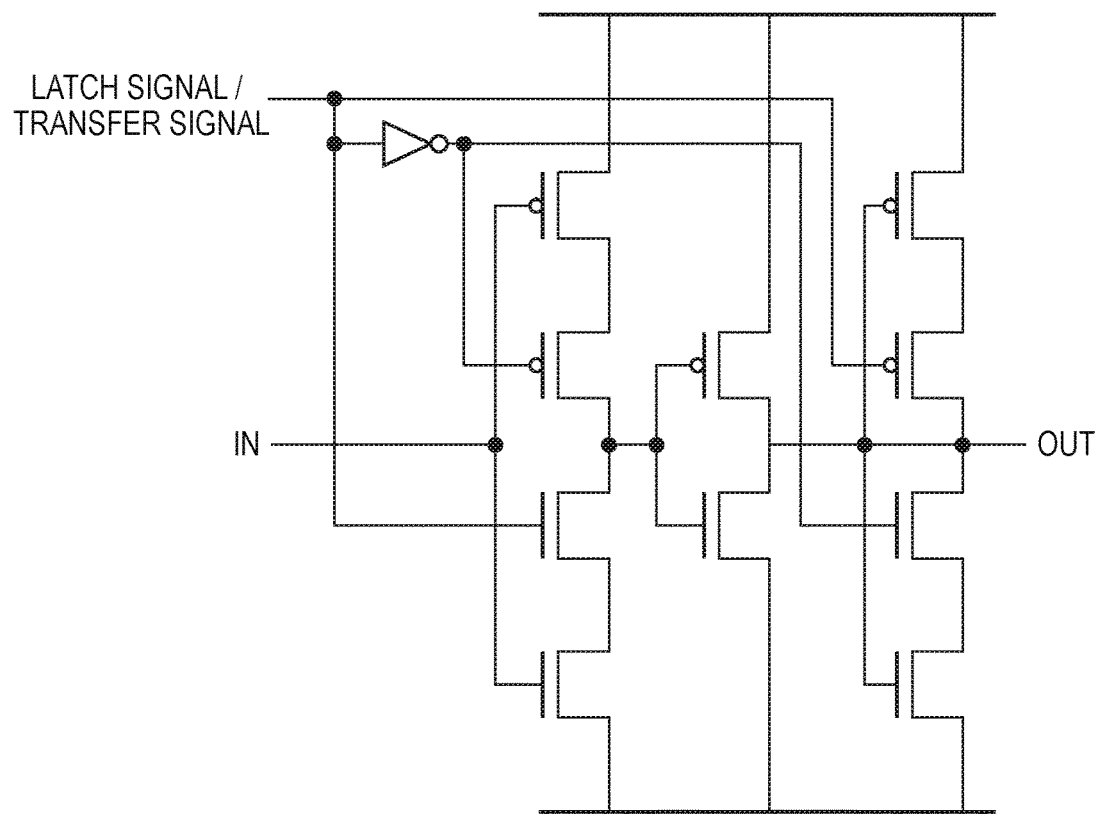
FIG. 4B is an equivalent circuit diagram of a latch circuit and a memory cell.

Next, the configuration of the memory circuit 260 will be described. FIG. 4A is a block diagram illustrating the configuration of the memory circuit 260 on a bit basis. Further, FIG. 4B is an equivalent circuit diagram of a latch circuit and a memory cell. While the three-bit memory circuit 260 is illustrated in FIG. 4A, the number of bits is not limited thereto.

The memory circuit 260 includes a latch circuit 151, a counter circuit 152, and a memory cell 153. The counter circuit 152 outputs a three-bit count signal. A plurality of latch circuits 151 are provided in accordance with the number of bits. The latch circuit 151 is connected to output lines of respective bits of the counter circuit 152. Further, a plurality of memory cells 153 are provided in accordance with the number of bits. The memory cell 153 is connected to the output node of the latch circuit 151.

The latch circuit 151 holds a count signal output from the counter circuit 152 in accordance with the latch signal. Further, in response to a transfer signal, a signal held by the latch circuit 151 is transferred to the memory cell 153. The latch circuit 151 and the memory cell 153 are formed of a plurality of P-channel transistors and a plurality of N-channel transistors, respectively, as illustrated in FIG. 4B.

Pixel Circuit (Counter Circuit)

Figure 5:
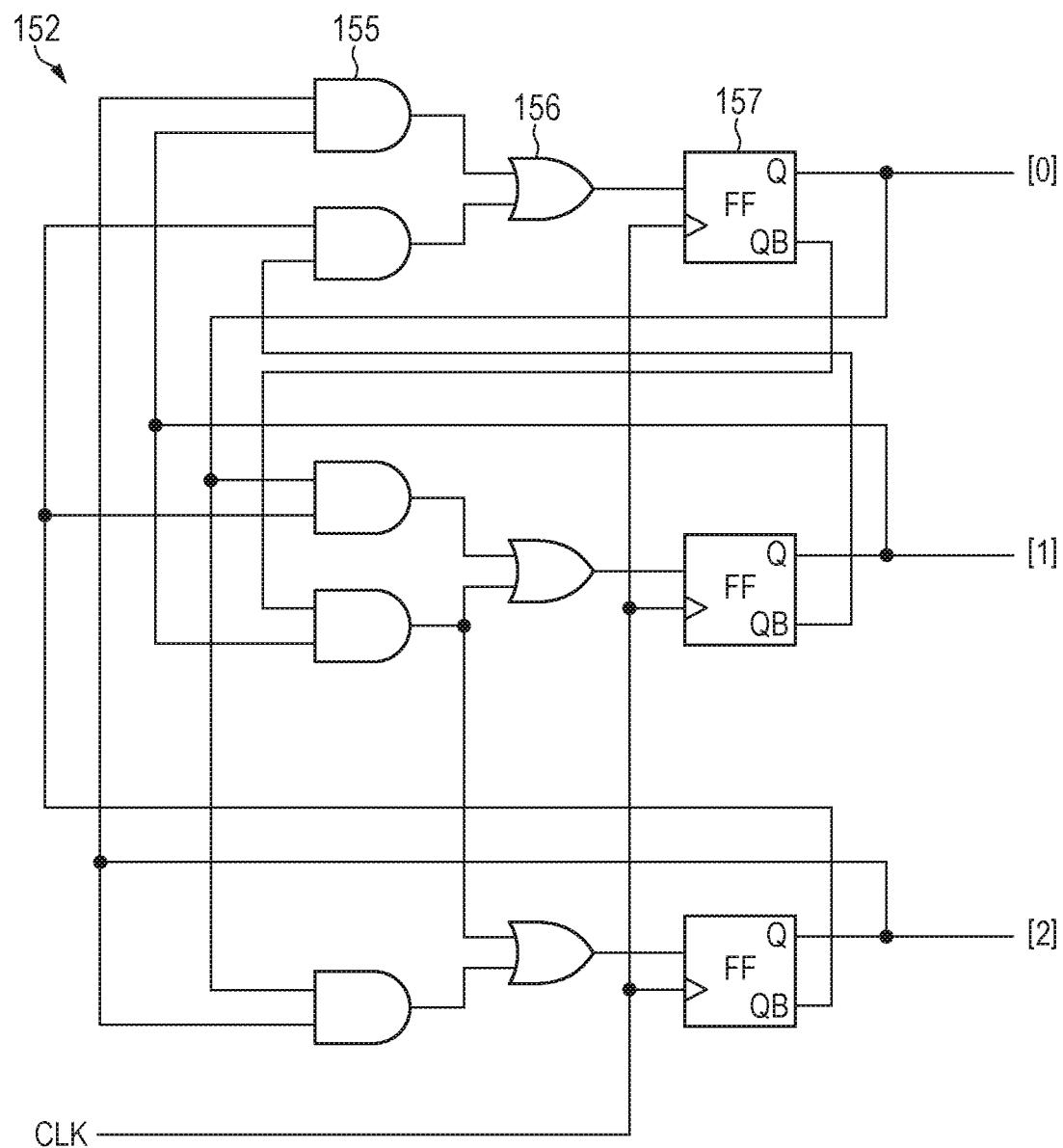
FIG. 5 is a logic circuit diagram of a counter circuit.

FIG. 5 is a logic circuit diagram of the counter circuit 152. FIG. 5 illustrates an example of the counter circuit 152 that outputs a three-bit gray code. As illustrated in FIG. 5, the counter circuit 152 includes flip-flops, and the number of flip-flop corresponds to the number of bits. Further, the counter circuit 152 includes a plurality of AND gates and a plurality of OR gates. Although detailed description of the equivalent circuit is omitted, the flip-flops, the AND gate, and the OR gate are each includes a transistor. With such a configuration, the counter circuit 152 outputs a count signal in accordance with a clock signal CLK.

Operation

Subsequently, the operation of the photoelectric conversion device of the present embodiment will be described. FIG. 6 is a timing chart illustrating the operation of the photoelectric conversion device. FIG. 6 illustrates a control signal OFG, a control signal RES, a control signal TX, a ramp signal RAMP, and the initialization signal INI. The number appended to the reference symbol corresponds to the row number in FIG. 1.

In a period from time t1 to time t2, draining (reset) of charges of the photoelectric conversion units 130 on all the rows is performed at the same time. The photoelectric conversion unit 130 then accumulates signal charges generated from an incident light. Subsequently, in a period from time t9 to time t10, the potential of the gate of the input transistor 160 (the input node of the comparator) is reset on all the rows.

At time t11, the level of the ramp signal RAMP is increased, and the potential of the output node of the comparator (the drain of the transistor 210) is increased over and thus fixed to the power source voltage. Thereby, the transistor 230 is turned off.

At time t12, the initialization signal INI is then set to a low level. When the initialization signal INI is set to a low level while the transistor 230 is in an on-state, the transistor 220 is turned on immediately after the initialization signal INI becomes a low level. It is therefore preferable to set the initialization signal INI to a low level while the transistor 230 is in an off-state. At time t12, a change in the potential of the ramp signal RAMP, that is, a slope operation is started.

At any timing between time t12 and time t13, the potential of the output node of the comparator, that is, the latch signal is inverted. The operation at this time is the same as illustrated in FIG. 3. In response to the inversion of the latch signal, the memory circuit 260 holds a reset level signal. The reset level signal is a digital signal corresponding to the potential of the input node of the comparator with the pixel 100 being reset.

From time t14 to time t15, signal charges are transferred from the photoelectric conversion unit 130 to the gate of the input transistor 160. That is, a signal based on signal charges generated by the photoelectric conversion unit is input to the gate of the input transistor 160. Transfer of these signal charges is performed at the same time on all the rows. The period from time t2 to time t15 is an exposure period or an accumulation period.

In a period from time t16 to time t17, AD conversion is performed on a signal based on signal charges generated by the photoelectric conversion unit 130. At any timing between time t16 and time t17, the potential of the output node of the comparator, that is, the latch signal is inverted. In response to the inversion of the latch signal, the memory circuit 260 holds an optical level signal. The optical level signal is a digital signal corresponding to a signal based on signal charges generated by the photoelectric conversion unit 130.

The reset level signal held in the memory circuit 260 is transferred to a processing unit (not illustrated) on the post-stage from time t13 and time t16. Further, at and after time t17, the optical level signal is transferred to the processing unit. The processing unit then performs differential processing of the reset level signal and the optical level signal and externally outputs the differential signal. The transfer of digital signals from the memory circuit 260 to the processing unit may be performed sequentially or may be performed at the same time at all the pixels.

In the operation described above, the charge drain transistors 120 on all the rows are operated in synchronization with each other, and the transfer transistors 140 on all the rows are operated in synchronization with each other. Thus, exposure periods on all the rows are matched. A so-called a global electronic shutter operation is performed.

Transistor Size 1

In the present embodiment, the pixel circuit of the pixel 100 includes the input transistor 160. The input transistor 160 receives a signal based on signal charges generated by the photoelectric conversion unit 130 and forms a differential pair with the reference transistor 170. The pixel circuit of the pixel 100 further includes another transistor than the input transistor 160. Further, the readout circuit 110 of FIG. 1 includes a transistor. In this example, the size of the input transistor 160 is different from the size of any of the transistors included in the pixel circuit of the pixel 100 or the readout circuit 110. Hereinafter, for the purpose of illustration, two transistors having different sizes from each other are referred to as a transistor A and a transistor B.

Figure 7A:
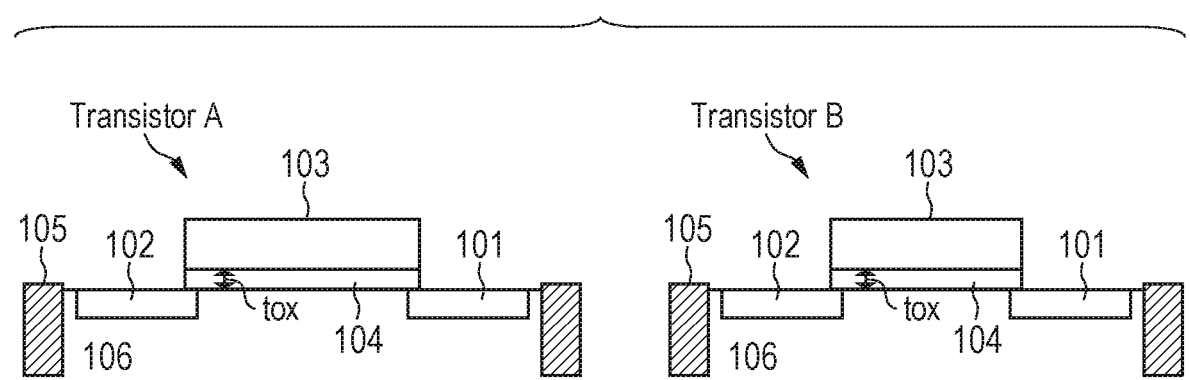
FIG. 7A is a diagram schematically illustrating the sectional structure of transistors.
Figure 7B:
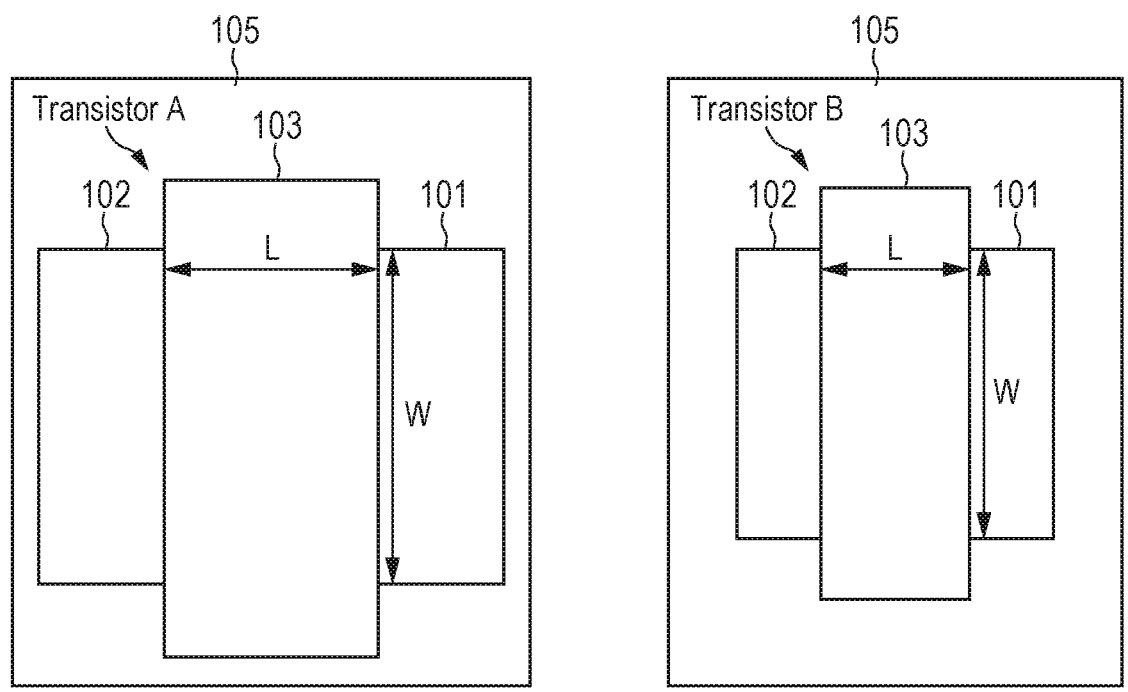
FIG. 7B is a diagram schematically illustrating the planar structure of the transistors.

FIG. 7A is a diagram schematically illustrating the sectional structure of the transistor A and the transistor B. FIG. 7B is a diagram schematically illustrating the planar structure of the transistor A and the transistor B. The planar structure refers to the structure when viewed in a direction perpendicular to the surface of the semiconductor substrate.

An isolation portion 105 with LOCOS, STI, DTI, or the like is arranged around the semiconductor substrate. The isolation portions 105 define active regions 106 in which the transistor A and the transistor B are arranged. The source region 101 and the drain region 102 of the transistor A are formed in the active region 106, and the source region 101 and the drain region 102 of the transistor B are formed in the active region 106. In a case of N-channel, each of the source region 101 and the drain region 102 is an n-type semiconductor region. In a case of P-channel, each of the source region 101 and the drain region 102 is a p-type semiconductor region. A gate electrode 103 is formed on the semiconductor substrate via a gate insulating film 104. The gate insulating film 104 is formed of an insulator such as a silicon oxide film. The gate electrode 103 is formed of a conductor such as a polysilicon.

Each size of the transistor A and the transistor B is any one of a film thickness tox of the gate insulating film 104, a channel length L, a channel width W, or a ratio W/L of the channel width W and the channel length L. In FIG. 7A, the film thickness tox of the gate insulating film 104 is illustrated by arrows. In FIG. 7B, the channel length L and the channel width W are illustrated by arrows, respectively. The channel length L is defined by an end-to-end distance of the gate electrode 103, for example. The channel width W is defined by a width of the active region 106 covered with the gate electrode 103, for example. In other words, the channel width W is defined by the ends of the isolation portion 105.

FIG. 7A and FIG. 7B illustrate an example in which the channel length L and the channel width W are different between the transistor A and the transistor B, respectively. On the other hand, the W/L and the film thickness tox the gate insulating film 104 of the transistor A are the same as those of the transistor B. As illustrated in FIG. 7B, the channel length L and the channel width W of the transistor A are larger than the channel length L and the channel width W of the transistor B, respectively. That is, the size of the transistor A is larger than the size of the transistor B.

Differential Pair

There are some variations in the combination of two transistors having different sizes. In one example, the transistor A is used as the reference transistor 170, and the transistor B is used as the input transistor 160. That is, the channel length L and the channel width W of the reference transistor 170 are larger than the channel length L and the channel width W of the input transistor 160, respectively. Such a configuration can improve the S/N ratio.

When a transistor that receives charges generated by the photoelectric conversion unit 130 has a long channel length L and a long channel width W, this results in a large parasitic capacitance of the gate of the transistor. This causes a smaller charge-to-voltage conversion coefficient, which results in a reduction in signal level. Accordingly, reduction in size of the gate electrode of the input transistor 160 can improve the S/N ratio.

On the other hand, no limitation of size for improving the charge-to-voltage conversion coefficient is applied to the gate electrode of the reference transistor 170. In general, increase in size of the gate electrode can reduce 1/f noise or variation in a threshold voltage. Accordingly, increase in size of the reference transistor 170 can reduce 1/f noise such as flicker noise. Further, smaller variation in the threshold voltage can reduce variation in the reset voltage when the potential of the input node of the comparator (the gate of the input transistor 160) is reset.

As discussed above, with a configuration in which the channel length L and the channel width W of the reference transistor 170 are larger than the channel length L and the channel width W of the input transistor 160, respectively, it is possible to improve the S/N ratio. Note that the same advantage can be obtained also when only the channel length L of the reference transistor 170 is larger than the channel length L of the input transistor 160. Further, the same advantage can be obtained also when only the channel width W of the reference transistor 170 is larger than the channel width W of the input transistor 160. In particular, unless otherwise specified, the same applies to examples described later.

Further, the configuration in which the channel length L of the reference transistor 170 is longer than the channel length L of the input transistor 160 can reduce current noise due to thermal noise.

Typically, current noise due to thermal noise of a MOS transistor is proportional to the square root ($\sqrt{gm}$) of the transconductance gm. When the current noise generated by the input transistor 160 and the reference transistor 170 forming the differential pair is converted to a voltage noise Vn in the input node of the comparator (the gate of the input transistor 160), the voltage noise Vn is expressed by Equation (1).

$$V_n \propto \sqrt{\frac{1}{g_{m1}}} + \sqrt{\frac{g_{m2}}{(g_{m1})^2}} \tag{1}$$

As represented by Equation (1), when the transconductance gm1 of the input transistor 160 increases, the voltage noise Vn decreases. On the other hand, when the transconductance gm2 of the reference transistor 170 decreases, the voltage noise Vn decreases. The current noise generated by the reference transistor 170 causes a current change of the input transistor 160 that is a counterpart in the differential pair. Thus, the current noise of the reference transistor 170 and the voltage noise Vn of the gate of the input transistor 160 have a proportional relationship.

The transconductance gm is here expressed by the following Equation (2). The value μ denotes a mobility of charges in a channel, the value cox denotes a dielectric constant of a gate insulating film, and the value Id denotes a drain current. The film thickness tox of the gate insulating film 104 is illustrated in FIG. 7A, and the channel length L and the channel width W are illustrated in FIG. 7B.

$$g_m = \sqrt{2\mu \frac{\varepsilon_{OX} \cdot W}{t_{OX} \cdot L} I_d} \tag{2}$$

Since the channel length L of the input transistor 160 is short, the transconductance gm1 of the input transistor 160 can be increased. On the other hand, since the channel length L of the reference transistor 170 is long, the transconductance gm2 of the reference transistor 170 can be reduced. As a result, noise due to thermal noise can be reduced. In this example, the channel widths W of two transistors may have any relationship.

As a modified example, with the channel width W of the input transistor 160 being larger than the channel width W of the reference transistor 170, current noise due to thermal noise can be reduced. This advantage has been described with reference to the above Equation (1) and Equation (2).

In this example, the channel lengths L of two transistors may have any relationship. In terms of improvement of the charge-to-voltage conversion coefficient, it is preferable that the channel length L of the input transistor 160 be shorter than the channel length L of the reference transistor 170, while the channel width W of the input transistor 160 be larger than the channel width W of the reference transistor 170. With the channel length L of the input transistor 160 being short, the charge-to-voltage conversion coefficient can be increased. As a result, it is possible to increase the signal level by using the relationship of the channel length L and reduce noise by using the relationship of the channel width W.

When the size of the input transistor 160 and the size of the reference transistor 170 are different from each other, offset cancelation is possible. When the reset transistor 150 is turned on to reset the potential of the input node of the comparator (the gate of the input transistor 160), the ramp signal RAMP is controlled to a predetermined reset potential Vr. The potential of the gate of the input transistor 160 at this time is represented by Vr−Vgs(170)+Vgs(160). At this time, the threshold voltage Vth of the input transistor 160 and the threshold voltage Vth of the reference transistor 170 are reflected to Vgs(170) and Vgs(160), respectively. Thus, offset cancelation can be performed. In other words, even when the thresholds voltage Vth of the input transistor 160 and the reference transistor 170 are different for respective pixels 100, the output of the comparator is inverted when the level of the ramp signal VRMP becomes the reset potential Vr in all the pixels 100.

As described above, with the size of the input transistor 160 and the size of the reference transistor 170 being different from each other, the electrical characteristics can be improved.

Input Transistor and Reset Transistor

In another example, the transistor A is used as the reset transistor 150, and the transistor B is used as the input transistor 160. That is, the channel length L and the channel width W of the reset transistor 150 are larger than the channel length L and the channel width W of the input transistor 160, respectively.

As previously described, with the size of the gate of the input transistor 160 being small, the charge-to-voltage conversion coefficient can be increased. Further, with the size of the reset transistor 150 being large, the variation of the threshold voltage Vth of the reset transistor 150 can be reduced. As a result, the variation in the voltage at the time of reset can be reduced.

Input Transistor and Digital Circuit

In another example, the transistor A is used as the input transistor 160, and the transistor B is used as a transistor of the memory circuit 260 (FIG. 4B and FIG. 5). That is, the channel length L and the channel width W of the input transistor 160 are larger than the channel length L and the channel width W of the transistor of the memory circuit 260, respectively.

It is preferable that a transistor used in an analog circuit such as the differential-pair circuit 11 have a large transconductance gm. Thus, the size of the input transistor 160 is increased. On the other hand, in a digital circuit such as the memory circuit 260, it is preferable to reduce the size of the transistor for faster operation. That is, with the size of the input transistor 160 being larger than the size of the transistor of the memory circuit 260, it is possible to perform a faster operation while reducing noise as a result.

In another example, the transistor A is used as the input transistor 160, and the transistor B is used as a transistor of the readout circuit 110. That is, the channel length L and the channel width W of the input transistor 160 are larger than the channel length L and the channel width W of the transistor of the readout circuit 110, respectively.

Typically, the readout circuit 110 is formed of logic circuits such as a logic gate or a flip-flop. Thus, it is preferable to reduce the size of the transistor for a faster operation. In the same manner as the previous example, with the size of the input transistor 160 being larger than the size of the transistor of the memory circuit 260, it is possible to perform a faster operation while reducing noise as a result.

Transistor Size 2

Figure 8A:
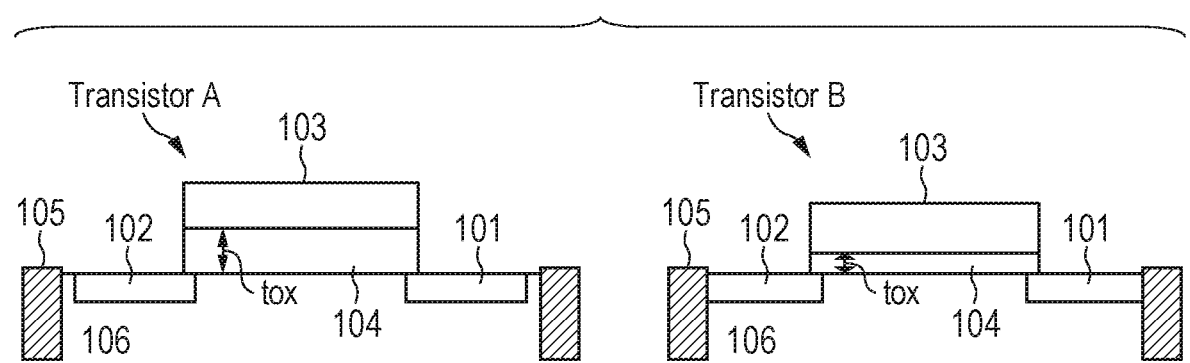
FIG. 8A is a diagram schematically illustrating the sectional structure of transistors.
Figure 8B:
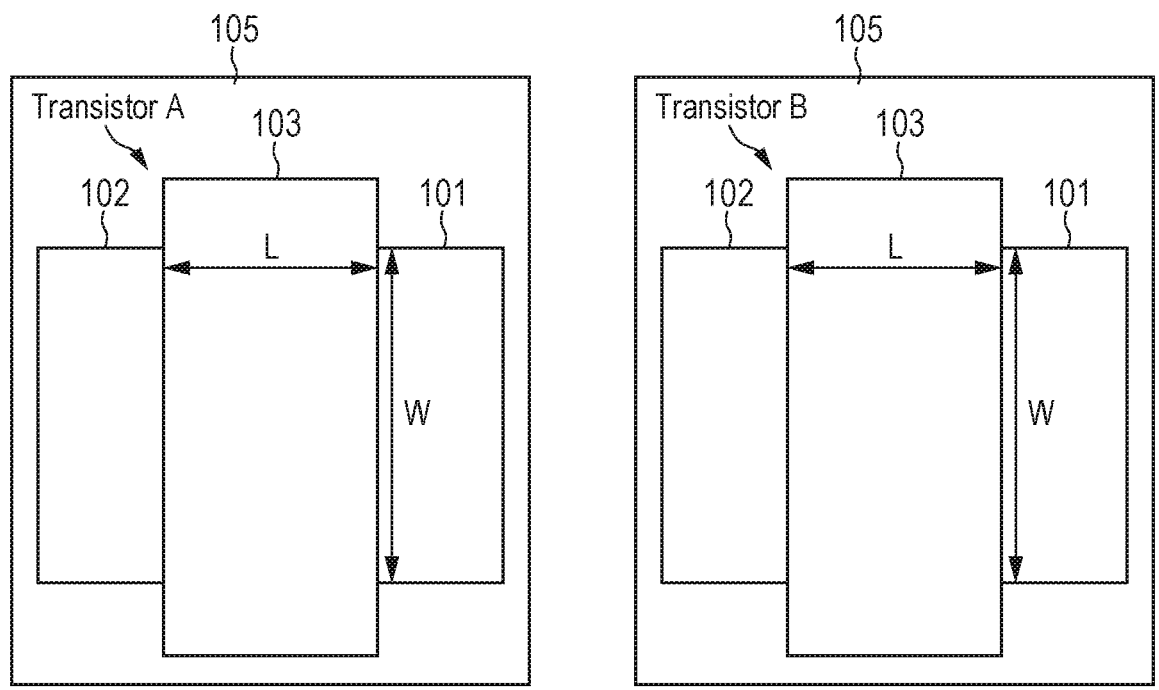
FIG. 8B is a diagram schematically illustrating the planar structure of the transistors.

Next, an example in which the transistor A and the transistor B have the gate insulating films 104 having different film thicknesses tox from each other will be described. FIG. 8A is a diagram schematically illustrating the sectional structure of the transistor A and the transistor B. FIG. 8B is a diagram schematically illustrating the planar structure of the transistor A and the transistor B. The same portions as those of FIG. 7A and FIG. 7B are labeled with the same reference symbols.

As illustrated in FIG. 8A, the film thickness tox of the gate insulating film 104 of the transistor A is larger than the film thickness tox of the gate insulating film 104 of the transistor B. On the other hand, as illustrated in FIG. 8B, the channel length L and the channel width W of the transistor A are the same as the channel length L and the channel width W of the transistor B, respectively.

There are some variations in the combination of two transistors having the gate insulating films 104 of different film thicknesses tox. In one example, the transistor A is used as the reference transistor 170, and the transistor B as used in the input transistor 160. That is, the film thickness tox of the gate insulating film 104 of the reference transistor 170 is larger than the film thickness tox of the gate insulating film 104 of the input transistor 160. Such a configuration can reduce noise due to thermal noise.

As represented by Equation (1) described above, when the transconductance gm1 of the input transistor 160 increases, the voltage noise Vn decreases. On the other hand, when the transconductance gm2 of the reference transistor 170 decreases, the voltage noise Vn decreases. Further, as represented by Equation (2), the smaller the film thickness tox of the gate insulating film 104 is, the larger the transconductance gm is.

In this example, since the film thickness tox of the gate insulating film 104 of the input transistor 160 is short, the transconductance gm1 of the input transistor 160 can be increased. On the other hand, since the film thickness tox of the gate insulating film 104 of the reference transistor 170 is long, the transconductance gm2 of the reference transistor 170 can be decreased. As a result, noise due to thermal noise can be reduced.

Note that, to further reduce the noise, it is preferable that the channel length L of the input transistor 160 be shorter than the channel length L of the reference transistor 170 and that the channel width W of the input transistor 160 be larger than the channel width W of the reference transistor 170.

In another example, the transistor A is used as the input transistor 160, and the transistor B is used as a transistor of the memory circuit 260 (FIG. 4B and FIG. 5). That is, the film thickness tox of the gate insulating film 104 of the input transistor 160 is larger than the film thickness tox of the gate insulating film 104 of the transistor of the memory circuit 260.

Transistors used in an analog circuit such as the differential-pair circuit 11 are supplied with a relatively high power source voltage. Thus, it is preferable to increase the film thickness tox of the gate insulating film 104 of the input transistor 160 so that a high withstand voltage can be obtained. On the other hand, a digital circuit such as the memory circuit 260 often operates relatively faster than an analog circuit. Further, a digital circuit is typically supplied with a power source voltage lower than the power source voltage of an analog circuit. Thus, it is preferable to reduce the film thickness tox of the gate insulating film 104 for a faster operation of a transistor. That is, with the film thickness tox of the gate insulating film 104 of the input transistor 160 being larger than the film thickness tox of the gate insulating film 104 of the transistor of the memory circuit 260, it is possible to perform a faster operation while improving reliability as a result.

In another example, the transistor A is used as the input transistor 106, and the transistor B is used as a transistor of the readout circuit 110. That is, the film thickness tox of the gate insulating film 104 of the input transistor 160 is larger than the film thickness tox of the gate insulating film 104 of the transistor of the readout circuit 110.

The readout circuit 110 is typically formed of logic circuits such as a logic gate or a flip-flop. Thus, it is preferable to reduce the size of the transistor for a faster operation. In the same manner as the previous example, with the film thickness tox of the gate insulating film 104 of the input transistor 160 being larger than the film thickness tox of the gate insulating film 104 of the transistor of the memory circuit 260, it is possible to perform a faster operation while improving reliability as a result.

Transistor Size 3

Figure 9A:
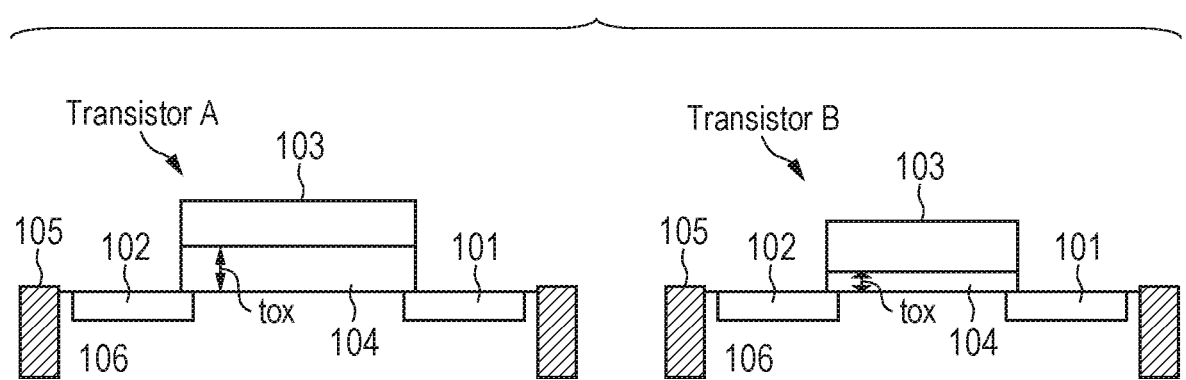
FIG. 9A is a diagram schematically illustrating the sectional structure of transistors.
Figure 9B:
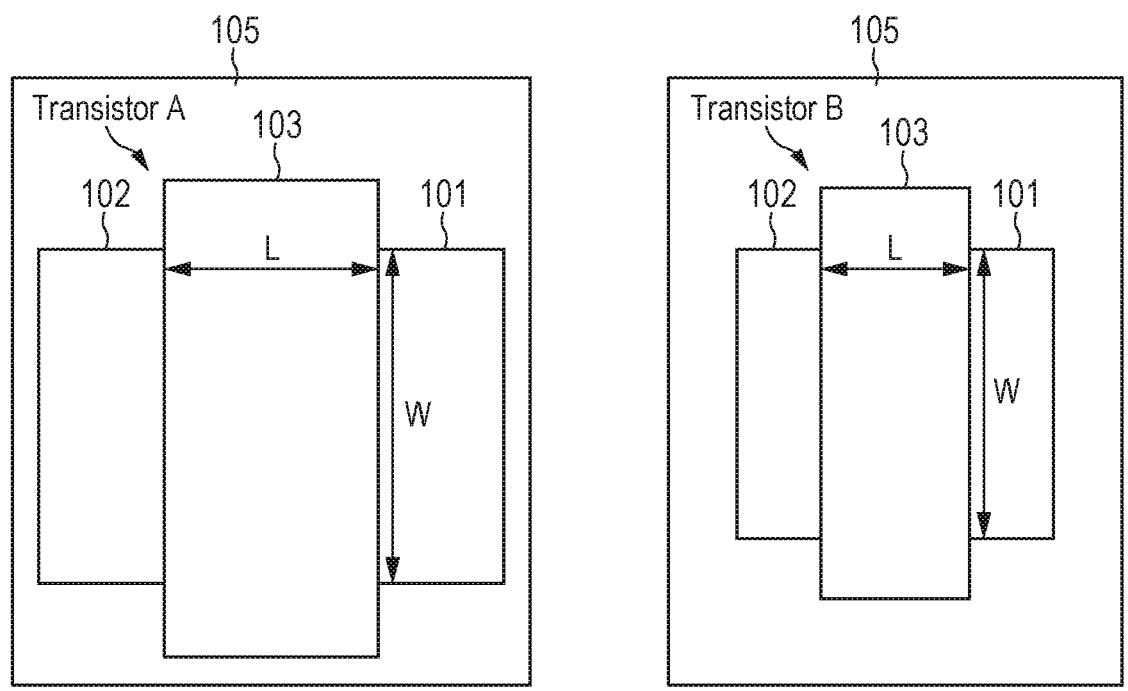
FIG. 9B is a diagram schematically illustrating the planar structure of the transistors.

Next, yet another modified example will be described. FIG. 9A is a diagram schematically illustrating the sectional structure of the transistor A and the transistor B. FIG. 9B is a diagram schematically illustrating the planar structure of the transistor A and the transistor B. The same portions as those of FIG. 7A and FIG. 7B or FIG. 8A and FIG. 8B are labeled with the same reference symbols.

As illustrated in FIG. 9A, the film thickness tox of the gate insulating film 104 of the transistor A is larger than the film thickness tox of the gate insulating film 104 of the transistor B. Further, as illustrated in FIG. 9B, the channel length L and the channel width W of the transistor A are larger than the channel length L and the channel width W of the transistor B, respectively.

In the same manner as the example of FIG. 7A and FIG. 7B and the example of FIG. 8A and FIG. 8B, one of the transistor A and the transistor B is applied to the input transistor 160, the other of the transistor A and the transistor B is applied to another transistor, and thereby the advantage of improvement of electric characteristics can be obtained.

For example, the transistor A is used as the reference transistor 170, and the transistor B is used as the input transistor 160. That is, the channel length L and the channel width W of the reference transistor 170 are larger than the channel length L and the channel width W of the input transistor 160, respectively. Furthermore, the film thickness tox of the gate insulating film 104 of the reference transistor 170 is larger than the film thickness tox of the gate insulating film 104 of the input transistor 160.

According to such a configuration, first of all, the charge-to-voltage conversion coefficient of the input node of the comparator (the gate of the input transistor 160) can be increased. Furthermore, 1/f noise can be reduced in the reference transistor 170. In addition, noise due to thermal noise caused by the differential pair can be reduced.

Note that, in FIG. 9A and FIG. 9B, the size of the transistor A is larger than the size of the transistor B for each aspect of the film thickness tox of the gate insulating film 104, the channel length L, and the channel width W. However, the size relationship may be opposite for some of the aspects.

To optimize the transconductance gm, it is preferable that the film thickness tox of the gate insulating film 104 of the reference transistor 170 be larger than the film thickness tox of the gate insulating film 104 of the input transistor 160. Further, it is preferable that the channel length L of the reference transistor 170 be larger than the channel length L of the input transistor 160. On the other hand, it is preferable that the channel width W of the reference transistor 170 be smaller than the channel width W of the input transistor 160.

Conclusion

As described above, the pixel 100 includes the input transistor 160 that receives a signal based on signal charges generated by the photoelectric conversion unit 130 and forms a differential pair with the reference transistor 170. Further, the size of the input transistor 160 is different from the size of any other transistors in the pixel circuit or the transistor of the readout circuit. With such a configuration, the electric characteristics can be improved.

With the channel width W being large, it is possible to obtain the advantage of reduction of 1/f noise, reduction of variation of a threshold voltage, reduction of noise due to thermal noise when used as the input transistor 160 (increase in transconductance gm), or the like.

On the other hand, with the channel width W being small, it is possible to obtain the advantage of a fast operation, an improved charge-to-voltage conversion coefficient when used as the input transistor 160, reduction of noise when used as the reference transistor 170 (decrease in transconductance gm), or the like.

With the channel length L being large, it is possible to obtain the advantage of reduction of 1/f noise, reduction of variation of a threshold voltage, reduction of noise when used as the reference transistor 170 (decrease in transconductance gm), or the like.

On the other hand, with the channel length L being small, it is possible to obtain the advantage of a fast operation, an improved charge-to-voltage conversion coefficient when used as the input transistor 160, reduction of noise due to thermal noise (increase in transconductance gm), and the like.

With the film thickness tox of the gate insulating film 104 being large, it is possible to obtain the advantage of an improved withstand voltage, reduction of noise when used as the reference transistor 170 (decrease in transconductance gm), or the like.

On the other hand, with the film thickness tox of the gate insulating film 104 being small, it is possible to obtain the advantage of a fast operation, reduction of noise due to thermal noise when used as the input transistor 160 (increase in transconductance gm), or the like.

Other than the examples of the combination described above, any combination of transistors having different sizes may be selected to obtain the above advantages.

Second Embodiment

A photoelectric conversion device according to the present embodiment will be described. In the photoelectric conversion device according to the present embodiment, one circuit of the pixel 100 is divided into and arranged on two semiconductor substrates. Other features are the same as those of the first embodiment. Features different from those of the first embodiment will be described below, and description of the same portions as those of the first embodiment will be omitted.

The general configuration of the photoelectric conversion device of the present embodiment and the function block of the pixel 100 are the same as those of the first embodiment. That is, FIG. 1 schematically illustrates the configuration of the photoelectric conversion device. Further, FIG. 2 is a block diagram schematically illustrating the configuration of the pixel 100. Repeated description of these drawings will be omitted because of being the same as the first embodiment.

Figure 10:
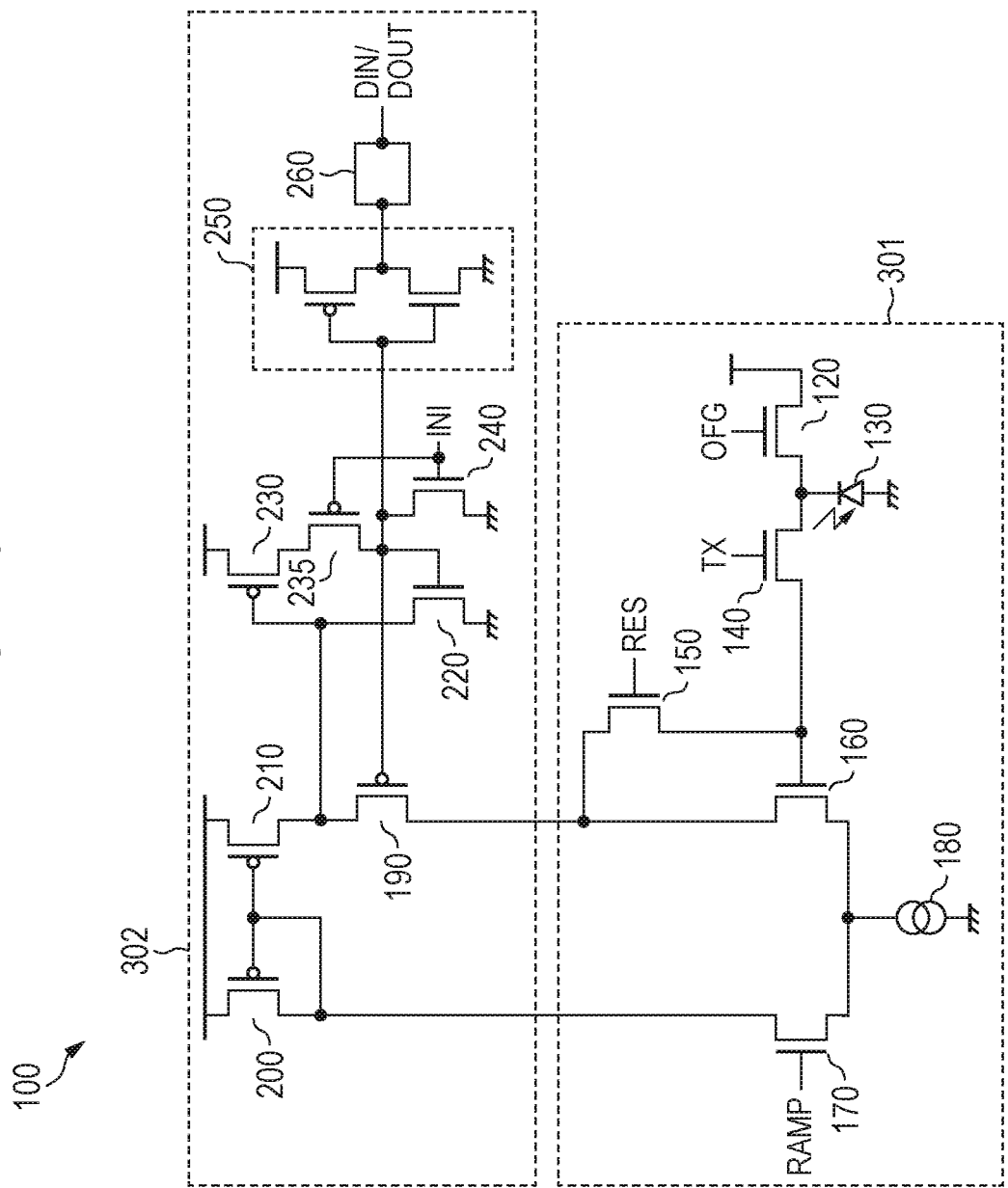
FIG. 10 is a diagram illustrating an equivalent circuit of a pixel of a photoelectric conversion device.

FIG. 10 is a diagram illustrating an equivalent circuit of the pixel 100. However, the memory circuit 260 is illustrated as a block. As illustrated in FIG. 10, the equivalent circuit of the pixel 100 of the present embodiment is the same as that of the first embodiment (FIG. 3). Thus, description of the function of each circuit block will be omitted.

The difference from the first embodiment is that the pixel circuit of the pixel 100 of the present embodiment is divided into and arranged on a first semiconductor substrate 301 and a second semiconductor substrate 302.

Specifically, the photoelectric conversion unit 130 is arranged on the first semiconductor substrate 301. The signal charge processing circuit 10 including the charge drain transistor 120, the transfer transistor 140, and the reset transistor 150 is arranged on the first semiconductor substrate 301. The differential-pair circuit 11 including the input transistor 160, the reference transistor 170, and the current source 180 is arranged on the first semiconductor substrate 301.

On the other hand, the current mirror circuit 13 including the transistor 200 and the transistor 210 is arranged on the second semiconductor substrate 302. The positive feedback circuit 14 including the four transistors 220, 230, 235, and 240 is arranged on the second semiconductor substrate 302. The level shifter circuit 250 and the memory circuit 260 are arranged on the second semiconductor substrate 302. Further, the readout circuit 110 of FIG. 1 and the ramp signal generation circuit 12 of FIG. 2 are arranged on the second semiconductor substrate 302.

The relative arrangement of two semiconductor substrates will be described. In the present embodiment, the first semiconductor substrate 301 including the photoelectric conversion unit 130 and the second semiconductor substrate 302 including a part of the pixel circuit are stacked. When the photoelectric conversion unit 130 is projected onto the second semiconductor substrate 302 in a direction perpendicular to the surface of the first semiconductor substrate 301, at least some of the transistors of the pixel circuit overlap with the projected image of the photoelectric conversion unit 130. Specifically, some or all of the transistors included in the current mirror circuit 13, the positive feedback circuit 14, and the level shifter circuit 250, and the memory circuit 260 are arranged at the position overlapped with the projected image of the photoelectric conversion unit 130.

On the first semiconductor substrate 301, a plurality of pixel circuits each including the photoelectric conversion unit 130, the signal charge processing circuit 10, and the differential-pair circuit 11 as one unit are two-dimensionally arranged to form a matrix. On the second semiconductor substrate 302, a plurality of pixel circuit each including the current mirror circuit 13, the positive feedback circuit 14, the level shifter circuit 250, and the memory circuit 260 as one unit are two-dimensionally arranged to form a matrix.

Transistor Size 1

One of the aspects of the present embodiment is that the size of the transistors arranged on the first semiconductor substrate 301 and the size of the transistors arranged on the second semiconductor substrate 302 are different from each other. The size of the transistor refers to any one of the film thickness tox of the gate insulating film 104, the channel length L, the channel width W, or the ratio W/L of the channel width W and the channel length L. That is, FIG. 7A to FIG. 9B illustrate two transistors (the transistor A and the transistor B) having different sizes in the present embodiment. Description of the structure illustrated in FIG. 7A to FIG. 9B will be omitted because of being the same as that of the first embodiment.

There are some variations in the combination of two transistors having different sizes. In one example, the transistor A of FIG. 8A and FIG. 8B is used in the first semiconductor substrate 301, and the transistor B of FIG. 8A and FIG. 8B is used in the second semiconductor substrate 302.

Transistors used in an analog circuit such as the signal charge processing circuit 10 and the differential-pair circuit 11 are supplied with a relatively high power source voltage. Thus, it is preferable that the film thickness tox of the gate insulating film 104 of the transistor be large so that a high withstand voltage can be obtained.

On the other hand, a digital circuit such as the memory circuit 260 often operates relatively faster than an analog circuit. Further, a digital circuit is typically supplied with a power source voltage lower than a power source voltage of an analog circuit. Thus, it is preferable that the film thickness tox of the gate insulating film 104 be small so that the transistor can operate fast.

As discussed above, with the film thickness tox of the gate insulating film 104 on the transistor of the first semiconductor substrate 301 being larger than the film thickness tox of the gate insulating film 104 of the transistor on the second semiconductor substrate 302, it is possible to perform a fast operation while improving reliability as a result.

Further, to optimize the manufacturing process, the size of the transistor arranged on the first semiconductor substrate 301 and the size of the transistor arranged on the second semiconductor substrate 302 may be different from each other. For example, the transistor A of FIG. 8A and FIG. 8B is used in the first semiconductor substrate 301, and the transistor B of FIG. 8A and FIG. 8B is used in the second semiconductor substrate 302. That is, in each aspect of the channel width W, the channel L, and the film thickness tox of the gate insulating film 104, the size of the transistor of the first semiconductor substrate 301 is larger than the size of the transistor of the second semiconductor substrate 302.

Compared to the first semiconductor substrate 301, more elements are arranged on the second semiconductor substrate 302. Thus, a finer design rule is applied for manufacturing the transistors on the second semiconductor substrate 302. However, a process with a finer design rule is more likely to cause a problem of reduction in the yield rate due to a short circuit of wirings or the like. Accordingly, by applying a design rule with more lenient conditions to the first semiconductor substrate 301, it is possible to suppress reduction in the yield rate. As a result, it is possible to maintain a high productivity while reducing the size of the pixel 100 and thus reducing the size of the photoelectric conversion device.

Transistor Size 2

As another aspect of the present embodiment, in the same manner as the first embodiment, the size of the input transistor 160 is different from the size of any of the transistors included in the pixel circuit of the pixel 100 or the readout circuit 110. In this case, the transistor having a different size from the input transistor 160 may be a transistor arranged on the first semiconductor substrate 301 or may be a transistor arranged on the second semiconductor substrate 302.

There are some variations in the combination of two transistors having different sizes, and all the combinations described in the first embodiment may be applied. The specific combination and the advantage obtained in the combination are the same as those in the first embodiment. Thus, the same description as in the first embodiment is applied, and the repeated description will be omitted as appropriate.

In one example, with the size of the input transistor 160 and the size of the reference transistor 170 being different from each other, it is possible to improve the electric characteristics. The channel length L and the channel width W of the reference transistor 170 are larger than the channel length L and the channel width W of the input transistor 160, respectively. Such a configuration can improve the S/N ratio. Alternatively, a configuration in which the channel length L of the reference transistor 170 is longer than the channel length L of the input transistor 160 can reduce current noise due to thermal noise.

In another example, the channel length L and the channel width W of the reset transistor 150 are larger than the channel length L and the channel width W of the input transistor 160, respectively. Such a configuration can reduce the variation in voltage at the time of reset.

As discussed above, when the pixel circuit is divided into and arranged on two semiconductor substrates, two transistors arranged on the same semiconductor substrate may have the size different from each other. Further, in the same manner as the first embodiment, two transistors may include the gate insulating films 104 whose film thicknesses tox are different from each other.

As described above, the pixel circuit of the pixel 100 is divided into and arranged on the first semiconductor substrate 301 and the second semiconductor substrate 302. The size of any of the transistors on the first semiconductor substrate 301 is different from the size of any of the transistor on the second semiconductor substrate 302. Such a configuration can improve the electric characteristics.

Third Embodiment

The photoelectric conversion device according to the present embodiment will be described. In the photoelectric conversion device of the present embodiment, the circuit of one pixel 100 is divided into and arranged on two semiconductor substrates. Other features are the same as those of the first embodiment. Further, while the reference transistor 170 is arranged on the first semiconductor substrate 301 in the second embodiment, the reference transistor 170 is arranged on the second semiconductor substrate 302 in the present embodiment. The features different from those of the first embodiment and the second embodiment will be described below, and description of the same portions as those of the first embodiment or the second embodiment will be omitted.

The general configuration of the photoelectric conversion device of the present embodiment and the function block of the pixel 100 are the same as those of the first embodiment. That is, FIG. 1 schematically illustrates the configuration of the photoelectric conversion device. Further, FIG. 2 is a block diagram schematically illustrating the configuration of the pixel 100. Repeated description of these drawings will be omitted because of being the same as the first embodiment.

Figure 11:
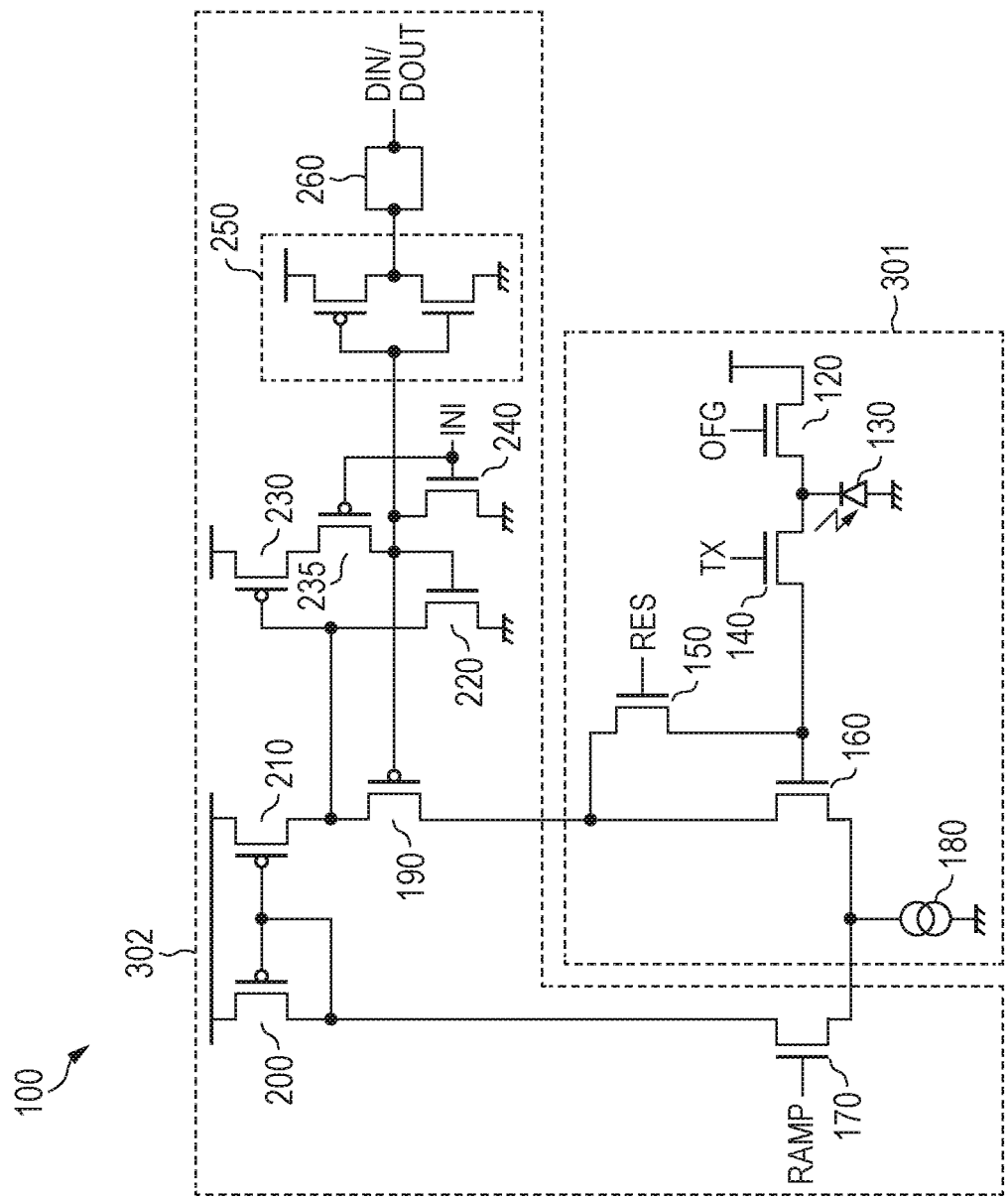
FIG. 11 is a diagram illustrating an equivalent circuit of a pixel of a photoelectric conversion device.

FIG. 11 is a diagram illustrating an equivalent circuit of the pixel 100. However, the memory circuit 260 is illustrated as a block. As illustrated in FIG. 11, the equivalent circuit of the pixel 100 of the present embodiment is the same as that of the first embodiment (FIG. 3). Thus, description of the function of each circuit block will be omitted.

The difference from the first embodiment is that the pixel circuit of the pixel 100 of the present embodiment is divided into and arranged on the first semiconductor substrate 301 and the second semiconductor substrate 302.

Specifically, the photoelectric conversion unit 130 is arranged on the first semiconductor substrate 301. The signal charge processing circuit 10 including the charge drain transistor 120, the transfer transistor 140, and the reset transistor 150 is arranged on the first semiconductor substrate 301.

The input transistor 160 of the differential-pair circuit 11 and the current source 180 are arranged on the first semiconductor substrate 301. On the other hand, the reference transistor 170 of the differential-pair circuit 11 is arranged on the second semiconductor substrate 302. The present embodiment is different from the second embodiment in this regard.

With respect to other components, in the same manner as in the second embodiment, the current mirror circuit 13 including the transistor 200 and the transistor 210 is arranged on the second semiconductor substrate 302. The positive feedback circuit 14 including the four transistors 220, 230, 235, and 240 is arranged on the second semiconductor substrate 302. The level shifter circuit 250 and the memory circuit 260 are arranged on the second semiconductor substrate 302. Further, the readout circuit 110 of FIG. 1 and the ramp signal generation circuit 12 of FIG. 2 are arranged on the second semiconductor substrate 302.

The relative arrangement of two semiconductor substrates will be described. In the present embodiment, the first semiconductor substrate 301 including the photoelectric conversion unit 130 and the second semiconductor substrate 302 including a part of the pixel circuit are stacked. When the photoelectric conversion unit 130 is projected onto the second semiconductor substrate 302 in a direction perpendicular to the surface of the first semiconductor substrate 301, at least some of the transistors of the pixel circuit overlap with the projected image of the photoelectric conversion unit 130. Specifically, some or all of the transistors included in the current mirror circuit 13, the positive feedback circuit 14, the level shifter circuit 250, and the memory circuit 260 and the reference transistor 170 are arranged at the position overlapping with the projected image of the photoelectric conversion unit 130.

On the first semiconductor substrate 301, a plurality of pixel circuits each including the photoelectric conversion unit 130, the signal charge processing circuit 10, and the differential-pair circuit 11 (the input transistor 160 and the current source 180) as one unit are two-dimensionally arranged to form a matrix. On the second semiconductor substrate 302, a plurality of pixel circuit each including the reference transistor 170, the current mirror circuit 13, the positive feedback circuit 14, the level shifter circuit 250, and the memory circuit 260 as one unit are two-dimensionally arranged to form a matrix.

One of the aspects of the present embodiment is that, in the same manner as the second embodiment, the size of the transistor arranged on the first semiconductor substrate 301 and the size of the transistor arranged on the second semiconductor substrate 302 are different from each other. The size of the transistor refers to any of the film thickness tox of the gate insulating film 104, the channel length L, the channel width W, or the ratio W/L of the channel width W and the channel length L. That is, FIG. 7A to FIG. 9B illustrate two transistors (the transistor A and the transistor B) having different sizes in the present embodiment. Since the advantages obtained by such a configuration are the same as those of the second embodiment, the description thereof will be omitted.

In this embodiment, the input transistor 160 is arranged on the first semiconductor substrate 301, and the reference transistor 170 is arranged on the second semiconductor substrate 302. That is, the input transistor 160 and the reference transistor 170 included in the differential pair are arranged in the different semiconductor substrates. With such a configuration, it is possible to change the film thickness tox of the gate insulating film 104 of both the transistors by using a simple manufacturing process.

When the thickness of the gate insulating film 104 is changed between two transistors arranged on a single semiconductor substrate, the manufacturing process may be complex involving a so-called dual-gate process or the like. For example, a process of depositing the gate insulating film 104 of one transistor and a process of depositing the gate insulating film 104 of the other transistor are performed separately. Alternatively, after a process of forming a thick gate insulating film 104 over the entire surface of the semiconductor substrate, a process of processing a part of that gate insulating film to be thinner is added. Therefore, when the input transistor 160 and the reference transistor 170 are arranged on a single semiconductor substrate, the manufacturing process is complex for differentiating the film thickness tox of the gate insulating film 104 of both the transistors.

In contrast, manufacturing of a photoelectric conversion device including two stacked semiconductor substrates originally has the process of forming transistors on respective semiconductor substrates. It is therefore possible to differentiate the film thickness tox of the gate insulating film 104 of the input transistor 160 and the film thickness tox of the gate insulating film 104 of the reference transistor 170 without adding a process. As a result, it is possible to improve the electric characteristics in the photoelectric conversion device manufactured by a simple manufacturing process.

The electric characteristics that can be improved by two transistors of a differential pair having the size different from each other are the same as described in the first embodiment. For example, the film thickness tox of the gate insulating film 104 of the reference transistor 170 is larger than the film thickness tox of the gate insulating film 104 of the input transistor 160. With such a configuration, noise due to thermal noise can be reduced.

Further, also when two transistors having different channel lengths L or different channel widths W are formed, the manufacturing processes thereof are preferably separate. Thus, according to the present embodiment, a photoelectric conversion device in which the channel length L or the channel width W of the reference transistor 170 is different from those of the input transistor 160 can be manufactured by using a simpler manufacturing process.

As described above, the input transistor 160 is arranged on the first semiconductor substrate 301. The reference transistor 170 is then arranged on the second semiconductor substrate 302. The size of any of the transistors of the first semiconductor substrate 301 is different from the size of any of the transistors of the second semiconductor substrate 302. With such a configuration, the electric characteristics can be improved.

Further, as another aspect of the present embodiment, the size of the input transistor 160 of the first semiconductor substrate 301 is different from the size of the reference transistor 170 of the second semiconductor substrate 302. With such a configuration, the electric characteristics can be improved in the photoelectric conversion device manufactured by a simple manufacturing process.

Fourth Embodiment

The present embodiment is a modified example of the first embodiment to the third embodiment described above. Thus, the features different from those of the first embodiment to the third embodiment will be described.

In the present embodiment, the transistor 200 and the transistor 210 forming the current mirror circuit 13 have different sizes from each other. The transistor 200 and the transistor 210 are illustrated in FIG. 3, FIG. 10, or FIG. 11. Other configurations are the same as any of the first embodiment to the third embodiment.

With the channel length L of the transistor 210 being relatively smaller than the channel length L of the transistor 200, a current flowing in the input transistor 160 can be larger than a current flowing in the reference transistor 170. Thereby, the transconductance gm1 of the input transistor 160 increases. On the other hand, the transconductance gm2 of the reference transistor 170 decreases. As a result, as represented by Equation (1), noise due to thermal noise can be reduced.

As another example, with the channel width W of the transistor 210 being relatively larger than the channel width W of the transistor 200, a current flowing in the input transistor 160 can be larger than a current flowing in the reference transistor 170. Thereby, the transconductance gm1 of the input transistor 160 increases. On the other hand, the transconductance gm2 of the reference transistor 170 decreases. As a result, as represented by Equation (1), noise due to thermal noise can be reduced.

As another example, the film thickness tox of the gate insulating film 104 of the transistor 210 is relatively smaller than the film thickness tox of the gate insulating film 104 of the transistor 200. With such a configuration, a current flowing in the input transistor 160 can be larger than a current flowing in the reference transistor 170. Thereby, the transconductance gm1 of the input transistor 160 increases. On the other hand, the transconductance gm2 of the reference transistor 170 decreases. As a result, as represented by Equation (1), noise due to thermal noise can be reduced.

Further, in obtaining the advantages described above, there is no constrain in the relationship between the size of the input transistor 160 and the size of the reference transistor 170. When the current flowing in the reference transistor 170 decreases, however, 1/f noise of the reference transistor 170 is likely to increase. Accordingly, a configuration in which the channel length L and the channel width W of the reference transistor 170 are larger than the channel length L and the channel width W of the input transistor 160, respectively, may be used. According to such a configuration, the area of the gate electrode of the reference transistor 170 can be increased, and as a result, increase in 1/f noise can be suppressed.

It is desirable that the transistor 200 and the transistor 210 be arranged in the same semiconductor substrate in terms of reduction in variation. When the configuration of the present embodiment is employed as the second embodiment or a modified example of the second embodiment, it is preferable that both the transistor 200 and the transistor 210 be arranged on the second semiconductor substrate 302.

In the present embodiment, the transistor 200 and the transistor 210 have different sizes from each other. Thus, the size of at least one of the transistor 200 and the transistor 210 is different from the size of the input transistor 160. Further, when the transistor 200 and the transistor 210 are arranged on the second semiconductor substrate 302, the size of at least one of the transistor 200 and the transistor 210 is different from the size of the transistor arranged on the first semiconductor substrate 301.

As described above, in the present embodiment, the transistor 200 and the transistor 210 forming the current mirror circuit 13 have different size from each other. According to such a configuration, noise due to thermal noise occurring in the comparator can be reduced.

Fifth Embodiment

The present embodiment is a modified example of the first embodiment to the fourth embodiment described above. Thus, the features different from those of the first embodiment to the fourth embodiment will be described.

Figure 12:
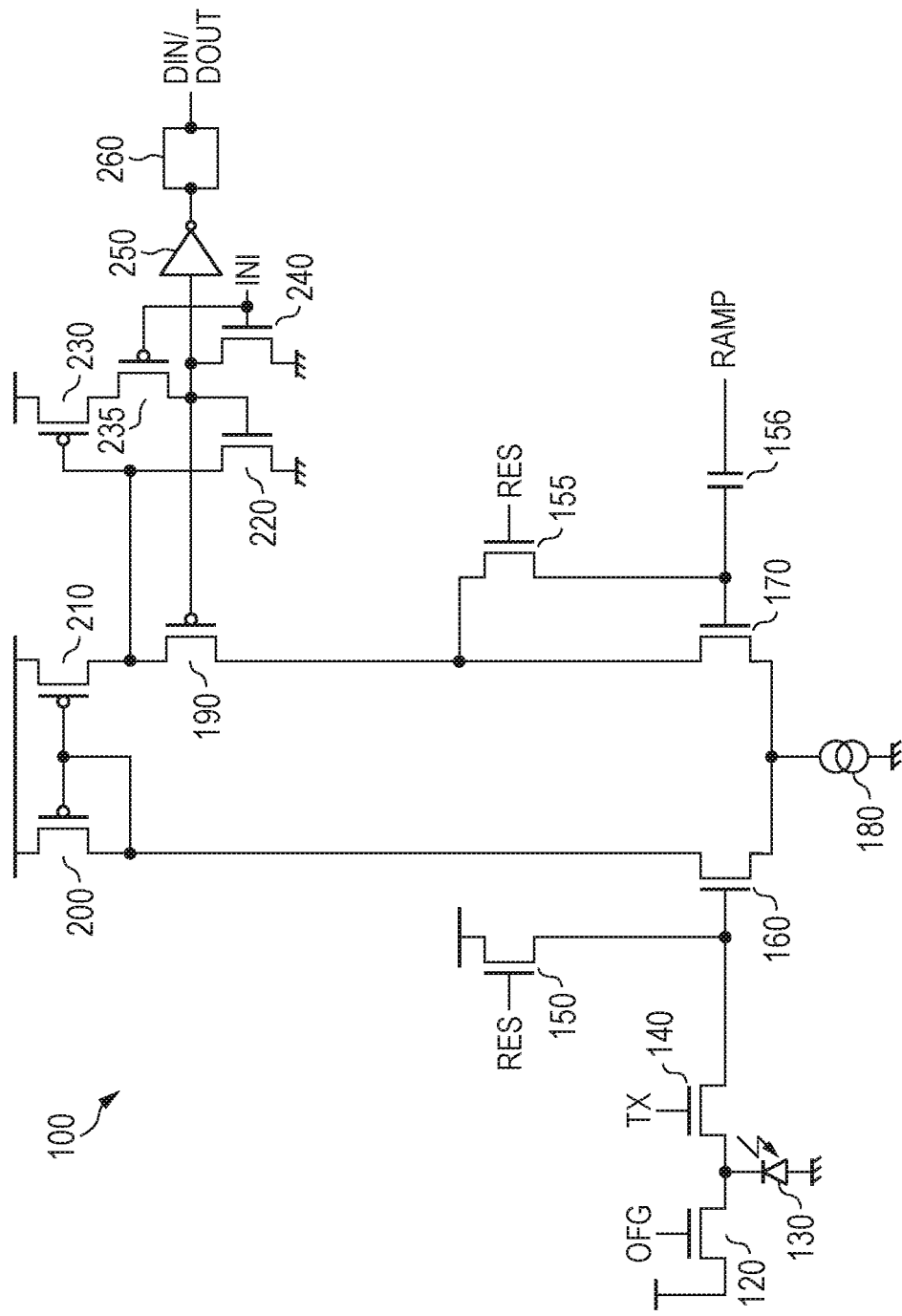
FIG. 12 is a diagram illustrating an equivalent circuit of a pixel of a photoelectric conversion device.

FIG. 12 is a diagram illustrating an equivalent circuit of the pixel 100. In the first embodiment to the fourth embodiment, the transistor 210 of the current mirror circuit 13 is connected to the input transistor 160 of the differential-pair circuit 11 (FIG. 3). In contrast, in the present embodiment, the transistor 200 of the current mirror circuit 13 is connected to the input transistor 160 of the differential-pair circuit 11. Further, in the first embodiment to the fourth embodiment, the transistor 200 of the current mirror circuit 13 is connected to the reference transistor 170 of the differential-pair circuit 11 (FIG. 3). In contrast, in the present embodiment, the transistor 210 of the current mirror circuit 13 is connected to the reference transistor 170 of the differential-pair circuit 11. That is, the node to which a signal based on charges generated by the photoelectric conversion unit 130 is input and the node to which the ramp signal RAMP is input are replaced with each other.

In addition, the reset transistor 150 that resets the potential of the input node of the comparator (the gate of the input transistor 160) is connected to the node to which the reset voltage is supplied. This can reduce variation in the reset voltage at the time of reset. Note that this configuration may be applied to the first embodiment to the fourth embodiment as a modified example of the reset transistor 150.

The ramp signal RAMP is input to the gate of the reference transistor 170 via a clamp capacitor 156. To initialize the potential of the gate of the reference transistor 170, a second reset transistor 155 is arranged. The second reset transistor 155 is connected between the gate and the drain of the reference transistor 170.

Other components of the circuit are the same as those of the first embodiment to the fourth embodiment. Note that, in FIG. 12, the level shifter circuit 250 is illustrated by a circuit symbol of an inverter.

As one aspect of the present embodiment, in the same manner as the first embodiment, the size of the input transistor 160 is different from the size of any of the transistors included in the pixel circuit of the pixel 100 or the readout circuit 110. There are some variations in the combination of two transistors having different sizes, and all the combinations described in the first embodiment may be applied. The specific combination and the advantage obtained in the combination are the same as those in the first embodiment. Thus, the same description as in the first embodiment is applied, and the repeated description will be omitted as appropriate.

Another aspect of the present embodiment is that the size of the transistor arranged on the first semiconductor substrate 301 and the size of the transistor arranged on the second semiconductor substrate 302 are different from each other. As with the second embodiment or the third embodiment, the pixel circuit of the pixel 100 may be divided into and arranged on the first semiconductor substrate 301 and the second semiconductor substrate 302.

For example, the input transistor 160 and the reference transistor 170 are arranged on the first semiconductor substrate 301 (FIG. 10). In this case, it is preferable that the second reset transistor 155 and the clamp capacitor 156 be arranged on the first semiconductor substrate 301. As another example, the input transistor 160 is arranged on the first semiconductor substrate 301, while the reference transistor 170 is arranged on the second semiconductor substrate 302 (FIG. 11). In this case, it is preferable that the second reset transistor 155 and the clamp capacitor 156 be arranged on the second semiconductor substrate 302.

There are some variations in the combination of two transistors having different sizes, and all the combinations described in the second embodiment and the third embodiment may be applied. The specific combination and the advantage obtained in the combination are the same as those in the second embodiment or the third embodiment. Thus, the same description as in the second embodiment and the third embodiment is applied, and the repeated description will be omitted.

In the present embodiment, the size of the transistor refers to any of the film thickness tox of the gate insulating film 104, the channel length L, the channel width W, or the ratio W/L of the channel width W and the channel length L. That is, FIG. 7A to FIG. 9B illustrate two transistors (the transistor A and the transistor B) having different sizes in the present embodiment. Description of the structure illustrated in FIG. 7A to FIG. 9B will be omitted because of being the same as that in the first embodiment.

As described above, the pixel circuit of the pixel 100 includes two transistors having different sizes. According to such a configuration, the electric characteristics can be improved.

Sixth Embodiment

Another embodiment will be described. The present embodiment is different from the first embodiment to the fifth embodiment in that the plurality of pixels 100 share the reference transistor 170. The features different from those of the first embodiment to the fifth embodiment will be mainly described.

General Configuration

Figure 13:
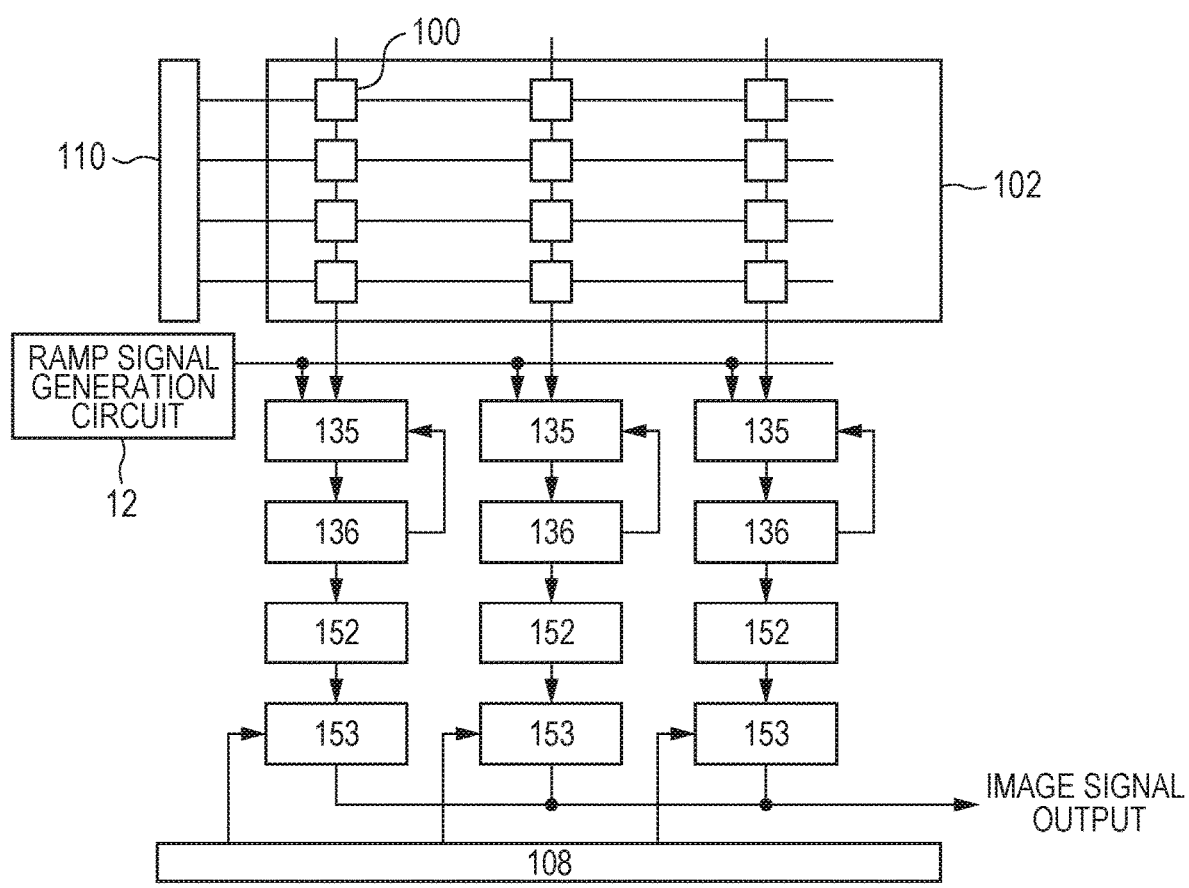
FIG. 13 is a diagram schematically illustrating a configuration of a photoelectric conversion device.

FIG. 13 is a block diagram schematically illustrating the general configuration of the photoelectric conversion device of the present embodiment. A plurality of pixels 100 forms a pixel array. The pixel array includes a plurality of pixel rows and a plurality of pixel columns. The vertical scanning circuit 110 controls the plurality of pixels 100 in order to read out signals from the plurality of pixels 100. The signals from the plurality of pixels 100 are read out on a pixel row basis, for example.

A comparing circuit 135 compares a signal of the pixel 100 with a reference signal. The ramp signal generated by the ramp signal generation circuit 12 is input to the comparing circuit 135 as the reference signal. A control signal based on a result of comparison performed by the comparing circuit 135 is output to the counter circuit 152 via an output circuit 136. A control signal based on the result of comparison controls a count period of the counter circuit 152. The counter circuit 152 outputs a count value corresponding to the timing of receiving the control signal to the memory cell 153. The count value output to the memory cell 153 is held as a digital signal of a result obtained by performing analog-to-digital conversion (hereinafter, referred to as AD conversion) on a signal of the pixel 100. The digital signals held in the memory cell 153 are output sequentially from the photoelectric conversion device by a horizontal scanning circuit 108.

Further, the output circuit 136 outputs a signal based on a signal of the pixel 100 to the comparing circuit 135 as a feedback signal. The comparing circuit 135 can hold the feedback signal.

Pixel Configuration

Figure 14:
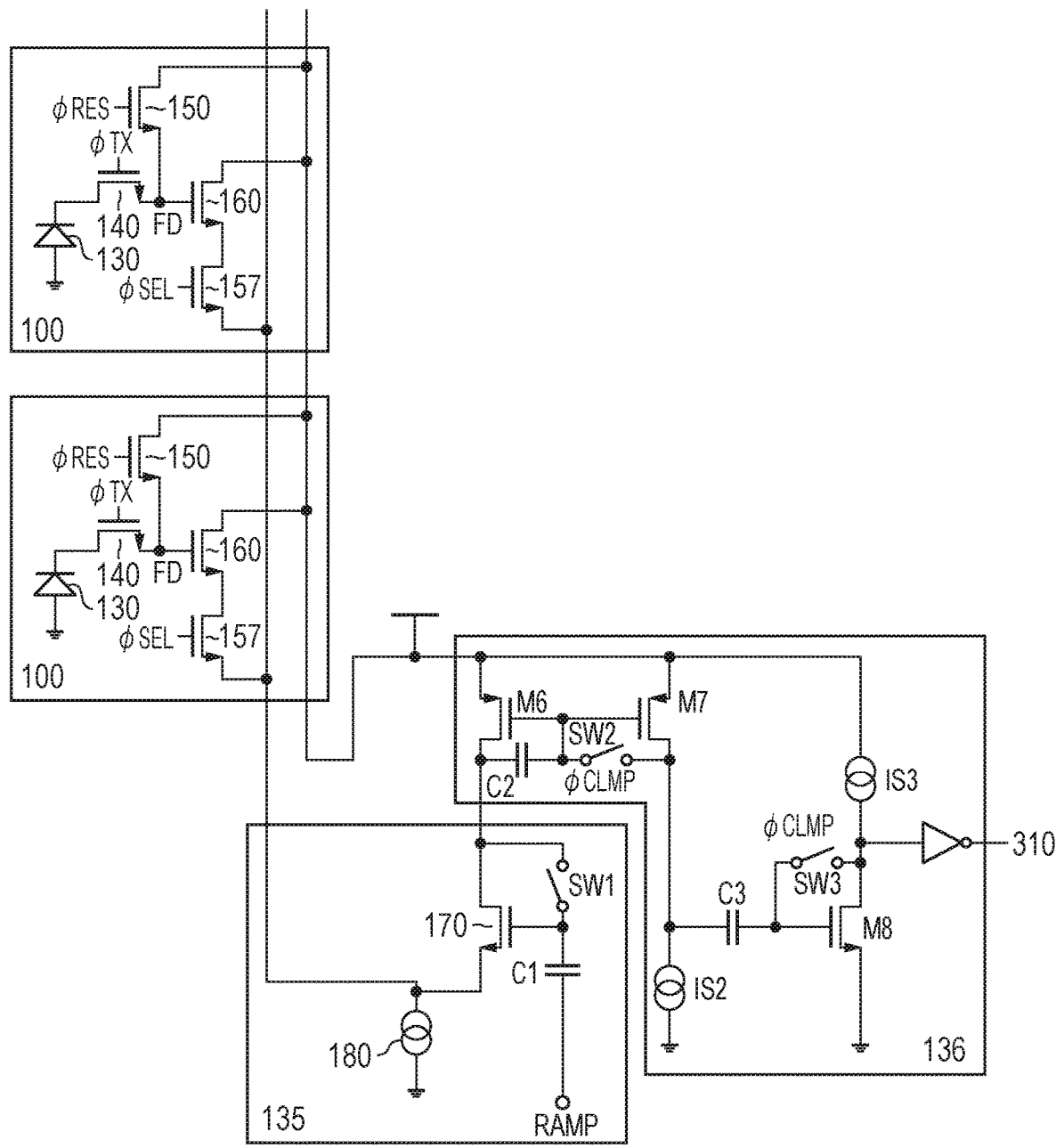
FIG. 14 is a diagram illustrating an equivalent circuit of a photoelectric conversion device.

FIG. 14 illustrates an equivalent circuit of the pixel 100, the comparing circuit 135, and the output circuit 136 of the photoelectric conversion device. For simplified illustration, FIG. 14 illustrates two pixels 100 only.

The pixel 100 includes the photoelectric conversion unit 130, the reset transistor 150, the transfer transistor 140, the input transistor 160, and a selection transistor 157. A control signal ORES is input to the gate of the reset transistor 150, a control signal ϕTX is input to the gate of the transfer transistor 140, and a control signal ϕSEL is input to the gate of the selection transistor 157.

The gate of the input transistor 160 is connected to a floating diffusion node (hereinafter, referred to as an FD node). Charges generated in the photoelectric conversion unit 130 are transferred to the FD node by the transfer transistor 140. That is, a signal based on charges generated in the photoelectric conversion unit 130 is input to the gate of the input transistor 160. The reset transistor 150 resets the gate voltage of the input transistor 160. Note that, since the gate of the input transistor 160 is connected to the FD node, the gate of the input transistor 160 may be referred to as the FD node in the present specification.

Differential Pair (Comparing Circuit)

The comparing circuit 135 includes the reference transistor 170. The ramp signal RAMP is input to the gate of the reference transistor 170. The ramp signal RAMP is a signal whose voltage changes with time, for example. The input transistor 160 and the reference transistor 170 are connected to the current source 180 to form a differential pair. In FIG. 14, as the current source 180, an N-channel MOS transistor in which a predetermined bias voltage is applied to the gate thereof may be used, for example. The input transistor 160 and the reference transistor 170 are of the same conductivity type. In the present embodiment, each of the input transistor 160 and the reference transistor 170 is an N-channel MOS transistor.

The comparing circuit 135 includes a clamp circuit that clamps the gate voltage of the reference transistor 170 at a predetermined voltage. The clamp circuit includes a clamp switch element SW1 and a clamp capacitor element C1, for example. The clamp switch element SW1 is connected to the gate of the reference transistor 170. The clamp switch element SW1 is controlled by a control signal ϕCLMP. When the clamp switch element SW1 is turned off, the gate of the reference transistor 170 is in an electrical floating state. Thereby, the gate voltage of the reference transistor 170 can be clamped at a predetermined voltage. One terminal of the clamp capacitor element C1 is connected to the gate of the reference transistor 170. The ramp signal RAMP is input to the other terminal of the clamp capacitor element C1. According to such a configuration, the alternating current component of the ramp signal RAMP is input to the gate of the reference transistor 170 via the clamp capacitor element C1.

The single comparing circuit 135 illustrated in FIG. 14 is arranged for the plurality of pixels 100 included in a single pixel column (two pixels 100 of FIG. 14). Specifically, the sources of the selection transistors 157 of the plurality of pixels 100 are connected to each other and connected to the current source 180. Further, the drains of the pixel transistors of the plurality of pixels 100 are connected to each other. Further, the single reference transistor 170 forms the differential pair with respective input transistors 160 of the plurality of pixels 100 included in a single pixel column. A photoelectric conversion device used for image capturing, that is, the imaging device has multiple sets of the pixel columns and the comparing circuits 135.

Output Circuit

The output circuit 136 having the output node 310 is electrically connected to the reference transistor 170. The output node 310 is a different node from the source and the drain of the input transistor 160 and the source and the drain of the reference transistor 170.

The output circuit 136 performs a first operation to output a voltage based on the gate voltage of the input transistor 160 to the gate of the reference transistor 170. Further, in response to a current from the reference transistor 170, the output circuit 136 performs a second operation to output a signal based on a result of comparison of the gate voltage of the input transistor 160 with the gate voltage of the reference transistor 170 to the output node 310. In FIG. 14, "feedback signal" represents a voltage based on the gate voltage of the input transistor 160, and "control signal" represents a signal based on a result of comparison.

In the first operation, the output circuit 136 may operate as a current source that supplies a current to the reference transistor 170. At this time, the output circuit 136 is a load of an operational amplifier formed of the differential pair of the input transistor 160 and the reference transistor 170. Therefore, when the gate and the drain of the reference transistor 170 are short-circuited, the output circuit 136 outputs a voltage based on the gate voltage of the input transistor 160 to the gate of the reference transistor 170.

When the clamp switch element SW1 is turned off, the clamp circuit holds the voltage output to the gate of the reference transistor 170. That is, the clamp circuit clamps the gate voltage of the reference transistor 170 at a voltage based on the gate voltage of the input transistor 160. A voltage based on the gate voltage of the input transistor 160 includes a voltage substantially the same as the gate voltage of the input transistor 160, for example. Since there is a difference in characteristics of transistors, a difference of temperature, thermal noise, or the like, both voltages may not be the same voltage in a strict sense.

In the second operation, the output circuit 136 may operate as a current detection circuit that detects a current of the reference transistor 170. The current detection circuit outputs a change in the current of the reference transistor 170 as a separate signal to the output node 310 that is different from the drain of the reference transistor 170. This function allows the output circuit 136 to output a signal based on a result of comparison of the gate voltage of the input transistor 160 and the gate voltage of the reference transistor 170 to the output node 310.

For example, when the gate voltage of the reference transistor 170 is higher than the gate voltage of the input transistor 160, the output circuit 136 outputs a first voltage to the output node 310. On the other hand, when the gate voltage of the reference transistor 170 is lower than the gate voltage of the input transistor 160, the output circuit 136 outputs a second voltage, which is different from the first voltage, to the output node 310.

In the description above, a parasitic resistance of a wiring connected to the current source 180 is ignored. The parasitic resistance of a wiring may cause offset of an operational amplifier formed of the differential pair of the input transistor 160 and the reference transistor 170.

Control Unit (Voltage Change Reduction Unit)

The output circuit 136 includes a control unit that reduces the change amount of the drain voltage of the reference transistor 170 in the second operation described above to be smaller than the change amount of the voltage of the output node 310. In particular, the control unit reduces the change amount of the drain voltage of the reference transistor 170 at the time of inversion of the level relationship between the level of the gate voltage of the input transistor 160 and the level of the gate voltage of the reference transistor 170 to be smaller than the change amount of the voltage of the output node 310. The change amount of the voltage of the output node 310 at this time is the difference between the first voltage and the second voltage described above.

The control unit may include a current mirror circuit. The current mirror circuit includes at least two transistors whose gates are connected to each other. The drain of one of the two transistors is electrically connected to the reference transistor 170.

Further, the control unit may include a switch element that connects the gate and the drain of the other of the two transistors. The first operation and the second operation described above are switched by the switch element.

Current Mirror Circuit

The control unit of the output circuit 136 includes a current mirror circuit including a P-channel MOS transistor M6 and a P-channel MOS transistor M7. The drain of the transistor M6 is electrically connected to the drain of the reference transistor 170. The gate of the transistor M6 and the gate of the transistor M7 are connected to each other.

When the output circuit 136 performs the first operation, the current mirror circuit formed by the transistors M6 and M7 mirrors the current of the transistor M7 to the transistor M6. Further, when the output circuit 136 performs the second operation, the current mirror circuit mirrors the current of the transistor M6 to the transistor M7.

In the present embodiment, in the first operation, the current mirror circuit operates as a current source that supplies a current from the transistor M6 to the reference transistor 170. Then, in the second operation, the current mirror circuit operates as a current detection circuit that mirrors, to the transistor M7, a current input from the reference transistor 170 to the transistor M6.

The control unit of the output circuit 136 includes a capacitor element C2. The capacitor element C2 has a first terminal electrically connected to the drain of the transistor M6 and a second terminal electrically connected to the gate of the transistor M6. The drain and the gate of the transistor M6 are AC-coupled by the capacitor element C2, and the current of the transistor M6 can be mirrored to the transistor M7.

The control unit of the output circuit 136 includes a first switch element SW2. The first switch element SW2 connects the gate and the drain of the transistor M7 to each other. When the first switch element SW2 is turned on, the current mirror circuit can mirror the current of the transistor M7 to the transistor M6. When the first switch element SW2 is turned off, the current mirror circuit can mirror the current of the transistor M6 to the transistor M7. That is, the first switch element SW2 switches the operation of the output circuit 136 between the first operation and the second operation.

Note that the capacitance of the capacitor element C2 is larger than the capacitance of a coupling capacitance between both the ends of the first switch element SW2 when the first switch element SW2 is turned off. When the first switch element SW2 is a MOS transistor, both the ends of the first switch element SW2 correspond to the source and the drain of the MOS transistor. According to such a configuration, the operation of the current mirror circuit can be stabilized.

It is preferable that the clamp switch element SW1 and the first switch element SW2 operate in in-phase with each other. In the present embodiment, the clamp switch element SW1 and the first switch element SW2 are controlled by a common control signal ϕCLMP, and thereby the clamp switch element SW1 and the first switch element SW2 operate in in-phase with each other.

The output circuit 136 of the present embodiment has a reference current source IS2 connected to the output node 310. The reference current source IS2 outputs a reference current to the transistor M7. Further, an inverter circuit is connected to the output node 310.

Operation

Figure 15:
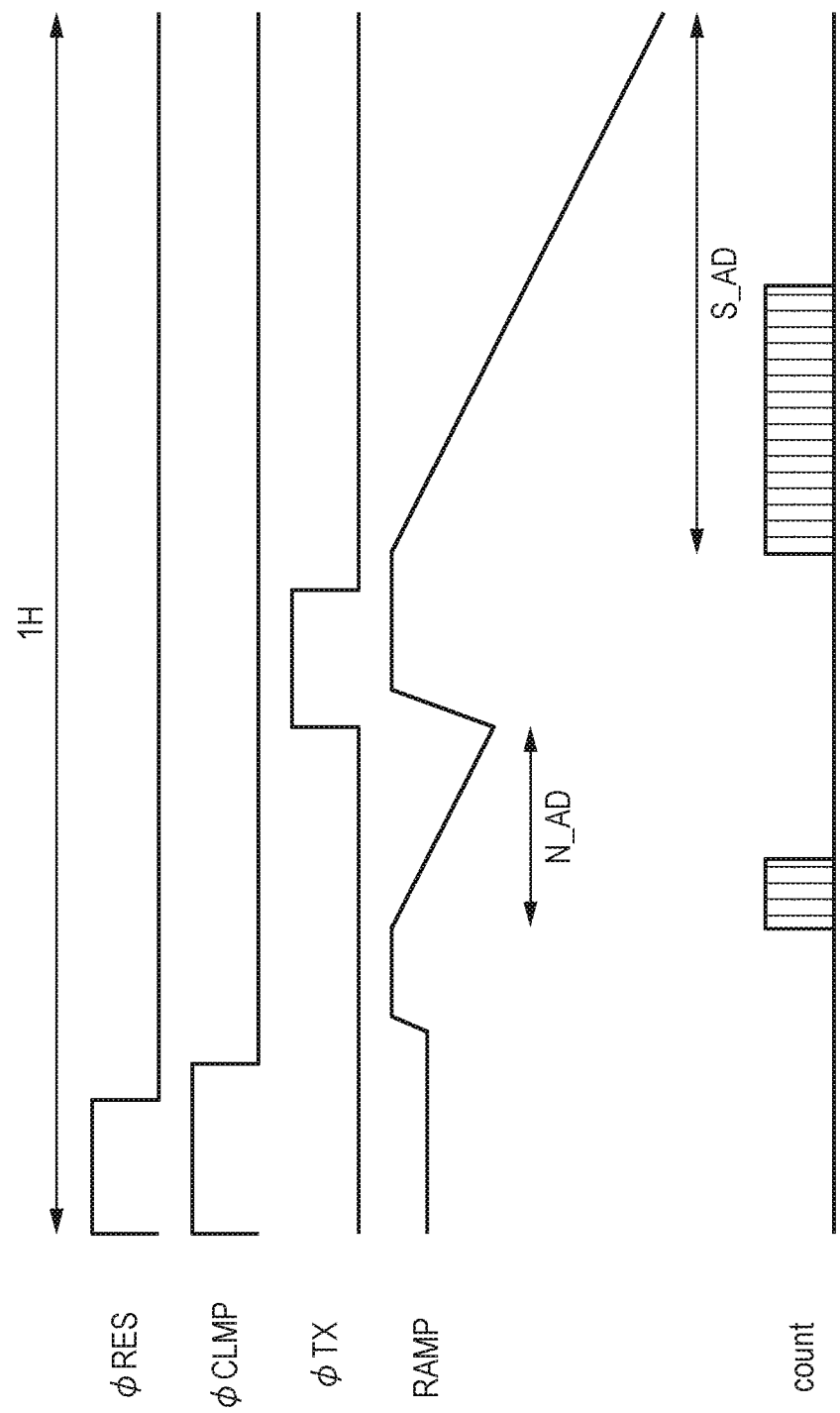
FIG. 15 is a timing chart diagram illustrating an operation of the photoelectric conversion device.

The photoelectric conversion device of the present embodiment is driven by drive signals illustrated in FIG. 15. FIG. 15 is a diagram schematically illustrating a timing chart of drive signals of the photoelectric conversion device. FIG. 15 illustrates drive signals in one horizontal scan period (1H period), that is, drive signals used for reading a signal of one pixel row. When a drive signal is at a high level, a transistor supplied with the drive signal is in an on-state. When a drive signal is at a low level, a transistor supplied with the drive signal is in an off-state. Specific voltages for the high level and the low level are determined in accordance with the conductivity type of the transistor.

In the present embodiment, when the control signal ϕCLMP is at a high level, the output circuit 136 operates as a current source. When the control signal ϕCLMP is at a low level, the output circuit 136 operates as a current detection circuit.

First, the control signal ϕRES and the control signal ϕCLMP are set to a high level. Thereby, the reset transistor 150 and the clamp switch element SW1 are in conductive state, that is, turned on. The voltage of the FD node is reset to a predetermined voltage such as a power source voltage VDD (hereinafter, referred to as a reset level). At the same time, the output circuit 136 outputs a voltage based on the voltage of the FD node (hereinafter, referred to as a clamp level) to the gate of the reference transistor 170 and the clamp capacitor element C1. That is, the output circuit 136 performs the first operation to output a voltage based on the gate voltage of the input transistor 160 to the gate of the reference transistor 170.

In a period in which the control signal ϕCLMP is at a high level, the clamp switch element SW1 and the first switch element SW2 are in an on-state. The reference current from the reference current source IS2 is output to the reference transistor 170 by a current mirror formed of the transistors M6 and M7. That is, the transistor M6 operates as a current source that supplies a current to the reference transistor 170.

The clamp switch element SW1 connects the gate and the drain of the reference transistor 170 to each other. Thus, the input transistor 160, the reference transistor 170, and the current source 180 have a load of a current source with the transistor M6 and operates as a voltage follower. Thereby, the voltage of the FD node is output to the gate of the reference transistor 170 and the clamp capacitor element C1. In other words, the output circuit 136 performs the first operation to output a voltage based on the gate voltage of the input transistor 160 to the gate of the reference transistor 170.

The control signal ϕRES and the control signal ϕCLMP are then sequentially changed to the low level. Thereby, the reset level of the FD node is held, and the clamp level is held in the clamp capacitor element C1. When the reset transistor 150 is turned off prior to the clamp switch element SW1, thermal noise generated by the reset transistor 150 is reflected to the clamp level. Immediately after the clamp switch element SW1 is turned off, the voltage of the FD node, that is, the gate voltage of the input transistor 160 and the gate voltage of the reference transistor 170 are substantially the same.

Subsequently, the ramp signal RAMP is changed to a higher voltage. Thereby, the gate voltage of the reference transistor 170 becomes higher than the gate voltage of the input transistor 160. Since the input transistor 160 and the reference transistor 170 form the differential pair, most part of the current of the current source 180 flows in the reference transistor 170.

Next, the ramp down of the ramp signal RAMP is started. Ramp down refers to reduction of the voltage of the ramp signal RAMP. At a certain timing, the relationship between the level of the gate voltage of the input transistor 160 and the level of the gate voltage of the reference transistor 170 is inverted. After the inversion of the relationship, most part of the current of the current source 180 flows the input transistor 160. On the other hand, the current of the reference transistor 170 decreases.

The output circuit 136 detects a change of the current of the reference transistor 170. Specifically, at a timing when the current of the reference transistor 170 decreases, the output circuit 136 outputs a signal indicating the occurrence of the change of current to the output node 310 as a control signal. In other words, the output circuit 136 performs the second operation to output a signal based on a result of comparison of the gate voltage of the input transistor 160 with the gate voltage of the reference transistor 170 to the output node 310.

When the control signal ϕCLMP becomes a low level, the clamp switch element SW1 and the first switch element SW2 are turned off. Subsequently, the output circuit 136 performs the second operation to compare the gate voltage of the input transistor 160 with the gate voltage of the reference transistor 170.

As described above, the gate and the drain of the transistor M6 are AC-coupled by the capacitor element C2. Thus, the current flowing in the reference transistor 170 is mirrored from the transistor M6 to the transistor M7. The voltage of the output node 310 changes in accordance with the relationship between the level of the mirrored current and the level of the reference current from the reference current source IS2. That is, a signal based on a result of comparison is output to the output node 310.

In the photoelectric conversion device of FIG. 14, the counter circuit 152 is controlled by a control signal, and thereby a period from the start of ramp down to the inversion of the relationship of the voltage levels is measured. After a predetermined period has elapsed from the start of ramp down, the AD conversion of the reset level ends. The period during which the AD conversion of the reset level is performed is denoted as N_AD in FIG. 15.

The ramp signal RAMP is then reset. When the control signal ϕTX is set to a high level, the transfer transistor 140 is turned on, and charges generated by the photoelectric conversion unit 130 are transferred to the FD node.

After the control signal ϕTX is changed to a low level, ramp down of the ramp signal RAMP starts. Then, in the same manner as AD conversion of the reset level, AD conversion of the optical signal level is performed. The period during which the AD conversion of the optical signal level is performed is denoted as S_AD in FIG. 15.

Although detailed description will be omitted, in the photoelectric conversion device, digital correlated double sampling (CDS) to subtract a code value resulted from AD conversion of the reset level from a code value resulted from AD conversion of the optical signal level may be performed.

Numeric examples of respective parts will now be described. For example, the sizes of the transistors M6 and M7 forming the current mirror circuit are substantially the same. Further, the current amount I_IS1 of the current source 180 and the current amount I_IS2 of the reference current source IS2 substantially satisfy I_IS1=2×I_IS2.

In this condition, in the first operation, an amount of current that is substantially half the current amount I_IS1 of the current source 180, that is, an amount of current that is substantially the same as the current amount I_IS2 flows in each of the input transistor 160 and the reference transistor 170. In the second operation, when the gate voltage of the reference transistor 170 is higher than the gate voltage of the input transistor 160, most part of the current of the current source 180 flows in the reference transistor 170. On the other hand, the current of the input transistor 160 is substantially zero. Thus, the transistor M7 is supplied with substantially the same amount of current as the current source 180. As a result, the drain of the transistor M7, that is, the voltage of the output node 310 becomes a voltage close to the power source voltage VDD.

When the reference signal ramps down, the gate voltage of the reference transistor 170 is lower than the gate voltage of the input transistor 160. At this time, most part of the current of the current source 180 flows in the input transistor 160. On the other hand, the current of the reference transistor 170 becomes substantially zero. Therefore, the current of the transistor M7 is also zero. As a result, the drain of the transistor M7, that is, the voltage of the output node 310 becomes a voltage close to the ground voltage.

As discussed above, the output circuit 136 detects a change of the current of the reference transistor 170. At this time, the transistor M6 is the input of the current mirror circuit. Even when the drain current of the reference transistor 170 changes, the drain voltage of the transistor M6 does not change significantly. In other words, the current mirror circuit reduces the change amount of the drain voltage of the reference transistor 170 to be smaller than the change amount of the voltage of the output node. Thus, the voltage change of the ramp signal RAMP can be reduced. As a result, according to the present embodiment, the accuracy of a signal output by the photoelectric conversion device can be improved.

As a comparative example, in the photoelectric conversion device disclosed in International Publication No. WO2016/009832, the PMOS transistor 203 operates as a constant current source even after the clamp operation ends. The drain voltage of the differential transistor 201 is then read out as the output. Thus, when the relationship of the voltages is inverted, the drain voltage of the differential transistor 201 significantly changes. This voltage change causes the voltage of the reference signal to change, which may result in reduction in image quality.

Transistor Size

In the present embodiment, the pixel circuit of the pixel 100 includes the input transistor 160. The input transistor 160 receives a signal based on signal charges generated in the photoelectric conversion unit 130 and forms a differential pair with the reference transistor 170. The pixel circuit of the pixel 100 further includes another transistor from the input transistor 160.

The readout circuit of the present embodiment includes the ramp signal generation circuit 12, the comparing circuit 135, the output circuit 136, the counter circuit 152, the memory cell 153, the vertical scanning circuit 110, and the horizontal scanning circuit 108. These circuits include one or more transistors, respectively.

In this example, the size of the input transistor 160 is different from the size of any of the transistors included in the pixel circuit of the pixel 100 or the readout circuit. The size of the transistor refers to any one of the film thickness tox of the gate insulating film 104, the channel length L, the channel width W, or the ratio W/L of the channel width W and the channel length L. Hereinafter, for the purpose of illustration, two transistors having different sizes from each other are referred to as a transistor A and a transistor B.

FIG. 7A and FIG. 7B illustrate an example in which the channel length L and the channel width W are different between the transistor A and the transistor B, respectively, in the present embodiment. On the other hand, the W/L and the film thickness tox the gate insulating film 104 of the transistor A are the same as those of the transistor B. As illustrated in FIG. 7B, the channel length L and the channel width W of the transistor A are larger than the channel length L and the channel width W of the transistor B, respectively. That is, the size of the transistor A is larger than the size of the transistor B. Since description for FIG. 7A and FIG. 7B is the same as that of the first embodiment, repeated description will be omitted.

There are some variations in the combination of two transistors having different sizes. In one example, the transistor A is used as the reference transistor 170, and the transistor B is used as the input transistor 160. That is, the channel length L and the channel width W of the reference transistor 170 are larger than the channel length L and the channel width W of the input transistor 160, respectively. Such a configuration can improve the S/N ratio. Since this advantage is the same as that of the first embodiment, repeated description will be omitted.

Note that, when only the channel length L of the reference transistor 170 is larger than the channel length L of the input transistor 160, the same advantage is also obtained. Further, when only the channel width W of the reference transistor 170 is larger than the channel width W of the input transistor 160, the same advantage is also obtained. Unless otherwise specified, the same applies to the examples described later.

Further, the configuration in which the channel length L of the reference transistor 170 is longer than the channel length L of the input transistor 160 can reduce current noise due to thermal noise. This advantage is the same as that of the first embodiment.

Since the channel length L of the input transistor 160 is short, the transconductance gm1 of the input transistor 160 can be increased. On the other hand, since the channel length L of the reference transistor 170 is long, the transconductance gm2 of the reference transistor 170 can be decreased. As a result, noise due to thermal noise can be reduced in accordance with Equation (1). Note that, in this example, the channel widths W of two transistors may have any relationship.

As a modified example, with the channel width W of the input transistor 160 being larger than the channel width W of the reference transistor 170, current noise due to thermal noise can be reduced. This advantage is the same as that in the first embodiment.

In this example, the channel lengths L of two transistors may have any relationship. In terms of improvement of the charge-to-voltage conversion coefficient, it is preferable that the channel length L of the input transistor 160 be shorter than the channel length L of the reference transistor 170, while the channel width W of the input transistor 160 be larger than the channel width W of the reference transistor 170. With the channel length L of the input transistor 160 being short, the charge-to-voltage conversion coefficient can be increased. As a result, it is possible to increase the signal level by using the relationship of the channel length L and reduce noise by using the relationship of the channel width W.

Also when the size of the input transistor 160 and the size of the reference transistor 170 are different from each other, offset cancelation is possible. When the reset transistor 150 is turned on to reset the potential of the input node of the comparator (the gate of the input transistor 160), the ramp signal RAMP is reset to a predetermined reset potential Vr. The potential of the gate of the input transistor 160 at this time is expressed by Vr−Vgs(170)+Vgs(160). At this time, the threshold voltage Vth of the input transistor 160 and the threshold voltage Vth of the reference transistor 170 are reflected to Vgs(170) and Vgs(160), respectively. Thus, offset cancelation can be performed. In other words, even when the threshold voltages Vth of the input transistor 160 and the reference transistor 170 are different for respective pixels 100, the output of the comparator is inverted when the level of the ramp signal VRMP becomes the reset potential Vr in all the pixels 100.

As described above, with the size of the input transistor 160 and the size of the reference transistor 170 being different from each other, the electrical characteristics can be improved.

In another example, the transistor A is used as the reset transistor 150, and the transistor B is used as the input transistor 160. That is, the channel length L and the channel width W of the reset transistor 150 are larger than the channel length L and the channel width W of the input transistor 160, respectively.

As previously described, with the size of the gate of the input transistor 160 being small, the charge-to-voltage conversion coefficient can be increased. Further, with the size of the reset transistor 150 being large, the variation of the threshold voltage Vth of the reset transistor 150 can be reduced. As a result, the variation in the voltage at the time of reset can be reduced.

In another example, the transistor A is used as the input transistor 160, and the transistor B is used as a transistor of the counter circuit 152 or the memory cell 153. That is, the channel length L and the channel width W of the input transistor 160 are larger than the channel length L and the channel width W of the transistor of the counter circuit 152 or the memory cell 153, respectively.

It is preferable that transistors used in an analog circuit such as the differential-pair circuit 11 have a large transconductance gm. Thus, the size of the input transistor 160 is increased. On the other hand, in a digital circuit such as the counter circuit 152 and the memory cell 153, it is preferable to reduce the size of the transistor for faster operation. That is, with the size of the input transistor 160 being larger than the size of the transistor of the counter circuit 152 or the memory cell 153, it is possible to perform a faster operation while reducing noise as a result.

In another example, the transistor A is used as the input transistor 160, and the transistor B is used as a transistor of the vertical scanning circuit 110 or the horizontal scanning circuit 108. That is, the channel length L and the channel width W of the input transistor 160 are larger than the channel length L and the channel width W of the transistor of the vertical scanning circuit 110 or the horizontal scanning circuit 108, respectively.

Typically, the vertical scanning circuit 110 and the horizontal scanning circuit 108 are each formed of logic circuits such as a logic gate or a flip-flop. Thus, it is preferable to reduce the size of the transistor for faster operation. In the same manner as the previous example, with the size of the input transistor 160 being larger than the size of the transistor of the memory circuit 260, it is possible to perform a faster operation while reducing noise as a result.

Next, an example in which the transistor A and the transistor B have the gate insulating films 104 having different film thickness tox from each other will be described. As illustrated in FIG. 8A, the film thickness tox of the gate insulating film 104 of the transistor A is larger than the film thickness tox of the gate insulating film 104 of the transistor B. On the other hand, as illustrated in FIG. 8B, the channel length L and the channel width W of the transistor A are the same as the channel length L and the channel width W of the transistor B, respectively. Since description for FIG. 8A and FIG. 8B is the same as that for the first embodiment, repeated description will be omitted.

There are some variations in the combination of two transistors having the gate insulating films 104 of different film thicknesses tox. In one example, the transistor A is used as the reference transistor 170, and the transistor B is used as the input transistor 160. That is, the film thickness tox of the gate insulating film 104 of the reference transistor 170 is larger than the film thickness tox of the gate insulating film 104 of the input transistor 160. Such a configuration can reduce noise due to thermal noise.

As represented by Equation (1) described above, when the transconductance gm1 of the input transistor 160 increases, the voltage noise Vn decreases. On the other hand, when the transconductance gm2 of the reference transistor 170 decreases, the voltage noise Vn decreases. Further, as represented by Equation (2), the smaller the film thickness tox of the gate insulating film 104 is, the larger the transconductance gm is.

In this example, since the film thickness tox of the gate insulating film 104 of the input transistor 160 is short, the transconductance gm1 of the input transistor 160 can be increased. On the other hand, since the film thickness tox of the gate insulating film 104 of the reference transistor 170 is long, the transconductance gm2 of the reference transistor 170 can be decreased. As a result, noise due to thermal noise can be reduced.

Note that, to further reduce the noise, it is preferable that the channel length L of the input transistor 160 be shorter than the channel length L of the reference transistor 170 and that the channel width W of the input transistor 160 be larger than the channel width W of the reference transistor 170.

In another example, the transistor A is used as the input transistor 160, and the transistor B is used as a transistor of the counter circuit 152 or the memory cell 153. That is, the film thickness tox of the gate insulating film 104 of the input transistor 160 is larger than the film thickness tox of the gate insulating film 104 of the transistor of the counter circuit 152 or the memory cell 153.

Transistors used in an analog circuit such as the differential-pair circuit 11 are supplied with a relatively high power source voltage. Thus, it is preferable to increase the film thickness tox of the gate insulating film 104 of the input transistor 160 so that a high withstand voltage can be obtained. On the other hand, a digital circuit such as the counter circuit 152 and the memory cell 153 often operates relatively faster than an analog circuit. Further, a digital circuit is typically supplied with a power source voltage lower than the power source voltage of an analog circuit. Thus, it is preferable to reduce the film thickness tox of the gate insulating film 104 for a faster operation of a transistor. That is, with the film thickness tox of the gate insulating film 104 of the input transistor 160 being larger than the film thickness tox of the gate insulating film 104 of the transistor of the counter circuit 152 or the memory cell 153, it is possible to perform a faster operation while improving reliability.

In another example, the transistor A is used as the input transistor 106, and the transistor B is used as a transistor of the vertical scanning circuit 110 or the horizontal scanning circuit 108. That is, the the film thickness tox of the gate insulating film 104 of the input transistor 160 is larger than the film thickness tox of the gate insulating film 104 of the transistor of the vertical scanning circuit 110 or the horizontal scanning circuit 108.

The vertical scanning circuit 110 and the horizontal scanning circuit 108 each are typically formed of logic circuits such as a logic gate or a flip-flop. Thus, it is preferable to reduce the size of the transistor for a faster operation. With the film thickness tox of the gate insulating film 104 of the input transistor 160 being larger than the film thickness tox of the gate insulating film 104 of the transistor of the vertical scanning circuit 110 or the horizontal scanning circuit 108, it is possible to perform a faster operation while improving reliability.

Next, yet another modified example will be described. As illustrated in FIG. 9A, the film thickness tox of the gate insulating film 104 of the transistor A is larger than the film thickness tox of the gate insulating film 104 of the transistor B. Further, as illustrated in FIG. 9B, the channel length L and the channel width W of the transistor A are larger than the channel length L and the channel width W of the transistor B, respectively.

In the same manner as the example of FIG. 7A and FIG. 7B and the example of FIG. 8A and FIG. 8B, one of the transistor A and the transistor B is applied to the input transistor 160, the other of the transistor A and the transistor B is applied to another transistor, and thereby the advantage of improvement of electric characteristics can be obtained.

For example, the transistor A is used as the reference transistor 170, and the transistor B is used as the input transistor 160. That is, the channel length L and the channel width W of the reference transistor 170 are larger than the channel length L and the channel width W of the input transistor 160, respectively. Furthermore, the film thickness tox of the gate insulating film 104 of the reference transistor 170 is larger than the film thickness tox of the gate insulating film 104 of the input transistor 160.

According to such a configuration, first of all, the charge-to-voltage conversion coefficient of the input node of the comparator (the gate of the input transistor 160) can be increased. Furthermore, 1/f noise can be reduced in the reference transistor 170. In addition, noise due to thermal noise caused by the differential pair can be reduced.

Note that, in FIG. 9A and FIG. 9B, the size of the transistor A is larger than the size of the transistor B for each aspect of the film thickness tox of the gate insulating film 104, the channel length L, and the channel width W. However, the size relationship may be opposite for some of the aspects.

To optimize the transconductance gm, it is preferable that the film thickness tox of the gate insulating film 104 of the reference transistor 170 be larger than the film thickness tox of the gate insulating film 104 of the input transistor 160. Further, it is preferable that the channel length of the reference transistor 170 be larger than the channel length L of the input transistor 160. On the other hand, it is preferable that the channel width W of the reference transistor 170 be smaller than the channel width W of the input transistor 160.

As described above, the pixel 100 includes the input transistor 160 that receives a signal based on signal charges generated by the photoelectric conversion unit 130 and forms a differential pair with the reference transistor 170. Further, the size of the input transistor 160 is different from the size of any other transistors in the pixel circuit or the transistor of the readout circuit. With such a configuration, the electric characteristics can be improved.

With the channel width W being large, it is possible to obtain advantages of reduction of 1/f noise, reduction of variation of a threshold voltage, reduction of noise due to thermal noise when used as the input transistor 160 (increase in transconductance gm), or the like.

On the other hand, with the channel width W being small, it is possible to obtain advantages of a fast operation, an improved charge-to-voltage conversion coefficient when used as the input transistor 160, reduction of noise when used as the reference transistor 170 (decrease in transconductance gm), or the like.

With the channel length L being large, it is possible to obtain advantages of reduction of 1/f noise, reduction of variation of a threshold voltage, reduction of noise when used as the reference transistor 170 (decrease in transconductance gm), or the like.

On the other hand, with the channel length L being small, it is possible to obtain advantages of a fast operation, an improved charge-to-voltage conversion coefficient when used as the input transistor 160, reduction of noise due to thermal noise (increase in transconductance gm), and the like.

With the film thickness tox of the gate insulating film 104 being large, it is possible to obtain advantages of an improved withstand voltage, reduction of noise when used as the reference transistor 170 (decrease in transconductance gm), or the like.

On the other hand, with the film thickness tox of the gate insulating film 104 being small, it is possible to obtain advantages of a fast operation, reduction of noise due to thermal noise when used as the input transistor 160 (increase in transconductance gm), or the like.

Other than the examples of the combination described above, any combination of transistors having different sizes may be selected to obtain these advantages.

First Modified Example

A modified example of the present embodiment will be described. The circuit illustrated in FIG. 14 is arranged on a single semiconductor substrate. As a modified example, the circuit of the present embodiment is divided into and arranged on the first semiconductor substrate 301 and the second semiconductor substrate 302. FIG. 15 illustrates an equivalent circuit of the modified example.

The pixels 100 are arranged on the first semiconductor substrate 301. Specifically, the photoelectric conversion unit 130, the transfer transistor 140, the reset transistor 150, and the input transistor 160 are arranged on the first semiconductor substrate 301.

On the other hand, the comparing circuit 135 including the reference transistor 170, the current source 180, and the clamp circuit (the clamp capacitor element C1 and the clamp switch element SW1) is arranged on the second semiconductor substrate 302. Further, the output circuit 136 is arranged on the second semiconductor substrate 302.

Figure 16:
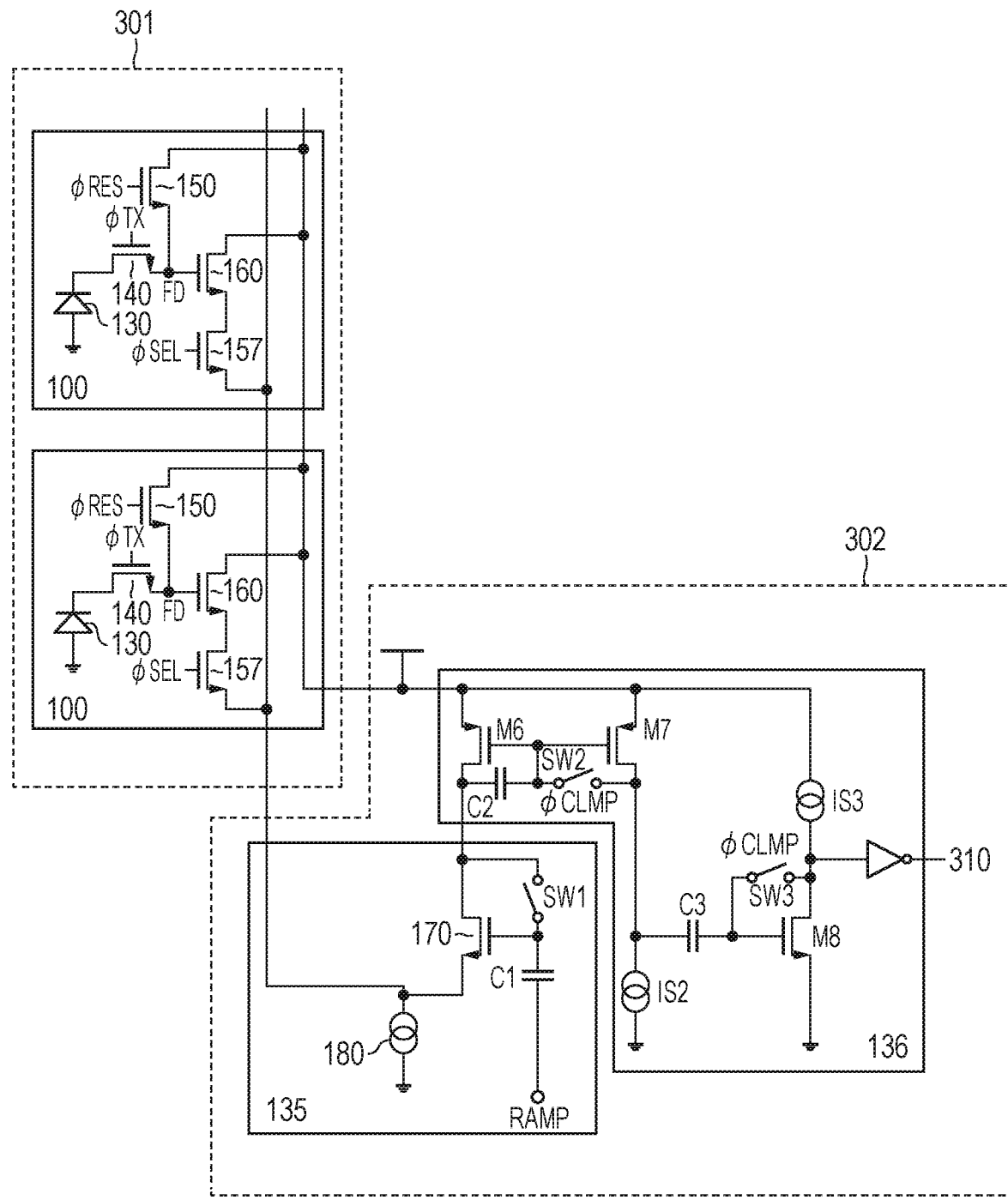
FIG. 16 is a diagram illustrating an equivalent circuit of a photoelectric conversion device.

That is, in the example illustrated in FIG. 16, the input transistor 160 and the reference transistor 170 forming the differential pair are arranged on different semiconductor substrates in the same manner as in the third embodiment.

The vertical scanning circuit 110 used for driving the pixels 100 is arranged on the first semiconductor substrate 301. On the other hand, the ramp signal generation circuit 12, the counter circuit 152, the memory cell 153, and the horizontal scanning circuit 108 are arranged on the second semiconductor substrate 302. Note that the vertical scanning circuit 110 may be arranged on the second semiconductor substrate 302, and only the pixels 100 may be arranged on the first semiconductor substrate 301.

The feature that the size of the transistor on the first semiconductor substrate 301 is different from the size of the transistor on the second semiconductor substrate 302 is the same as that of the second embodiment and the third embodiment. All the combinations described in the second embodiment and the third embodiment may be applied to the present embodiment.

In particular, in the example of FIG. 16, the size of the input transistor 160 on the first semiconductor substrate 301 is different from the size of the reference transistor 170 on the second semiconductor substrate 302. With such a configuration, the electric characteristics can be improved in the photoelectric conversion device manufactured by a simple manufacturing process.

Further, the size of the transistor of the pixel 100 (for example, the input transistor 160) and the size of the transistor of the output circuit 136 may be different from each other.

Second Modified Example

Figure 17:
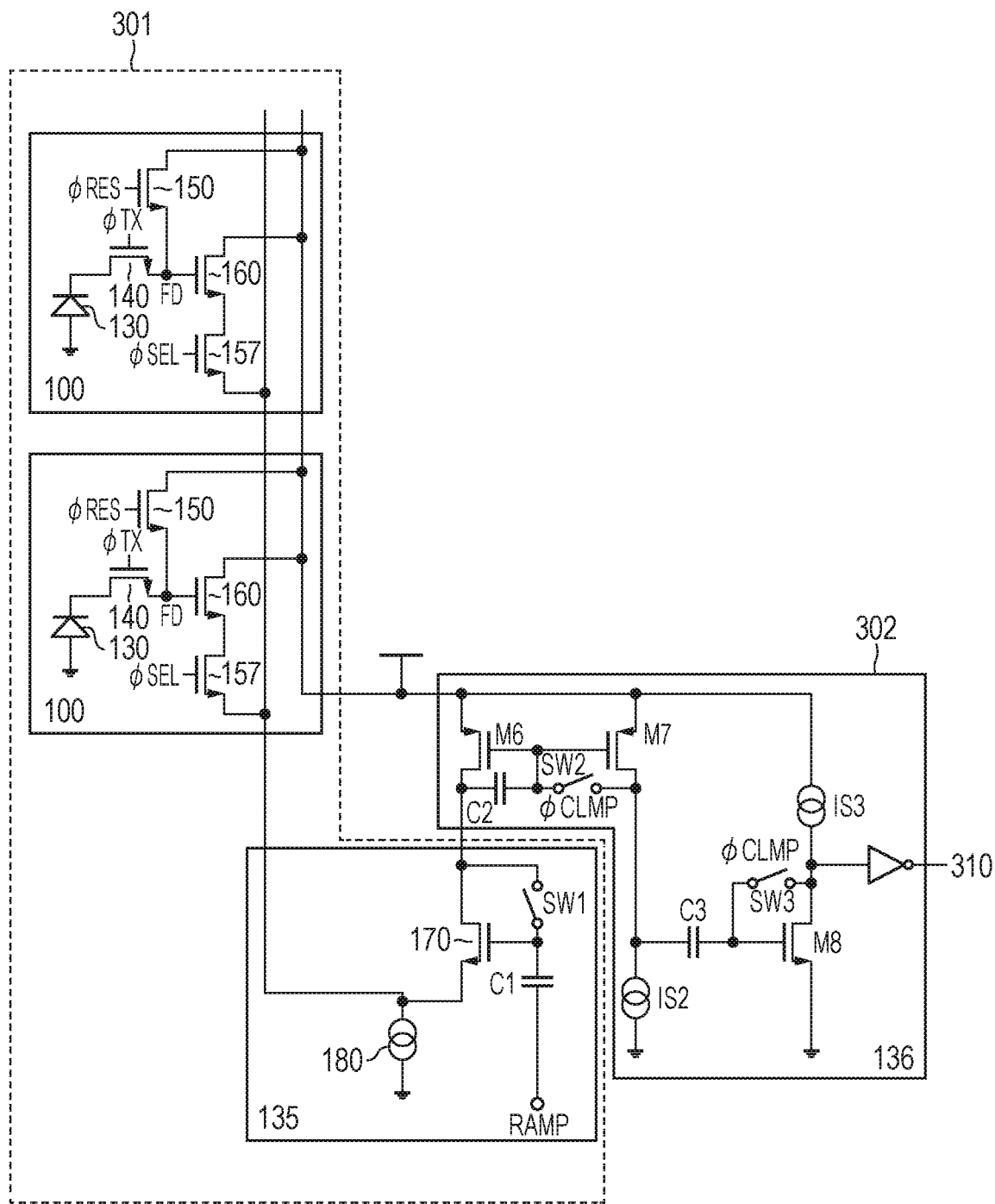
FIG. 17 is a diagram illustrating an equivalent circuit of a photoelectric conversion device.

Yet another modified example of the present embodiment will be described. FIG. 17 illustrates an equivalent circuit of the modified example. The circuit of the present embodiment is divided into and arranged on the first semiconductor substrate 301 and the second semiconductor substrate 302. The example of FIG. 17 is different from the example of FIG. 16 in that the comparing circuit 135 including the reference transistor 170, the current source 180, and the clamp circuit (the clamp capacitor element C1 and the clamp switch element SW1) is arranged on the first semiconductor substrate 301. Accordingly, the ramp signal generation circuit 12 may be arranged on the first semiconductor substrate 301.

Also in this modified example, the feature that the size of the transistor on the first semiconductor substrate 301 is different from the size of the transistor on the second semiconductor substrate 302 is the same as that of the second embodiment and the third embodiment. All the combinations described in the second embodiment and the third embodiment may be applied to the present embodiment.

Seventh Embodiment

Another embodiment will be described. The present embodiment is different from the first embodiment to the sixth embodiment in that the pixel 100 includes an amplifier circuit using an operational amplifier 159.

Figure 18:
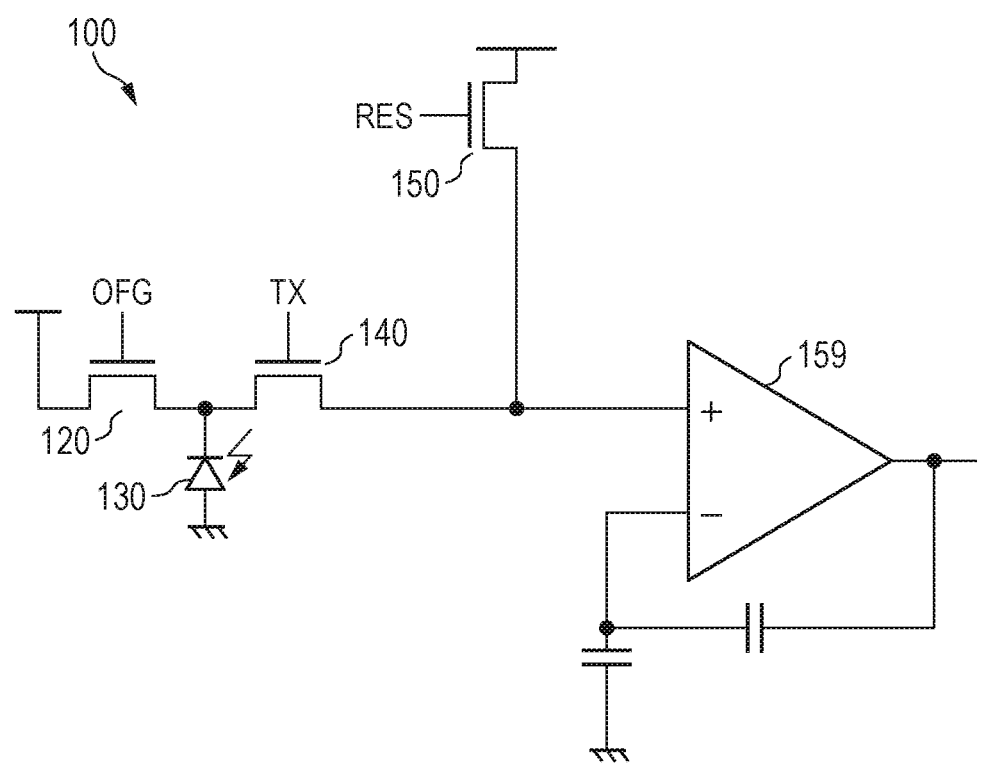
FIG. 18 is a diagram illustrating an equivalent circuit of a pixel of a photoelectric conversion device.

FIG. 18 illustrates an equivalent circuit of the pixel 100. The elements having the same function as those of FIG. 3 are labeled with the same reference numerals as those in FIG. 3. The pixel 100 of the present embodiment includes the operational amplifier 159. The operational amplifier 159 has a non-inverting input node and an inverting input node. The output node of the operational amplifier 159 and the inverting input node of the operational amplifier 159 are connected by a feedback capacitor. The non-inverting input node of the operational amplifier 159 is connected to the transfer transistor 140 and the reset transistor 150. A signal based on signal charges generated by the photoelectric conversion unit 130 is input to the non-inverting input node of the operational amplifier 159.

The operational amplifier 159 includes an input transistor (not illustrated) and a reference transistor (not illustrated). The input transistor and the reference transistor form a differential pair. The gate of the input transistor corresponds to the non-inverting input node of the operational amplifier 159. The gate of the reference transistor corresponds to the inverting input node of the operational amplifier 159.

In the present embodiment, the size of the input transistor included in the operational amplifier 159 is different from the size of other transistors. With such a configuration, the advantage of improved electric characteristics can be obtained. The combinations described in the first embodiment to the sixth embodiment may be applied as appropriate for the combination of two transistors having different sizes. The structure of two transistors having different sizes is illustrated in FIG. 7A to FIG. 9B.

Eighth Embodiment

Another embodiment will be described. The present embodiment is different from the first embodiment to the seventh embodiment in that the pixel circuit of the pixel 100 is divided into and arranged on three semiconductor substrates.

Figure 19:
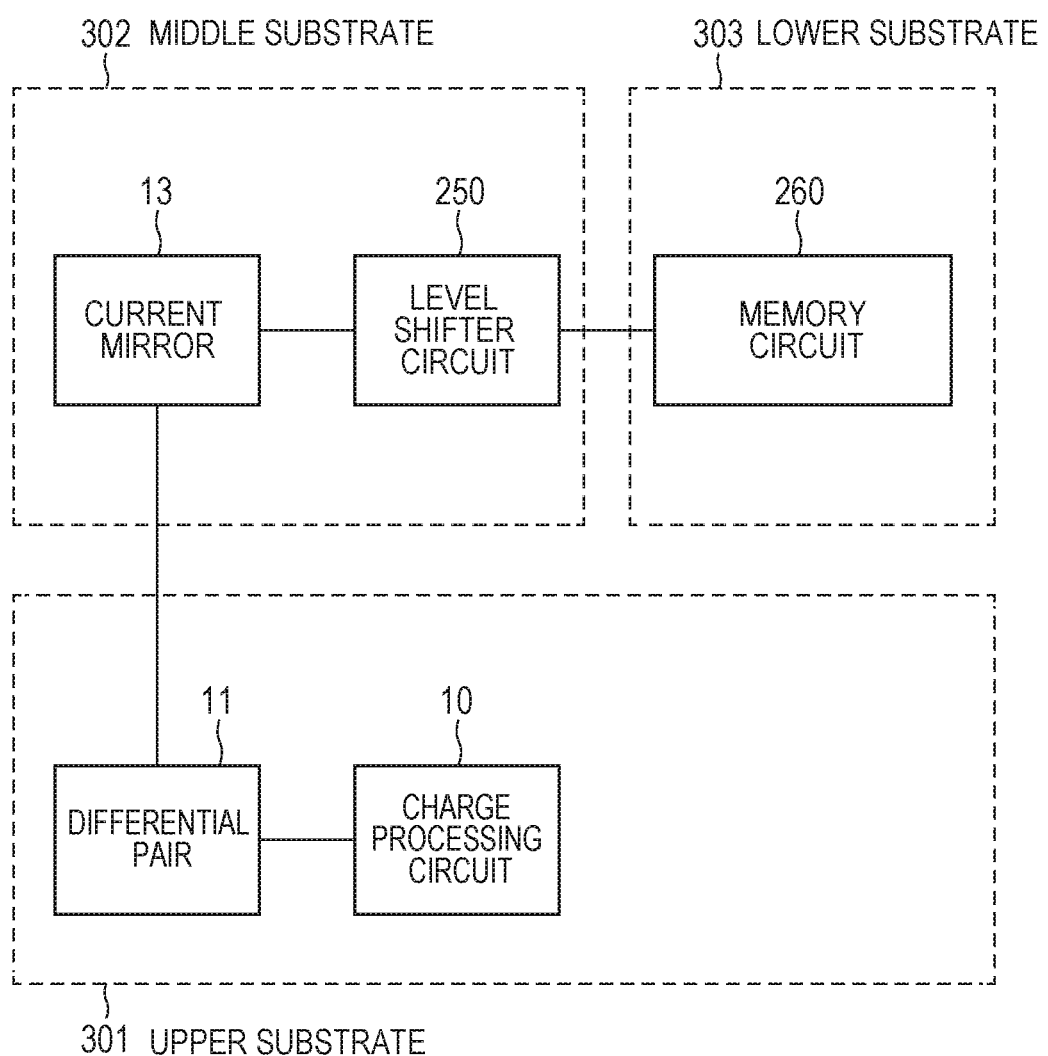
FIG. 19 is a block diagram schematically illustrating a configuration of a pixel of the photoelectric conversion device.

FIG. 19 is a block diagram schematically illustrating the configuration of the pixel 100. The pixel circuit of the pixel 100 is formed of a plurality of circuit blocks in terms of function. The signal charge processing circuit 10 performs accumulation, transfer, and draining of signal charges generated by the photoelectric conversion unit. The differential-pair circuit 11 includes transistors forming a differential pair and a current source that supplies a current to the differential pair. The current mirror circuit 13 controls a current flowing in the differential-pair circuit 11. The differential-pair circuit 11 and the current mirror circuit 13 form a comparator of the ADC circuit. Furthermore, the pixel circuit of the pixel 100 includes the level shifter circuit 250 and the memory circuit 260. The level shifter circuit 250 reduces the amplitude of a latch signal output from the comparator. The memory circuit 260 holds a digital signal based on the latch signal output from the comparator. Typically, the differential-pair circuit 11, the current mirror circuit 13, and the memory circuit 260 form the ADC circuit.

The detailed configuration of each circuit block is the same as that of the first embodiment. That is, FIG. 3 illustrates the equivalent circuit diagram of the pixel 100 of the present embodiment. Note that the ramp signal generation circuit 12 (not illustrated) supplies a ramp signal to the ADC circuit. Further, the pixel 100 of the present embodiment does not includes the positive feedback circuit 14. Thus, the output node of the comparator is directly connected to the level shifter circuit 250. Note that the pixel 100 may include the positive feedback circuit 14 as with the first embodiment. The positive feedback circuit 14 facilitates a quick inversion of the output of the comparator. In other words, the positive feedback circuit 14 generates a pulse having a sharp rising edge (or falling edge) in response to the output of the comparator starting an inversion.

As illustrated in FIG. 19, the photoelectric conversion unit 130, the signal charge processing circuit 10, and the differential-pair circuit 11 are arranged on the first semiconductor substrate 301 (upper substrate). The current mirror circuit 13 and the level shifter circuit 250 are arranged on the second semiconductor substrate 302 (middle substrate). The memory circuit 260 is arranged on a third semiconductor substrate 303 (lower substrate). The first semiconductor substrate 301, the second semiconductor substrate 302, and the third semiconductor substrate 303 are stacked in this order from the near side of the light source (subject).

In the present embodiment, the size of the input transistor 160 is different from the size of the transistor of the memory circuit 260. In addition, the size of the transistor of the level shifter circuit 250 is different from the size of the transistor of the memory circuit 260. That is, the size of the transistor arranged on the first semiconductor substrate 301 and the size of the transistor arranged on the third semiconductor substrate 303 are different from each other. Furthermore, the size of the transistor arranged on the second semiconductor substrate 302 and the size of the transistor arranged on the third semiconductor substrate 303 are different from each other. The two transistors having different sizes are illustrated in FIG. 7A to FIG. 9B. According to such a configuration, both the high reliability and the fast operation can be achieved.

For example, the film thickness tox of the gate insulating film 104 of the input transistor 160 is larger than the film thickness tox of the gate insulating film 104 of the transistor of the memory circuit 260. In addition, the film thickness tox of the gate insulating film 104 of the transistor of the level shifter circuit 250 is larger than the film thickness tox of the gate insulating film 104 of the transistor of the memory circuit 260.

The differential-pair circuit 11 and the level shifter circuit 250 are analog circuits and supplied with a relatively high power source voltage. Thus, it is preferable to increase the film thickness tox of the gate insulating film 104 of the transistor so that a high withstand voltage can be obtained. On the other hand, a digital circuit such as the memory circuit 260 often operates relatively faster than an analog circuit. Further, a digital circuit is typically supplied with a power source voltage lower than the power source voltage of an analog circuit. Thus, it is preferable to reduce the film thickness tox of the gate insulating film 104 for a faster operation of a transistor.

As discussed above, in the present embodiment, the transistors of the circuit on the pre-stage of the level shifter circuit 250 and the transistors of the circuit of the post-stage of the level shifter circuit 250 include different film thicknesses tox of the gate insulating films 104. Thus, both the high reliability and the fast operation can be achieved.

Furthermore, the size of the input transistor 160 and the size of the transistor of the level shifter circuit 250 may be different from each other. When the pixel circuit is divided into and arranged on three semiconductor substrates, the transistors on respective semiconductor substrates are formed by separate manufacturing processes. Therefore, with the transistors on three semiconductor substrates having different sizes from each other, the optimum design rule can be applied to each of the semiconductor substrates.

As described above, the size of the input transistor 160 is different from the size of the transistor of the memory circuit 260. In addition, the size of the transistor of the level shifter circuit 250 is different from the size of the transistor of the memory circuit 260. According to such a configuration, both the high reliability and the fast operation can be achieved.

When the configurations of the first embodiment to the eighth embodiment are combined to the present embodiment as appropriate, the advantages described in the first embodiment to the eighth embodiment can be obtained.

Ninth Embodiment

With respect to a combination of two transistors having different sizes, another example will be described. The description of the present embodiment may be applied as a modified example to each of the first embodiment to the eighth embodiment.

FIG. 20A and FIG. 20M are diagrams illustrating relationships between the size of the transistor A and the size of the transistor B. The relationships of the channel length L, the channel width W, and the film thickness tox of the gate insulating film 104 are illustrated. For example, the table of FIG. 20A indicates that the channel length L of the transistor A is larger than the channel length L of the transistor B. Further, a blank means that any relationship may be applied. The structure of two transistor having different sizes is illustrated in FIG. 7A to FIG. 9B.

In one example, in each table of FIG. 20A to FIG. 20M, the transistor A is the input transistor 160. In this case, the transistor B is any transistor selected from the transistors forming the charge drain transistor 120, the transfer transistor 140, the reset transistor 150, the reference transistor 170, and the transistor forming the current source 180. Alternatively, the transistor B is the transistor forming the ramp signal generation circuit 12, the transistor forming the current mirror circuit 13, the transistor forming the positive feedback circuit 14, or the transistor forming the level shifter circuit 250. Alternatively, the transistor B is the transistor forming the latch circuit 151, the transistor forming the counter circuit 152, the transistor forming the memory cell 153, or the transistor forming the readout circuit 110. Alternatively, the transistor B is the transistor forming the horizontal scanning circuit 108, the transistor forming the comparing circuit 135, the transistor forming the output circuit 136, or the transistor forming the operational amplifier 159. In this context, each of the transistors and the circuits described above corresponds to each of the transistors and the circuits labeled with the same reference numeral in the first embodiment to the eighth embodiment.

In another example, in each table of FIG. 20A to FIG. 20M, the transistor A is the charge drain transistor 120. In this case, the transistor B is any transistor selected from the transistors forming the transfer transistor 140, the reset transistor 150, the input transistor 160, the reference transistor 170, and the transistor forming the current source 180. Alternatively, the transistor B is the transistor forming the ramp signal generation circuit 12, the transistor forming the current mirror circuit 13, the transistor forming the positive feedback circuit 14, or the transistor forming the level shifter circuit 250. Alternatively, the transistor B is the transistor forming the latch circuit 151, the transistor forming the counter circuit 152, the transistor forming the memory cell 153, or the transistor forming the readout circuit 110. Alternatively, the transistor B is the transistor forming the horizontal scanning circuit 108, the transistor forming the comparing circuit 135, the transistor forming the output circuit 136, or the transistor forming the operational amplifier 159. In this context, each of the transistors and the circuits described above corresponds to each of the transistors and the circuits labeled with the same reference numeral in the first embodiment to the eighth embodiment.

In another example, in each table of FIG. 20A to FIG. 20M, the transistor A is the transfer transistor 140. In this case, the transistor B is any transistor selected from the charge drain transistor 120, the reset transistor 150, the input transistor 160, the reference transistor 170, and the transistor forming the current source 180. Alternatively, the transistor B is the transistor forming the ramp signal generation circuit 12, the transistor forming the current mirror circuit 13, the transistor forming the positive feedback circuit 14, or the transistor forming the level shifter circuit 250. Alternatively, the transistor B is the transistor forming the latch circuit 151, the transistor forming the counter circuit 152, the transistor forming the memory cell 153, or the transistor forming the readout circuit 110. Alternatively, the transistor B is the transistor forming the horizontal scanning circuit 108, the transistor forming the comparing circuit 135, the transistor forming the output circuit 136, or the transistor forming the operational amplifier 159. In this context, each of the transistors and the circuits described above corresponds to each of the transistors and the circuits labeled with the same reference numeral in the first embodiment to the eighth embodiment.

In another example, in each table of FIG. 20A to FIG. 20M, the transistor A is the reset transistor 150. In this case, the transistor B is any transistor selected from the charge drain transistor 120, the transfer transistor 140, the input transistor 160, the reference transistor 170, and the transistor forming the current source 180. Alternatively, the transistor B is the transistor forming the ramp signal generation circuit 12, the transistor forming the current mirror circuit 13, the transistor forming the positive feedback circuit 14, or the transistor forming the level shifter circuit 250. Alternatively, the transistor B is the transistor forming the latch circuit 151, the transistor forming the counter circuit 152, the transistor forming the memory cell 153, or the transistor forming the readout circuit 110. Alternatively, the transistor B is the transistor forming the horizontal scanning circuit 108, the transistor forming the comparing circuit 135, the transistor forming the output circuit 136, or the transistor forming the operational amplifier 159. In this context, each of the transistors and the circuits described above corresponds to each of the transistors and the circuits labeled with the same reference numeral in the first embodiment to the eighth embodiment.

In another example, in each table of FIG. 20A to FIG. 20M, the transistor A is the reference transistor 170. In this case, the transistor B is any transistor selected from the charge drain transistor 120, the transfer transistor 140, the reset transistor 150, the input transistor 160, and the transistor forming the current source 180. Alternatively, the transistor B is the transistor forming the ramp signal generation circuit 12, the transistor forming the current mirror circuit 13, the transistor forming the positive feedback circuit 14, or the transistor forming the level shifter circuit 250. Alternatively, the transistor B is the transistor forming the latch circuit 151, the transistor forming the counter circuit 152, the transistor forming the memory cell 153, or the transistor forming the readout circuit 110. Alternatively, the transistor B is the transistor forming the horizontal scanning circuit 108, the transistor forming the comparing circuit 135, the transistor forming the output circuit 136, or the transistor forming the operational amplifier 159. In this context, each of the transistors and the circuits described above corresponds to each of the transistors and the circuits labeled with the same reference numeral in the first embodiment to the eighth embodiment.

In another example, in each table of FIG. 20A to FIG. 20M, the transistor A is the transistor forming the current source 180. In this case, the transistor B is any transistor selected from the charge drain transistor 120, the transfer transistor 140, the reset transistor 150, the input transistor 160, and the reference transistor 170. Alternatively, the transistor B is the transistor forming the ramp signal generation circuit 12, the transistor forming the current mirror circuit 13, the transistor forming the positive feedback circuit 14, or the transistor forming the level shifter circuit 250. Alternatively, the transistor B is the transistor forming the latch circuit 151, the transistor forming the counter circuit 152, the transistor forming the memory cell 153, or the transistor forming the readout circuit 110. Alternatively, the transistor B is the transistor forming the horizontal scanning circuit 108, the transistor forming the comparing circuit 135, the transistor forming the output circuit 136, or the transistor forming the operational amplifier 159. In this context, each of the transistors and the circuits described above corresponds to each of the transistors and the circuits labeled with the same reference numeral in the first embodiment to the eighth embodiment.

In another example, in each table of FIG. 20A to FIG. 20M, the transistor A is the transistor forming the ramp signal generation circuit 12. In this case, the transistor B is any transistor selected from the charge drain transistor 120, the transfer transistor 140, the reset transistor 150, the input transistor 160, the reference transistor 170, and the transistor forming the current source 180. Alternatively, the transistor B is the transistor forming the current mirror circuit 13, the transistor forming the positive feedback circuit 14, or the transistor forming the level shifter circuit 250. Alternatively, the transistor B is the transistor forming the latch circuit 151, the transistor forming the counter circuit 152, the transistor forming the memory cell 153, or the transistor forming the readout circuit 110. Alternatively, the transistor B is the transistor forming the horizontal scanning circuit 108, the transistor forming the comparing circuit 135, the transistor forming the output circuit 136, or the transistor forming the operational amplifier 159. In this context, each of the transistors and the circuits described above corresponds to each of the transistors and the circuits labeled with the same reference numeral in the first embodiment to the eighth embodiment.

In another example, in each table of FIG. 20A to FIG. 20M, the transistor A is the transistor forming the current mirror circuit 13. In this case, the transistor B is any transistor selected from the charge drain transistor 120, the transfer transistor 140, the reset transistor 150, the input transistor 160, the reference transistor 170, and the transistor forming the current source 180. Alternatively, the transistor B is the transistor forming the ramp signal generation circuit 12, the transistor forming the positive feedback circuit 14, or the transistor forming the level shifter circuit 250. Alternatively, the transistor B is the transistor forming the latch circuit 151, the transistor forming the counter circuit 152, the transistor forming the memory cell 153, or the transistor forming the readout circuit 110. Alternatively, the transistor B is the transistor forming the horizontal scanning circuit 108, the transistor forming the comparing circuit 135, the transistor forming the output circuit 136, or the transistor forming the operational amplifier 159. In this context, each of the transistors and the circuits described above corresponds to each of the transistors and the circuits labeled with the same reference numeral in the first embodiment to the eighth embodiment.

In another example, in each table of FIG. 20A to FIG. 20M, the transistor A is the transistor forming the positive feedback circuit 14. In this case, the transistor B is any transistor selected from the charge drain transistor 120, the transfer transistor 140, the reset transistor 150, the input transistor 160, the reference transistor 170, and the transistor forming the current source 180. Alternatively, the transistor B is the transistor forming the ramp signal generation circuit 12, the transistor forming the current mirror circuit 13, or the transistor forming the level shifter circuit 250. Alternatively, the transistor B is the transistor forming the latch circuit 151, the transistor forming the counter circuit 152, the transistor forming the memory cell 153, or the transistor forming the readout circuit 110. Alternatively, the transistor B is the transistor forming the horizontal scanning circuit 108, the transistor forming the comparing circuit 135, the transistor forming the output circuit 136, or the transistor forming the operational amplifier 159. In this context, each of the transistors and the circuits described above corresponds to each of the transistors and the circuits labeled with the same reference numeral in the first embodiment to the eighth embodiment.

In another example, in each table of FIG. 20A to FIG. 20M, the transistor A is the transistor forming the level shifter circuit 250. In this case, the transistor B is any transistor selected from the charge drain transistor 120, the transfer transistor 140, the reset transistor 150, the input transistor 160, the reference transistor 170, and the transistor forming the current source 180. Alternatively, the transistor B is the transistor forming the ramp signal generation circuit 12, the transistor forming the current mirror circuit 13, or the transistor forming the positive feedback circuit 14. Alternatively, the transistor B is the transistor forming the latch circuit 151, the transistor forming the counter circuit 152, the transistor forming the memory cell 153, or the transistor forming the readout circuit 110. Alternatively, the transistor B is the transistor forming the horizontal scanning circuit 108, the transistor forming the comparing circuit 135, the transistor forming the output circuit 136, or the transistor forming the operational amplifier 159. In this context, each of the transistors and the circuits described above corresponds to each of the transistors and the circuits labeled with the same reference numeral in the first embodiment to the eighth embodiment.

In another example, in each table of FIG. 20A to FIG. 20M, the transistor A is the transistor forming the latch circuit 151. In this case, the transistor B is any transistor selected from the charge drain transistor 120, the transfer transistor 140, the reset transistor 150, the input transistor 160, the reference transistor 170, and the transistor forming the current source 180. Alternatively, the transistor B is the transistor forming the ramp signal generation circuit 12, the transistor forming the current mirror circuit 13, the transistor forming the positive feedback circuit 14, or the transistor forming the level shifter circuit 250. Alternatively, the transistor B is the transistor forming the counter circuit 152, the transistor forming the memory cell 153, or the transistor forming the readout circuit 110. Alternatively, the transistor B is the transistor forming the horizontal scanning circuit 108, the transistor forming the comparing circuit 135, the transistor forming the output circuit 136, or the transistor forming the operational amplifier 159. In this context, each of the transistors and the circuits described above corresponds to each of the transistors and the circuits labeled with the same reference numeral in the first embodiment to the eighth embodiment.

In another example, in each table of FIG. 20A to FIG. 20M, the transistor A is the transistor forming the counter circuit 152. In this case, the transistor B is any transistor selected from the charge drain transistor 120, the transfer transistor 140, the reset transistor 150, the input transistor 160, the reference transistor 170, and the transistor forming the current source 180. Alternatively, the transistor B is the transistor forming the ramp signal generation circuit 12, the transistor forming the current mirror circuit 13, the transistor forming the positive feedback circuit 14, or the transistor forming the level shifter circuit 250. Alternatively, the transistor B is the transistor forming the latch circuit 151, the transistor forming the memory cell 153, or the transistor forming the readout circuit 110. Alternatively, the transistor B is the transistor forming the horizontal scanning circuit 108, the transistor forming the comparing circuit 135, the transistor forming the output circuit 136, or the transistor forming the operational amplifier 159. In this context, each of the transistors and the circuits described above corresponds to each of the transistors and the circuits labeled with the same reference numeral in the first embodiment to the eighth embodiment.

In another example, in each table of FIG. 20A to FIG. 20M, the transistor A is the transistor forming the memory cell 153. In this case, the transistor B is any transistor selected from the charge drain transistor 120, the transfer transistor 140, the reset transistor 150, the input transistor 160, the reference transistor 170, and the transistor forming the current source 180. Alternatively, the transistor B is the transistor forming the ramp signal generation circuit 12, the transistor forming the current mirror circuit 13, the transistor forming the positive feedback circuit 14, or the transistor forming the level shifter circuit 250. Alternatively, the transistor B is the transistor forming the latch circuit 151, the transistor forming the counter circuit 152, or the transistor forming the readout circuit 110. Alternatively, the transistor B is the transistor forming the horizontal scanning circuit 108, the transistor forming the comparing circuit 135, the transistor forming the output circuit 136, or the transistor forming the operational amplifier 159. In this context, each of the transistors and the circuits described above corresponds to each of the transistors and the circuits labeled with the same reference numeral in the first embodiment to the eighth embodiment.

In another example, in each table of FIG. 20A to FIG. 20M, the transistor A is the transistor forming the readout circuit 110. In this case, the transistor B is any transistor selected the charge drain transistor 120, the transfer transistor 140, the reset transistor 150, the input transistor 160, the reference transistor 170, and the transistor forming the current source 180. Alternatively, the transistor B is the transistor forming the ramp signal generation circuit 12, the transistor forming the current mirror circuit 13, the transistor forming the positive feedback circuit 14, or the transistor forming the level shifter circuit 250. Alternatively, the transistor B is the transistor forming the latch circuit 151, the transistor forming the counter circuit 152, or the transistor forming the memory cell 153. Alternatively, the transistor B is the transistor forming the horizontal scanning circuit 108, the transistor forming the comparing circuit 135, the transistor forming the output circuit 136, or the transistor forming the operational amplifier 159. In this context, each of the transistors and the circuits described above corresponds to each of the transistors and the circuits labeled with the same reference numeral in the first embodiment to the eighth embodiment.

In another example, in each table of FIG. 20A to FIG. 20M, the transistor A is the transistor forming the horizontal scanning circuit 108. In this case, the transistor B is any transistor selected from the charge drain transistor 120, the transfer transistor 140, the reset transistor 150, the input transistor 160, the reference transistor 170, and the transistor forming the current source 180. Alternatively, the transistor B is the transistor forming the ramp signal generation circuit 12, the transistor forming the current mirror circuit 13, the transistor forming the positive feedback circuit 14, or the transistor forming the level shifter circuit 250. Alternatively, the transistor B is the transistor forming the latch circuit 151, the transistor forming the counter circuit 152, the transistor forming the memory cell 153, or the transistor forming the readout circuit 110. Alternatively, the transistor B is the transistor forming the comparing circuit 135, the transistor forming the output circuit 136, or the transistor forming the operational amplifier 159. In this context, each of the transistors and the circuits described above corresponds to each of the transistors and the circuits labeled with the same reference numeral in the first embodiment to the eighth embodiment.

In another example, in each table of FIG. 20A to FIG. 20M, the transistor A is the transistor forming the comparing circuit 135. In this case, the transistor B is any transistor selected from the charge drain transistor 120, the transfer transistor 140, the reset transistor 150, the input transistor 160, the reference transistor 170, and the transistor forming the current source 180. Alternatively, the transistor B is the transistor forming the ramp signal generation circuit 12, the transistor forming the current mirror circuit 13, the transistor forming the positive feedback circuit 14, or the transistor forming the level shifter circuit 250. Alternatively, the transistor B is the transistor forming the latch circuit 151, the transistor forming the counter circuit 152, the transistor forming the memory cell 153, or the transistor forming the readout circuit 110. Alternatively, the transistor B is the transistor forming the horizontal scanning circuit 108, the transistor forming the output circuit 136, or the transistor forming the operational amplifier 159. In this context, each of the transistors and the circuits described above corresponds to each of the transistors and the circuits labeled with the same reference numeral in the first embodiment to the eighth embodiment.

In another example, in each table of FIG. 20A to FIG. 20M, the transistor A is the transistor forming the output circuit 136. In this case, the transistor B is any transistor selected from the charge drain transistor 120, the transfer transistor 140, the reset transistor 150, the input transistor 160, the reference transistor 170, and the transistor forming the current source 180. Alternatively, the transistor B is the transistor forming the ramp signal generation circuit 12, the transistor forming the current mirror circuit 13, the transistor forming the positive feedback circuit 14, or the transistor forming the level shifter circuit 250. Alternatively, the transistor B is the transistor forming the latch circuit 151, the transistor forming the counter circuit 152, the transistor forming the memory cell 153, or the transistor forming the readout circuit 110. Alternatively, the transistor B is the transistor forming the horizontal scanning circuit 108, the transistor forming the comparing circuit 135, or the transistor forming the operational amplifier 159. In this context, each of the transistors and the circuits described above corresponds to each of the transistors and the circuits labeled with the same reference numeral in the first embodiment to the eighth embodiment.

In another example, in each table of FIG. 20A to FIG. 20M, the transistor A is the transistor forming the operational amplifier 159. In this case, the transistor B is any transistor selected from the charge drain transistor 120, the transfer transistor 140, the reset transistor 150, the input transistor 160, the reference transistor 170, and the transistor forming the current source 180. Alternatively, the transistor B is the transistor forming the ramp signal generation circuit 12, the transistor forming the current mirror circuit 13, the transistor forming the positive feedback circuit 14, or the transistor forming the level shifter circuit 250. Alternatively, the transistor B is the transistor forming the latch circuit 151, the transistor forming the counter circuit 152, the transistor forming the memory cell 153, or the transistor forming the readout circuit 110. Alternatively, the transistor B is the transistor forming the horizontal scanning circuit 108, the transistor forming the comparing circuit 135, or the transistor forming the output circuit 136. In this context, each of the transistors and the circuits described above corresponds to each of the transistors and the circuits labeled with the same reference numeral in the first embodiment to the eighth embodiment.

In each example described above, the transistor A and the transistor B may be formed on the same semiconductor substrate as with the first embodiment. Alternatively, in each example described above, the transistor A and the transistor B may be formed on semiconductor substrates different from each other.

With the sizes of transistors being different, the following advantages can be obtained. With the channel width W being large, it is possible to obtain advantages of reduction of 1/f noise, reduction of variation of a threshold voltage, reduction of noise due to thermal noise when used as the input transistor 160 (increase in transconductance gm), or the like.

On the other hand, with the channel width W being small, it is possible to obtain advantages of a fast operation, an improved charge-to-voltage conversion coefficient when used as the input transistor 160, reduction of noise when used as the reference transistor 170 (decrease in transconductance gm), or the like.

With the channel length L being large, it is possible to obtain advantages of reduction of 1/f noise, reduction of variation of a threshold voltage, reduction of noise when used as the reference transistor 170 (decrease in transconductance gm), or the like.

On the other hand, with the channel length L being small, it is possible to obtain advantages of a fast operation, an improved charge-to-voltage conversion coefficient when used as the input transistor 160, reduction of noise due to thermal noise (increase in transconductance gm), and the like.

With the film thickness tox of the gate insulating film 104 being large, it is possible to obtain advantages of an improved withstand voltage, reduction of noise when used as the reference transistor 170 (decrease in transconductance gm), or the like.

On the other hand, with the film thickness tox of the gate insulating film 104 being small, it is possible to obtain advantages of a fast operation, reduction of noise due to thermal noise when used as the input transistor 160 (increase in transconductance gm), or the like.

Tenth Embodiment

Figure 21:
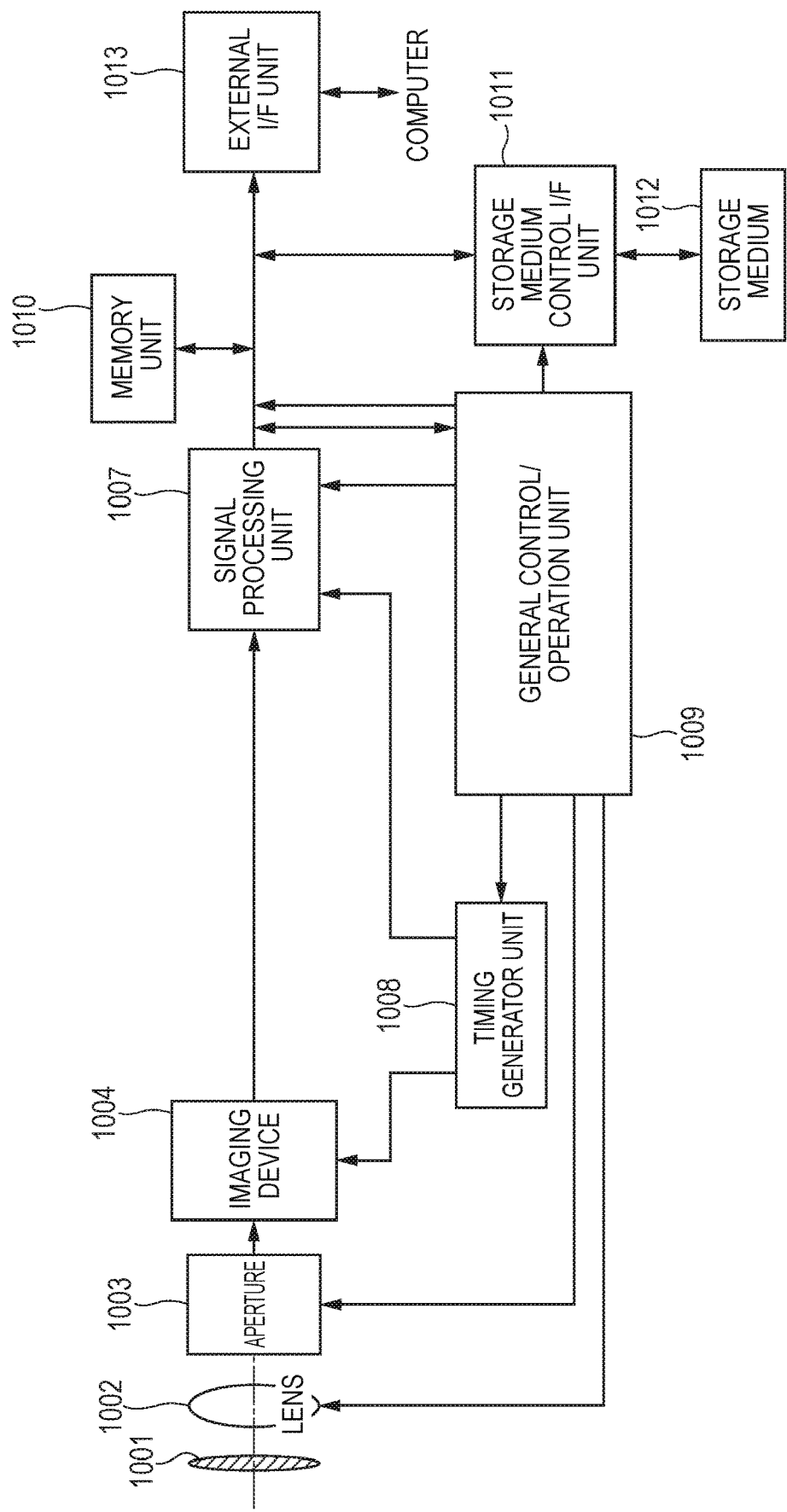
FIG. 21 is a block diagram schematically illustrating a configuration of an imaging system.

An embodiment of an imaging system will be described. The imaging system may be a digital still camera, a digital camcorder, a camera head, a copier machine, a facsimile machine, a mobile phone, a smartphone, an on-vehicle camera, an observation satellite, or the like. FIG. 21 illustrates a block diagram of a digital still camera as an example of the imaging system.

In FIG. 21, reference numeral 1001 denotes a barrier for protection of a lens. Reference numeral 1002 denotes a lens that captures an optical image of a subject on an imaging device 1004. Reference numeral 1003 denotes an aperture that changes the amount of light that has passed through the lens 1002. The imaging device described above in any of the first embodiment to the fourth embodiment is used for the imaging device 1004.

Reference numeral 1007 denotes a signal processing unit that performs a process such as correction, data compression, or the like on the pixel signal output from the imaging device 1004 and acquires an image signal. Further, in FIG. 21, reference numeral 1008 denotes a timing generator unit that outputs various timing signals to the imaging device 1004 and the signal processing unit 1007, and reference numeral 1009 denotes a general control unit that controls the entire digital still camera. Reference numeral 1010 denotes a frame memory unit for temporarily stores image data. Reference numeral 1011 denotes an interface unit that performs storage or readout to a storage medium. Reference numeral 1012 denotes a removable storage medium such as a semiconductor memory or the like used for storing or reading out captured data. Reference numeral 1013 denotes an interface unit used for communication with an external computer or the like.

Note that the imaging system may have at least the imaging device 1004 and the signal processing unit 1007 that processes a pixel signal output from the imaging device 1004. In such a case, other components are arranged outside the system.

As described above, in the embodiment of the imaging system, the photoelectric conversion device of any of the first embodiment to the ninth embodiment is used in the imaging device 1004. According to such a configuration, the electric characteristics of the imaging system can be improved.

Eleventh Embodiment

Figure 22A:
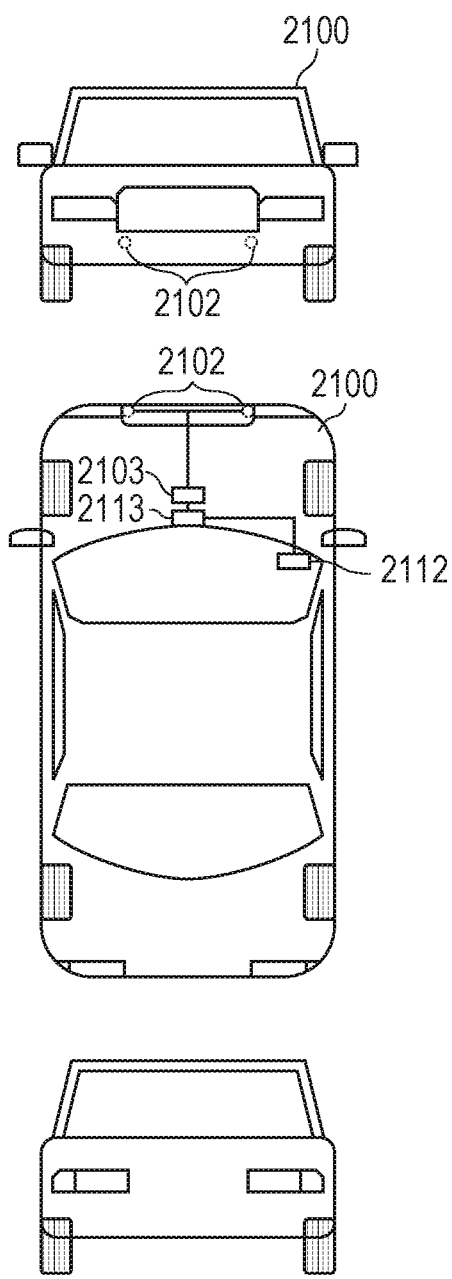
FIG. 22A is a diagram schematically illustrating the appearance and the primary internal structure of an automobile having an on-vehicle camera.

An embodiment of a moving unit will be described. The moving unit of the present embodiment is an automobile having an on-vehicle camera. FIG. 22A schematically illustrates the appearance and the primary internal structure of an automobile 2100. The automobile 2100 has an imaging device 2102, an imaging system integrated circuit (Application Specific Integrated Circuit (ASIC)) 2103, an alert device 2112, and a main control unit 2113.

The imaging device described in each embodiment described above is used as the imaging device 2102. The alert device 2112 reports an alert to a driver when receiving a signal indicating anomaly from an imaging system, a vehicle sensor, a control unit, or the like. The main control unit 2113 centrally controls the operation of the imaging system, the vehicle sensor, the control unit, or the like. Note that the automobile 2100 may not have the main control unit 2113. In such a case, each of the imaging system, the vehicle sensor, and the control unit has a separate communication interface and transmits and receives a control signal via a communication network (for example, CAN specification).

Figure 22B:
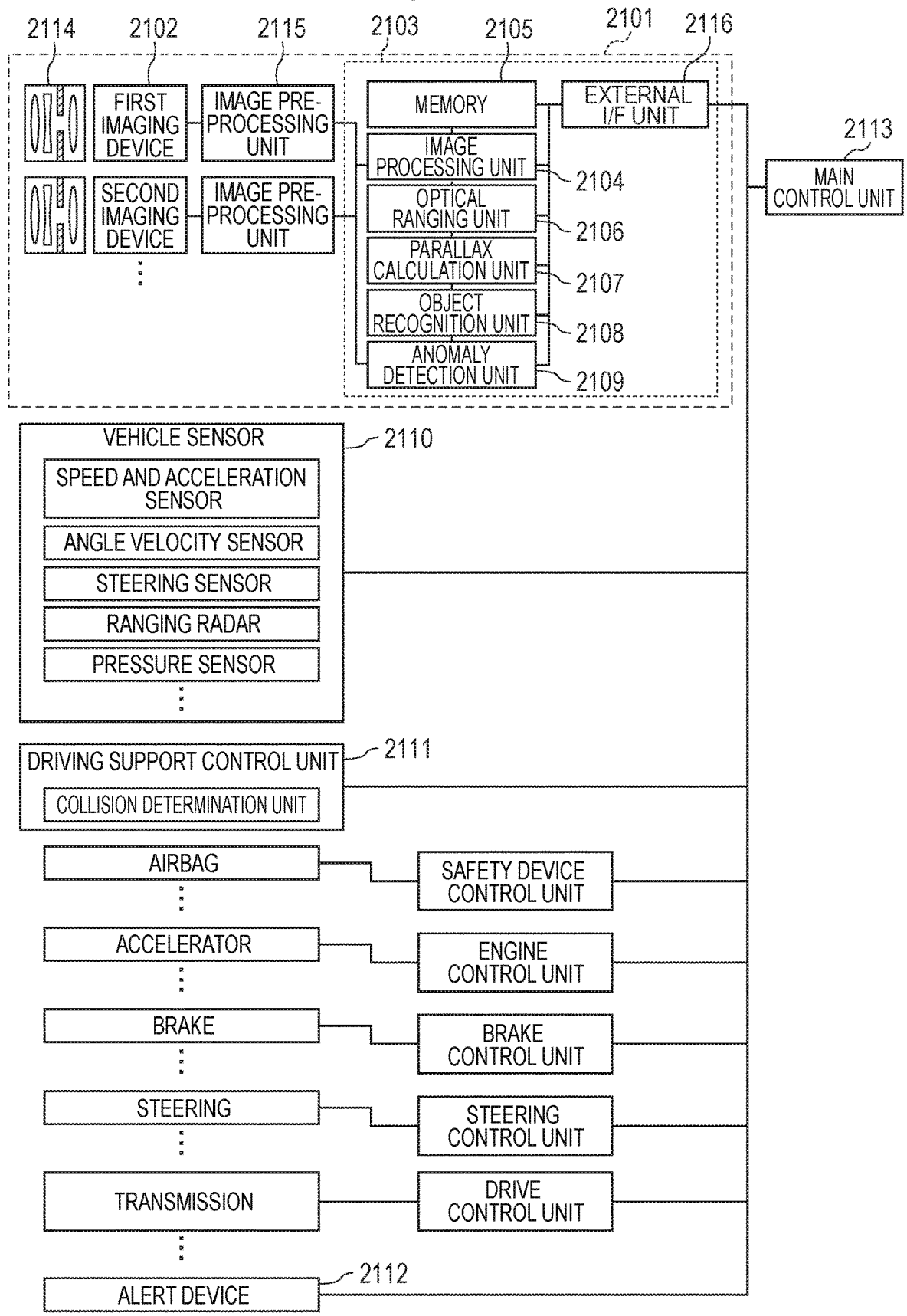
FIG. 22B is a block diagram schematically illustrating a system configuration of an automobile having an on-vehicle camera.

FIG. 22B is a block diagram illustrating a system configuration of the automobile 2100. The automobile 2100 includes a first imaging device 2102 and a second imaging device 2102. That is, the on-vehicle camera of the present embodiment is a stereo camera. A subject image is captured onto the imaging device 2102 by an optical unit 2114. A pixel signal output from the imaging device 2102 is processed by an image pre-processing unit 2115 and then transmitted to the imaging system integrated circuit 2103. The image pre-processing unit 2115 performs S-N calculation, synchronization signal addition, or the like.

The imaging system integrated circuit 2103 has an image processing unit 2104, a memory 2105, an optical ranging unit 2106, a parallax calculation unit 2107, an object recognition unit 2108, an anomaly detection unit 2109, and an external interface (I/F) unit 2116. The image processing unit 2104 processes a pixel signal to generate an image signal. Further, the image processing unit 2104 performs correction of an image signal or interpolation for an abnormal pixel. The memory 2105 temporarily stores an image signal. Further, the memory 2105 may store the position of a known abnormal pixel of the imaging device 2102. The optical ranging unit 2106 performs focusing and ranging of a subject by using image signals. The parallax calculation unit 2107 performs object collation (stereo matching) of parallax images. The object recognition unit 2108 analyzes image signals to perform recognition of a subject such as an automobile, a person, a traffic sign, a road, or the like. The anomaly detection unit 2109 detects a failure or a malfunction of the imaging device 2102. When detecting a failure or a malfunction, the anomaly detection unit 2109 transmits a signal indicating that an anomaly has been detected to the main control unit 2113. The external I/F unit 2116 intermediates reception of information between each unit of the imaging system integrated circuit 2103 and the main control unit 2113 or various control units or the like.

The automobile 2100 includes a vehicle information acquisition unit 2110 and a driving support unit 2111. The vehicle information acquisition unit 2110 may include a speed and acceleration sensor, an angle velocity sensor, a steering angle sensor, a ranging radar, a pressure sensor, or the like.

The driving support unit 2111 includes a collision determination unit. The collision determination unit determines whether or not there is a possibility of collision with an object based on information from the optical ranging unit 2106, the parallax calculation unit 2107, or the object recognition unit 2108. The optical ranging unit 2106 or the parallax calculation unit 2107 is an example of a distance information acquisition unit adapted to acquire distance information on the distance to an object. That is, the distance information is information regarding a parallax, a defocus amount, a distance to an object, or the like. The collision determination unit may use any of the distance information to determine the collision possibility. The distance information acquisition unit may be implemented by dedicatedly designed hardware or may be implemented by a software module.

Although the example in which the driving support unit 2111 controls the automobile 2100 so as not to collide with another object has been described, the driving support unit 2111 can be applied to automatic driving control to follow another vehicle, automatic driving control not to go out of a traffic lane, or the like.

The automobile 2100 further has drive units used for traveling, such as an airbag, an accelerator, a brake, a steering, a transmission, or the like. Further, the automobile 2100 includes control units for these drive units. Each of the control units controls the corresponding drive unit based on a control signal from the main control unit 2113.

The imaging system used in the present embodiment is not limited to an automobile and can be applied to a moving unit (moving apparatus) such as a ship, an airplane, or an industrial robot, for example. In addition, the imaging system can be widely applied to a device which utilizes object recognition, such as an intelligent transportation system (ITS), without being limited to moving units.

As described above, the photoelectric conversion device of any of the first embodiment and the ninth embodiment is used as the imaging device 2102 in the embodiment of the automobile. According to such a configuration, in a moving unit having an imaging device, the electric characteristics of the imaging device can be improved.

Further, according to the embodiments of the disclosure, the performance of a photoelectric conversion device can be improved.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-022400, filed Feb. 9, 2018, which is hereby incorporated by reference herein in its entirety.

What is claimed is:

1. A photoelectric conversion device comprising:
   a plurality of pixels each including a pixel circuit including a photoelectric conversion unit; and
   a readout circuit configured for reading out signals from the plurality of pixels,
   wherein the pixel circuit of each of the plurality of pixels includes at least a first transistor that receives a signal based on signal charges generated by the photoelectric conversion unit and is a part of a differential pair,
   wherein the pixel circuit or the readout circuit has a second transistor,
   wherein a size of the first transistor and a size of the second transistor are different from each other,
   wherein a gate electrode of the first transistor has an area different from a gate electrode of the second transistor,
   wherein the readout circuit includes a digital circuit, and
   wherein the second transistor is included in the digital circuit.

2. The photoelectric conversion device according to claim 1, wherein the first transistor and the second transistor form the differential pair.

3. The photoelectric conversion device according to claim 2, wherein the pixel circuit of each of the plurality of pixels includes the second transistor.

4. The photoelectric conversion device according to claim 2,
wherein the second transistor is shared by the plurality of pixels, and
wherein the first transistor of each of the plurality of pixels forms the differential pair with the second transistor.

5. The photoelectric conversion device according to claim 2, wherein a transconductance of the first transistor and a transconductance of the second transistor are different from each other.

6. The photoelectric conversion device according to claim 2, wherein the first transistor and the second transistor are arranged on the same semiconductor substrate.

7. The photoelectric conversion device according to claim 2 further comprising:
a first semiconductor substrate including the photoelectric conversion unit and the first transistor; and
a second semiconductor substrate including the second transistor.

8. The photoelectric conversion device according to claim 2,
wherein the pixel circuit of each of the plurality of pixels includes an analog-to-digital converter circuit that converts the signal into a digital signal, and
wherein the differential pair forms a comparator of the analog-to-digital converter circuit.

9. The photoelectric conversion device according to claim 1, wherein a film thickness of a gate insulating film of the first transistor is larger than a film thickness of a gate insulating film of the second transistor.

10. The photoelectric conversion device according to claim 1, wherein the digital circuit is a counter circuit, a memory cell, or a latch circuit.

11. The photoelectric conversion device according to claim 1 further comprising:
a first semiconductor substrate on which the photoelectric conversion unit and the first transistor are arranged; and
a second semiconductor substrate on which the second transistor included in the digital circuit is arranged.

12. The photoelectric conversion device according to claim 1,
wherein the readout circuit includes a level shifter circuit and a memory circuit, and
wherein a size of a transistor included in the level shifter circuit is different from a size of a transistor included in the memory circuit.

13. The photoelectric conversion device according to claim 1, wherein each of the size of the first transistor and the size of the second transistor is at least one selected from a channel length of a transistor, a channel width of a transistor, and a film thickness of a gate insulating film of a transistor.

14. An imaging system comprising:
the photoelectric conversion device according to claim 1; and
a processing device that processes a signal output from the photoelectric conversion device to acquire an image signal.

15. A moving unit comprising:
the photoelectric conversion device according to claim 1;
a processing device that performs a process on a signal output from the photoelectric conversion device; and
a control unit that controls the moving unit based on a result of the process.

16. A photoelectric conversion device comprising:
a first semiconductor substrate;
a second semiconductor substrate;
a plurality of pixels each including a pixel circuit including a photoelectric conversion unit; and
a readout circuit configured for reading out a signal from the plurality of pixels,
wherein the pixel circuit of each of the plurality of pixels includes at least an input transistor that receives a signal based on signal charges generated by the photoelectric conversion unit and is a part of a differential pair,
wherein at least a first part of the photoelectric conversion unit and the pixel circuit is arranged on the first semiconductor substrate,
wherein a second part, which is different from the first part, of the pixel circuit and at least a part of the readout circuit are arranged on the second semiconductor substrate, wherein a size of a first transistor arranged on the first semiconductor substrate and a size of a second transistor arranged on the second semiconductor substrate are different from each other,
wherein a gate electrode of the first transistor has an area different from a gate electrode of the second transistor,
wherein the readout circuit includes a digital circuit, and
wherein the second transistor is included in the digital circuit.

17. The photoelectric conversion device according to claim 16, wherein a film thickness of a gate insulating film of the first transistor is larger than a film thickness of a gate insulating film of the second transistor.

18. The photoelectric conversion device according to claim 16 further comprising a third semiconductor substrate,
wherein the readout circuit includes a memory circuit arranged on the third semiconductor substrate, and
wherein the size of the first transistor and a size of a third transistor arranged on the third substrate are different from each other.

19. The photoelectric conversion device according to claim 16, wherein the input transistor is the first transistor.

20. An imaging system comprising:
the photoelectric conversion device according to claim 16; and
a processing device that processes a signal output from the photoelectric conversion device to acquire an image signal.

21. A moving unit comprising:
the photoelectric conversion device according to claim 16;
a processing device that performs a process on a signal output from the photoelectric conversion device; and
a control unit that controls the moving unit based on a result of the process.

* * * * *